(12) United States Patent
Kagawa et al.

(10) Patent No.: US 9,443,802 B2
(45) Date of Patent: Sep. 13, 2016

(54) SEMICONDUCTOR DEVICE, FABRICATION METHOD FOR A SEMICONDUCTOR DEVICE AND ELECTRONIC APPARATUS

(71) Applicant: Sony Corporation, Tokyo (JP)

(72) Inventors: Yoshihisa Kagawa, Kanagawa (JP); Kenichi Aoyagi, Kanagawa (JP); Yoshiya Hagimoto, Kanagawa (JP); Nobutoshi Fujii, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/718,942

(22) Filed: May 21, 2015

(65) Prior Publication Data

US 2015/0270212 A1 Sep. 24, 2015

Related U.S. Application Data

(62) Division of application No. 14/467,852, filed on Aug. 25, 2014, now Pat. No. 9,111,763, which is a division of application No. 13/533,526, filed on Jun. 26, 2012, now Pat. No. 8,896,125.

(30) Foreign Application Priority Data

| Jul. 5, 2011 | (JP) | ................................ | 2011-148883 |
| Aug. 1, 2011 | (JP) | ................................ | 2011-168021 |
| Aug. 4, 2011 | (JP) | ................................ | 2011-170666 |
| Sep. 27, 2011 | (JP) | ................................ | 2011-210142 |
| Jan. 16, 2012 | (JP) | ................................ | 2012-006356 |

(51) Int. Cl.
*H01L 23/48* (2006.01)
*H01L 23/52* (2006.01)
(Continued)

(52) U.S. Cl.
CPC ......... *H01L 23/528* (2013.01); *H01L 21/7684* (2013.01); *H01L 21/76807* (2013.01);
(Continued)

(58) Field of Classification Search
USPC ........ 257/210–211, 503, 508, 734–786, 442, 257/612–616, 664–677, E21.591–E21.596, 257/41, 81, 91, 99, 177–182, 276, 457, 459, 257/502, 573, 584, 602, 621, 688–700, 257/E23.01–E23.079, E23.141–E23.179; 438/85, 104, 575, 580, 582, 597–688, 438/83, 98, 100, 101, 111, 112, 113, 124, 438/411, 412, 461, 584
See application file for complete search history.

(56) References Cited

U.S. PATENT DOCUMENTS

| 7,943,428 | B2 * | 5/2011 | Gambino | ............ G06F 17/5068 257/E21.122 |
| 8,169,077 | B2 * | 5/2012 | Yang | ................. H01L 21/76814 257/743 |

(Continued)

FOREIGN PATENT DOCUMENTS

| CN | 1532927 | 9/2004 |
| CN | 101202293 | 6/2008 |

(Continued)

OTHER PUBLICATIONS

Official Action (with English translation) for Japanese Patent Application No. 2012-006356 mailed Sep. 8, 2015, 6 pages.

(Continued)

*Primary Examiner* — Dao H Nguyen
*Assistant Examiner* — Tram H Nguyen
(74) *Attorney, Agent, or Firm* — Sheridan Ross P.C.

(57) ABSTRACT

Disclosed herein is a semiconductor device, including: a first substrate including a first electrode, and a first insulating film configured from a diffusion preventing material for the first electrode and covering a periphery of the first electrode, the first electrode and the first insulating film cooperating with each other to configure a bonding face; and a second substrate bonded to and provided on the first substrate and including a second electrode joined to the first electrode, and a second insulating film configured from a diffusion preventing material for the second electrode and covering a periphery of the second electrode, the second electrode and the second insulating film cooperating with each other to configure a bonding face to the first substrate.

24 Claims, 48 Drawing Sheets

(51) Int. Cl.
| | |
|---|---|
| H01L 29/40 | (2006.01) |
| H01L 23/528 | (2006.01) |
| H01L 21/768 | (2006.01) |
| H01L 27/146 | (2006.01) |
| H01L 23/00 | (2006.01) |
| H04N 5/369 | (2011.01) |
| H01L 23/532 | (2006.01) |
| H01L 27/06 | (2006.01) |

(52) U.S. Cl.
CPC ... *H01L21/76841* (2013.01); *H01L 21/76843* (2013.01); *H01L 23/481* (2013.01); *H01L 23/53223* (2013.01); *H01L 23/53238* (2013.01); *H01L 23/53266* (2013.01); *H01L 23/53295* (2013.01); *H01L 23/564* (2013.01); *H01L 24/03* (2013.01); *H01L 24/05* (2013.01); *H01L 24/06* (2013.01); *H01L 24/08* (2013.01); *H01L 24/80* (2013.01); *H01L 24/83* (2013.01); *H01L 27/1464* (2013.01); *H01L 27/1469* (2013.01); *H01L 27/14636* (2013.01); *H01L 27/14645* (2013.01); *H04N 5/369* (2013.01); *H01L 27/0688* (2013.01); *H01L 2224/02245* (2013.01); *H01L 2224/05027* (2013.01); *H01L 2224/05546* (2013.01); *H01L 2224/05547* (2013.01); *H01L 2224/05571* (2013.01); *H01L 2224/05573* (2013.01); *H01L 2224/05578* (2013.01); *H01L 2224/05647* (2013.01); *H01L 2224/05686* (2013.01); *H01L 2224/08121* (2013.01); *H01L 2224/08145* (2013.01); *H01L 2224/0903* (2013.01); *H01L 2224/80011* (2013.01); *H01L 2224/80013* (2013.01); *H01L 2224/80091* (2013.01); *H01L 2224/80097* (2013.01); *H01L 2224/80203* (2013.01); *H01L 2224/80345* (2013.01); *H01L 2224/80357* (2013.01); *H01L 2224/80895* (2013.01); *H01L 2224/80896* (2013.01); *H01L 2224/83345* (2013.01); *H01L 2924/00014* (2013.01); *H01L 2924/12043* (2013.01); *H01L 2924/13091* (2013.01)

(56) References Cited

U.S. PATENT DOCUMENTS

| | | | | |
|---|---|---|---|---|
| 8,860,221 | B2* | 10/2014 | Park | H01L 24/28 257/635 |
| 8,860,229 | B1* | 10/2014 | Lin | H01L 23/481 257/686 |
| 9,269,668 | B2* | 2/2016 | Yang | H01L 23/53228 |
| 2003/0047794 | A1* | 3/2003 | Watanabe | H01L 21/76801 257/503 |
| 2003/0157750 | A1 | 8/2003 | Narukawa | |
| 2005/0082577 | A1 | 4/2005 | Usui | |
| 2005/0194605 | A1* | 9/2005 | Shelton | H01L 33/62 257/99 |
| 2008/0258309 | A1* | 10/2008 | Chiou | H01L 21/76898 257/774 |
| 2011/0042814 | A1* | 2/2011 | Okuyama | H01L 24/06 257/758 |
| 2011/0084403 | A1 | 4/2011 | Yang et al. | |
| 2011/0101537 | A1* | 5/2011 | Barth | H01L 21/76898 257/774 |
| 2011/0175232 | A1 | 7/2011 | Ota | |
| 2012/0068355 | A1* | 3/2012 | Aoki | H01L 25/0657 257/774 |
| 2013/0285253 | A1* | 10/2013 | Aoki | H01L 21/76251 257/774 |
| 2013/0299997 | A1* | 11/2013 | Sadaka | H01L 21/2007 257/774 |
| 2014/0077386 | A1* | 3/2014 | Kuang | H01L 21/6835 257/774 |
| 2015/0348917 | A1* | 12/2015 | Tsai | H01L 23/585 257/774 |

FOREIGN PATENT DOCUMENTS

| | | |
|---|---|---|
| CN | 101504932 | 8/2009 |
| JP | H06-120262 | 4/1994 |
| JP | H08-227980 | 9/1996 |
| JP | 2000-012540 | 1/2000 |
| JP | 2005-142553 | 6/2005 |
| JP | 2006-173637 | 6/2006 |
| JP | 2006-191081 | 7/2006 |
| JP | 2007-081113 | 3/2007 |
| JP | 2008-187165 | 8/2008 |
| JP | 2010-103533 | 5/2010 |
| JP | 2010-129693 | 6/2010 |
| JP | 2010-219339 | 9/2010 |
| JP | 2011-044655 | 3/2011 |
| JP | 2011-049270 | 3/2011 |
| JP | 2011-054637 | 3/2011 |
| JP | 2011-507303 | 3/2011 |
| JP | 2011-071958 | 4/2011 |
| JP | 2011-146563 | 7/2011 |
| WO | WO 2010/013728 | 2/2010 |
| WO | WO 2011/077580 | 6/2011 |

OTHER PUBLICATIONS

Official Action (no English translation available) for Japanese Patent Application No. 2011-210142 mailed Dec. 1, 2015, 5 pages.
Official Action (no English translation available) for Japanese Patent Application No. 2011-168021 mailed May 12, 2015, 3 pages.
Official Action (no English translation available) for Japanese Patent Application No. 2011-170666 mailed May 26, 2015, 3 pages.
Official Action (no English translation available) for Japanese Patent Application No. 2011-210142 mailed May 26, 2015, 5 pages.
Official Action (with English translation) for Chinese Patent Application No. 201210233277.X mailed Mar. 2, 2016, 31 pages.
Official Action (with English translation) for Japanese Patent Application No. 2012-006356 mailed Apr. 19, 2016, 6 pages.

* cited by examiner

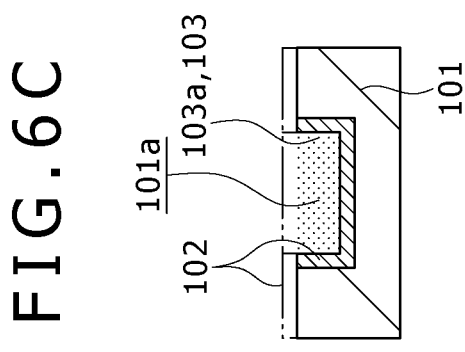
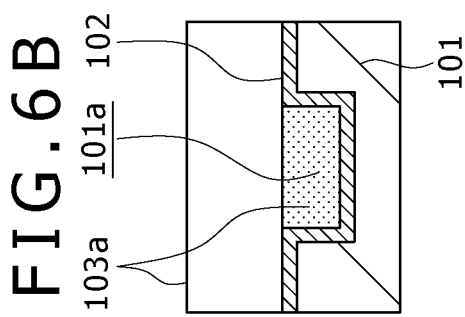
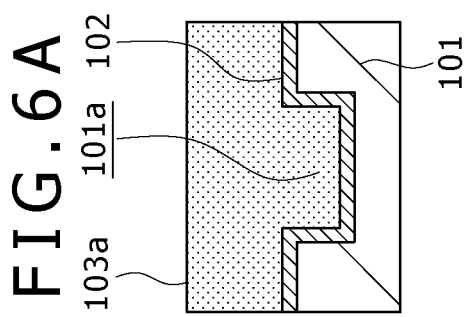
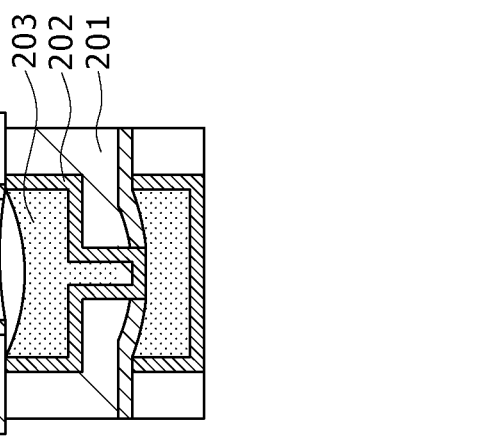
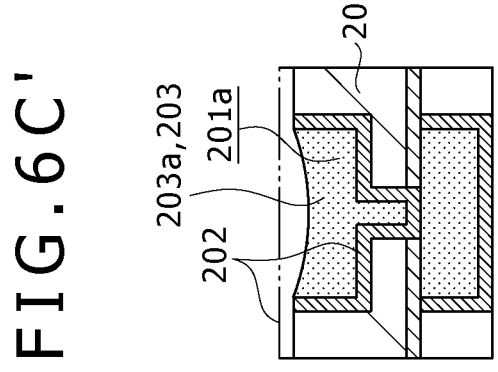
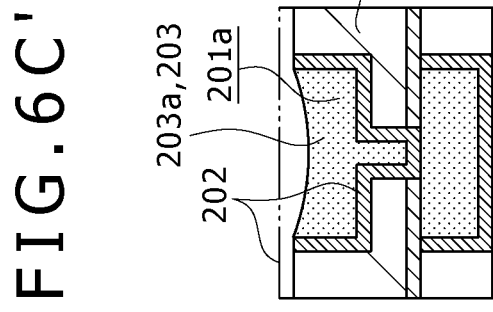
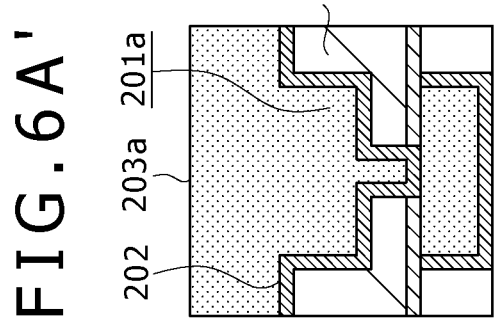

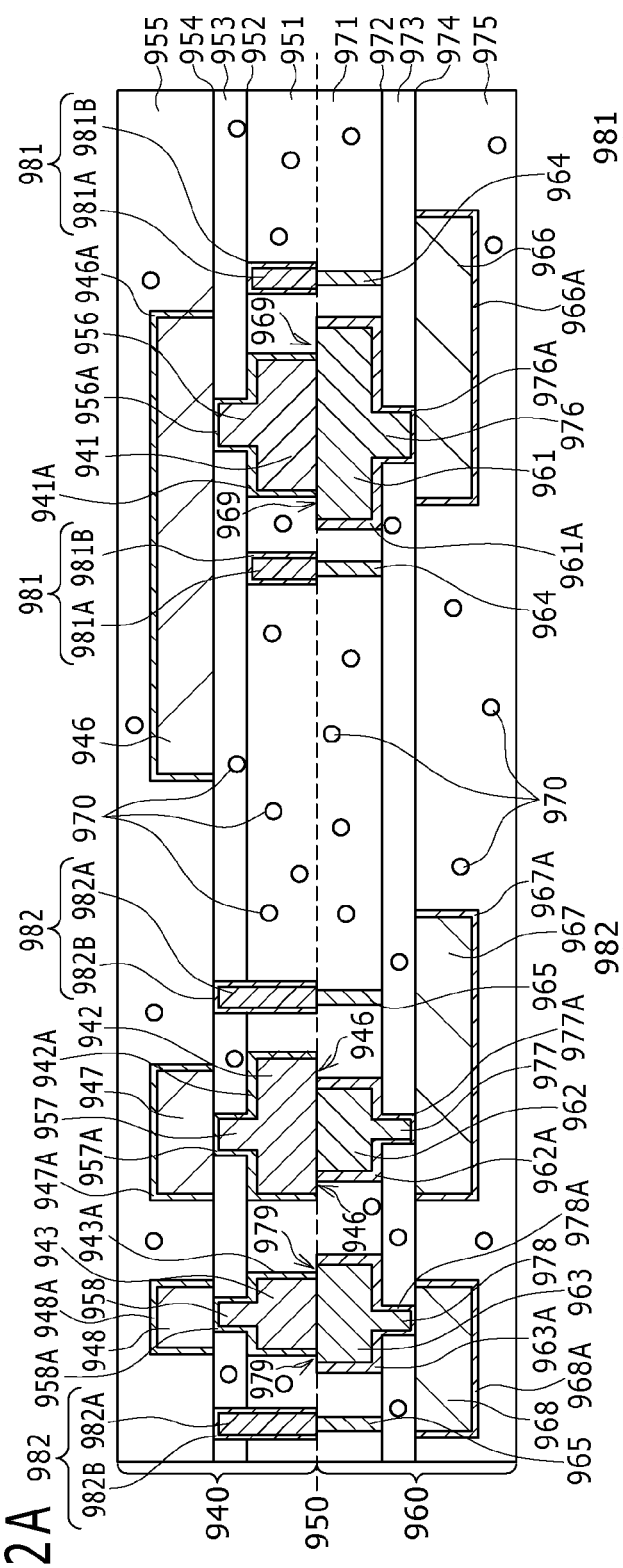
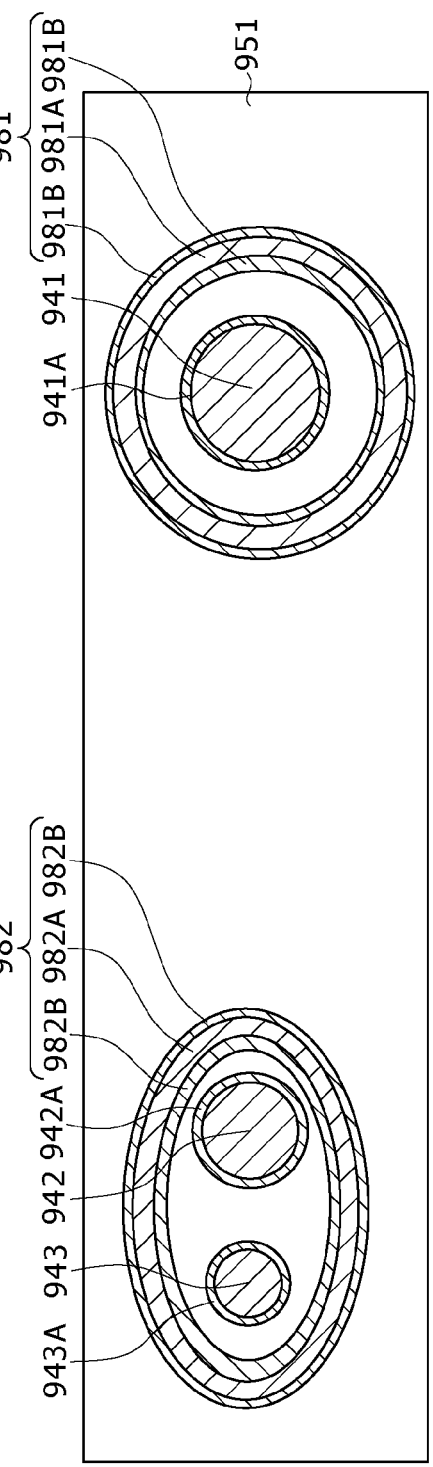
FIG. 42A
FIG. 42B

SEMICONDUCTOR DEVICE, FABRICATION METHOD FOR A SEMICONDUCTOR DEVICE AND ELECTRONIC APPARATUS

CROSS-REFERENCE TO RELATED APPLICATIONS

The present application is a division of U.S. patent application Ser. No. 14/467,852, filed Aug. 25, 2014, which is a division of U.S. patent application Ser. No. 13/533,526, filed Jun. 26, 2012, now U.S. Pat. No. 8,896,125, which claims priority to Japanese Patent Application Serial Nos. JP 2011-148883, JP 2011-168021, JP 2011-170666, JP 2011-210142 and JP 2012-006356, filed in the Japan Patent Office on Jul. 5, 2011, Aug. 1, 2011, Aug. 4, 2011, Sep. 27, 2011 and Jan. 16, 2012, respectively, the entire disclosures of which are hereby incorporated herein by reference.

BACKGROUND

This technology relates to a semiconductor device wherein a plurality of substrates are bonded to each other to carry out joining between electrodes or wiring lines, a fabrication method for the semiconductor device and an electronic apparatus including the semiconductor device.

A technique of bonding two wafers or substrates to each other to join joining electrodes formed on the semiconductor substrates to each other has been developed already and is disclosed, for example, in Japanese Patent Laid-Open No. 2000-299379.

Further, as one of structures for achieving higher integration of semiconductor devices, a three-dimensional structure wherein two substrates on which elements and wiring lines are formed are laminated and bonded to each other has been proposed. When a semiconductor device of such a three-dimensional structure as just described is to be fabricated, two substrates on which elements are formed are prepared first, and the electrodes for joining, that is, bonding pads, are led out to the bonding face side of the substrates. Thereupon, for example, an embedded wiring technique called damascene technique is applied to form a bonding face configured such that the electrodes for joining made of copper (Cu) are surrounded by an insulating film. Thereafter, the two substrates are disposed with the bonding faces thereof opposed to each other and then are laminated such that the electrodes provided on the bonding faces thereof correspond to each other, and in this state, heat treatment is carried out. Bonding of the substrates between which the electrodes are joined together is carried out thereby. For the fabrication method described, refer to, for example, Japanese Patent Laid-Open No. 2006-191081 (hereinafter referred to as Patent Document 1).

Formation of electrodes by a general embedded wiring technique is carried out, for example, in the following manner. First, a groove pattern is formed on an insulating film which covers the surface of a substrate, and then a conductive base layer or barrier metal layer having a barrier property with respect to copper (Cu) is formed on the insulating film in such a state that it covers an inner wall of the groove pattern. Then, an electrode film for which copper (Cu) is used is formed on the barrier metal layer in such a state that the groove pattern is filled up, and then the electrode film is polished until the barrier metal layer is exposed. Further, the barrier metal layer and the electrode film are polished until the insulating film is exposed. Consequently, an embedded electrode wherein an electrode film is embedded in the groove pattern formed in the insulating film with the barrier metal layer interposed therebetween is formed.

With the foregoing embedded wiring technique, polishing of the electrode film can be stopped automatically at a point of time at which the electrode film is polished until the barrier metal layer is exposed. However, in polishing of the electrode film and the barrier metal layer which is carried out subsequently, the polishing of the electrode film cannot be stopped automatically at a point of time at which the insulating film is exposed. Therefore, in a polishing face, dishing wherein the electrode film in the groove pattern is polished excessively or erosion wherein the electrode film in the groove pattern is polished excessively depending upon an electrode layout are liable to occur, and it is difficult to obtain a flat polished face. Therefore, a method wherein, before the electrode film is formed, the barrier metal layer on the insulating film is removed such that the barrier metal layer remains only on the inner face of the groove pattern and then an electrode film is formed on the remaining barrier metal layer and then polished. The method is disclosed, for example, in Japanese Patent Laid-Open No. 2000-12540 (hereinafter referred to as Patent Document 2).

SUMMARY

Incidentally, for a semiconductor device of a three-dimensional structure obtained by such bonding as described above, a structure is demanded wherein bonding strength of two substrates and joining strength between electrodes are assured while diffusion of an electrode material into an insulating film is prevented. However, the fabrication method for a semiconductor device disclosed in Patent Document 1 fails to prevent diffusion of an electrode material into an insulating film.

On the other hand, with the embedded wiring technique disclosed in Patent Document 2, since an electrode film is provided with a barrier metal layer or base layer, diffusion of an electrode material into an electrode film can be prevented. However, this embedded wiring technique does not take bonding of substrates into consideration, and the barrier metal layer is placed into a state in which it is exposed to a flattened face obtained by polishing together with the electrode and the insulating film. Therefore, it is difficult to assure sufficient bonding strength over the overall area of the flattened face.

Therefore, it is desirable to provide a semiconductor device of a three-dimensional structure wherein, in a structure wherein joining of electrodes to each other is carried out by bonding of two substrates to each other, bonding strength is assured while diffusion of an electrode material into an insulating material is prevented thereby to achieve enhancement of the reliability. Also it is desirable to provide a fabrication method for such a semiconductor device as just described and an electronic apparatus including the semiconductor device.

According to a first embodiment of the present technology, there is provided a semiconductor device including a first substrate including a first electrode and a first insulating film configured from a diffusion preventing material for the first electrode and covering a periphery of the first electrode, the first electrode and the first insulating film cooperating with each other to configure a bonding face, and a second substrate bonded to and provided on the first substrate and including a second electrode joined to the first electrode and a second insulating film configured from a diffusion preventing material for the second electrode and covering a periphery of the second electrode, the second electrode and the second insulating film cooperating with each other to configure a bonding face to the first substrate.

According to the first embodiment of the present technology, the semiconductor device can be fabricated by a fabrication method for a semiconductor device including forming an insulating film configured from a diffusion preventing material for an electrode material on each of two substrates and forming a groove pattern on the insulating film, forming an electrode film configured from the electrode material in a state in which the electrode film fills up the groove pattern formed on the insulating film on the insulating film of each of the substrates, polishing the electrode film of each of the substrates until the insulating film is exposed to form a pattern of an electrode such that the electrode film is embedded in the groove pattern, and bonding the two substrates, on each of which the electrode is formed, in a state in which the electrodes are joined together.

With the semiconductor device and the fabrication method, in the configuration wherein joining of electrodes to each other is carried out by bonding of two substrates, bonding strength is assured while diffusion of an electrode material is prevented. Consequently, the semiconductor device of the three-dimensional structure can achieve enhancement of reliability.

According to a second embodiment of the present technology, there is provided a semiconductor device including a first substrate having a bonding face to which a first electrode and a first insulating film are exposed, an insulating thin film configured to cover the bonding face of the first substrate, and a second substrate having a bonding face to which a second electrode and a second insulating film are exposed and bonded to the first substrate in a state in which the insulating thin film is sandwiched between the bonding face of the second substrate and the bonding face of the first substrate and the first electrode and the second electrode are electrically connected to each other through the insulating thin film.

According to the second embodiment of the present technology, the semiconductor device can be fabricated by a fabrication method for a semiconductor device including preparing two substrates each having a bonding face to which an electrode and an insulating film are exposed, forming an insulating thin film in a state in which the insulating thin film covers the bonding face of at least one of the two substrates, and disposing the two substrates such that the bonding faces thereof are opposed to each other across the insulating thin film, positioning the two substrates in a state in which the electrodes thereof are electrically connected to each other through the insulating thin film and bonding the two substrates in the positioned state.

In the semiconductor device (electronic apparatus) and the fabrication method therefor of the present disclosure, the area of the joining side surface of the second metal film which is joined to the first metal film is made smaller than the area of the joining side surface of the first metal film. Further, in the portion of the face region of the first metal film on the joining interface side which includes the face region in which the first metal film is not joined to the second metal film, the interface barrier film is provided. With the configuration just described, degradation of an electric characteristic at the joining interface can be suppressed further, by which the joining interface is provided with further higher reliability.

According to a third embodiment of the present technology, there is provided a semiconductor device including a first semiconductor portion having a first metal film formed on the surface thereof on a joining interface side, a second semiconductor portion having a second metal film joined to the first metal film on the joining interface and having a surface area on the joining interface side smaller than a surface area of the first metal film on the joining interface side and provided in a state in which the second semiconductor portion is bonded to the first semiconductor portion on the joining interface, and an interface barrier portion provided in a portion of a face region of the first metal film on the joining interface side which includes a face region in which the first metal film is not joined to the second metal film.

According to the third embodiment of the present technology, there is further provided an electronic apparatus including a semiconductor device including a first semiconductor portion having a first metal film formed on the surface thereof on a joining interface side, a second semiconductor portion having a second metal film joined to the first metal film on the joining interface and having a surface area on the joining interface side smaller than a surface area of the first metal film on the joining interface side and provided in a state in which the second semiconductor portion is bonded to the first conductor portion on the joining interface, and an interface barrier portion provided in a portion of a face region of the first metal film on the joining interface side which includes a face region in which the first metal film is not joined to the second metal film, and a signal processing circuit configured to process an output signal of the semiconductor device.

According to the third embodiment of the present technology, the semiconductor device can be fabricated by a fabrication method for a semiconductor device including producing a first semiconductor portion having a first metal film formed on a surface thereof on a joining interface side, producing a second semiconductor portion having a second metal film having a surface area on the joining interface side smaller than a surface area of the first metal film on the joining interface side, and bonding the surface of the first semiconductor portion on the first metal film side and the surface of the second semiconductor portion on the second metal film side to each other to join the first metal film and the second metal film to each other and providing an interface barrier portion at a portion of the face region of the first metal film on the joining interface side which includes the face region in which the first metal film is not joined to the second metal film.

According to a fourth embodiment of the present technology, there is provided a semiconductor device including a semiconductor substrate, an insulating layer formed on the semiconductor substrate, a joining electrode formed on a surface of the insulating layer, and a protective layer formed on a surface of the insulating layer and surrounding the joining electrode with the insulating layer interposed therebetween.

According to the fourth embodiment of the present technology, the semiconductor device can be fabricated by a fabrication method for a semiconductor device including forming an insulating layer on a semiconductor substrate, forming a joining electrode on a surface of the insulating layer, and forming a protective layer at a position of the surface of the insulating layer at which the protective layer surrounds the joining electrode with the insulating layer interposed therebetween.

According to a fifth embodiment of the present technology, there is provided an electronic apparatus including a semiconductor device including a semiconductor substrate, an insulating layer formed on the semiconductor substrate, a joining electrode formed on a surface of the insulating layer, and a protective layer formed on a surface of the insulating layer and surrounding the joining electrode with the insulating layer interposed therebetween, and a signal processing circuit for processing an output signal of the semiconductor device.

The above and other features and advantages of the present technology will become apparent from the following description and the appended claims, taken in conjunction with the accompanying drawings in which like parts or elements denoted by like reference characters.

BRIEF DESCRIPTION OF THE DRAWINGS

FIGS. 6A to 6C, 6A' to 6C' and 6D are schematic sectional views illustrating an example of a fabrication method of a semiconductor device as a comparative example to the semiconductor device of FIG. 2;

FIG. 42A is a schematic sectional view showing a general configuration of a semiconductor device including a joining electrode of a modification 1 to that of FIG. 39 and FIG. 42B is a plan view of a joining face of a first joining portion shown in FIG. 42A;

DETAILED DESCRIPTION OF THE PREFERRED EMBODIMENTS

First Embodiment

<<1. Example of the General Configuration of the Semiconductor Device of the First Embodiment>>

Figure 1:
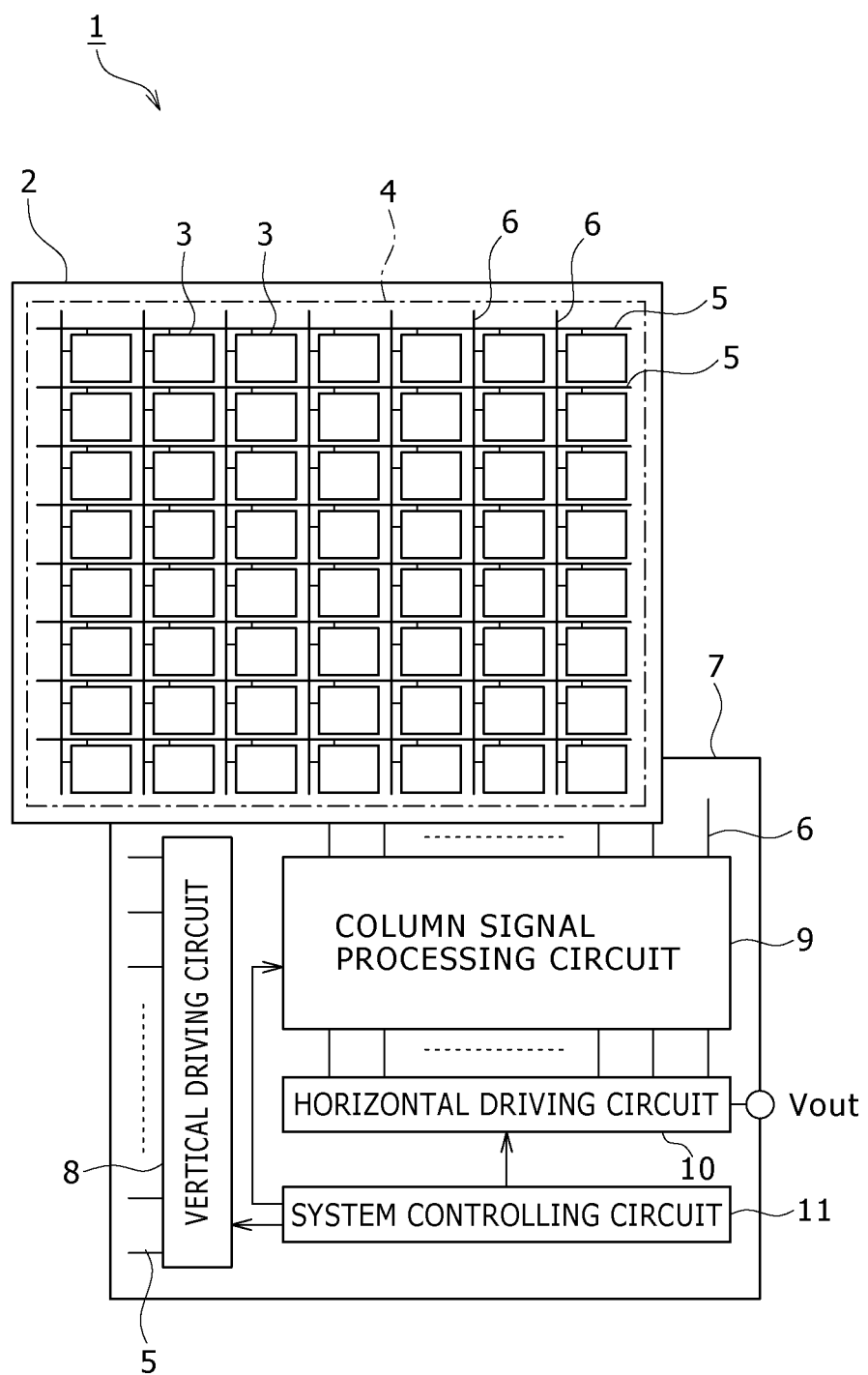
FIG. 1 is a block diagram showing an example of a semiconductor device to which an embodiment of the present technology is applied.

FIG. 1 shows a general configuration of a solid-state image pickup device as an example of a semiconductor device of a three-dimensional structure to which the present technology is applied. Referring to FIG. 1, the semiconductor device 1 shown is a semiconductor device of a three-dimensional structure, that is, a solid-state image pickup apparatus, which includes a sensor substrate 2 as a first substrate, and a circuit substrate 7 as a second substrate bonded in a laminated state to the sensor substrate 2. In the following description, the sensor substrate 2 as a first substrate is referred to merely as sensor substrate 2, and the circuit substrate 7 as a second substrate is referred to merely as circuit substrate 7.

A pixel region 4 in which a plurality of pixels 3 each including a photoelectric conversion element are arrayed regularly two-dimensionally is provided on one face side of the sensor substrate 2. The pixel region 4 has a plurality of pixel driving lines 5 laid therein in a row direction and has a plurality of vertical signal lines 6 laid therein in a column direction. The pixels 3 are disposed such that each thereof is connected to one of the pixel driving lines 5 and one of the vertical signal lines 6. Each of the pixels 3 includes a pixel circuit configured from a photoelectric conversion element, a charge accumulation portion, a plurality of transistors each in the form of a MOS (metal oxide semiconductor) transistor, a capacitive element and so forth. It is to be noted that a plurality of pixels may commonly use some pixel circuit.

Further, on one face side of the circuit substrate 7, peripheral circuits such as a vertical driving circuit 8, a column signal processing circuit 9, a horizontal driving circuit 10 and a system controlling circuit 11 for controlling the pixels 3 provided on the sensor substrate 2 are provided.

<<2. Configuration of the Semiconductor Device of the First Embodiment>>

Figure 2:
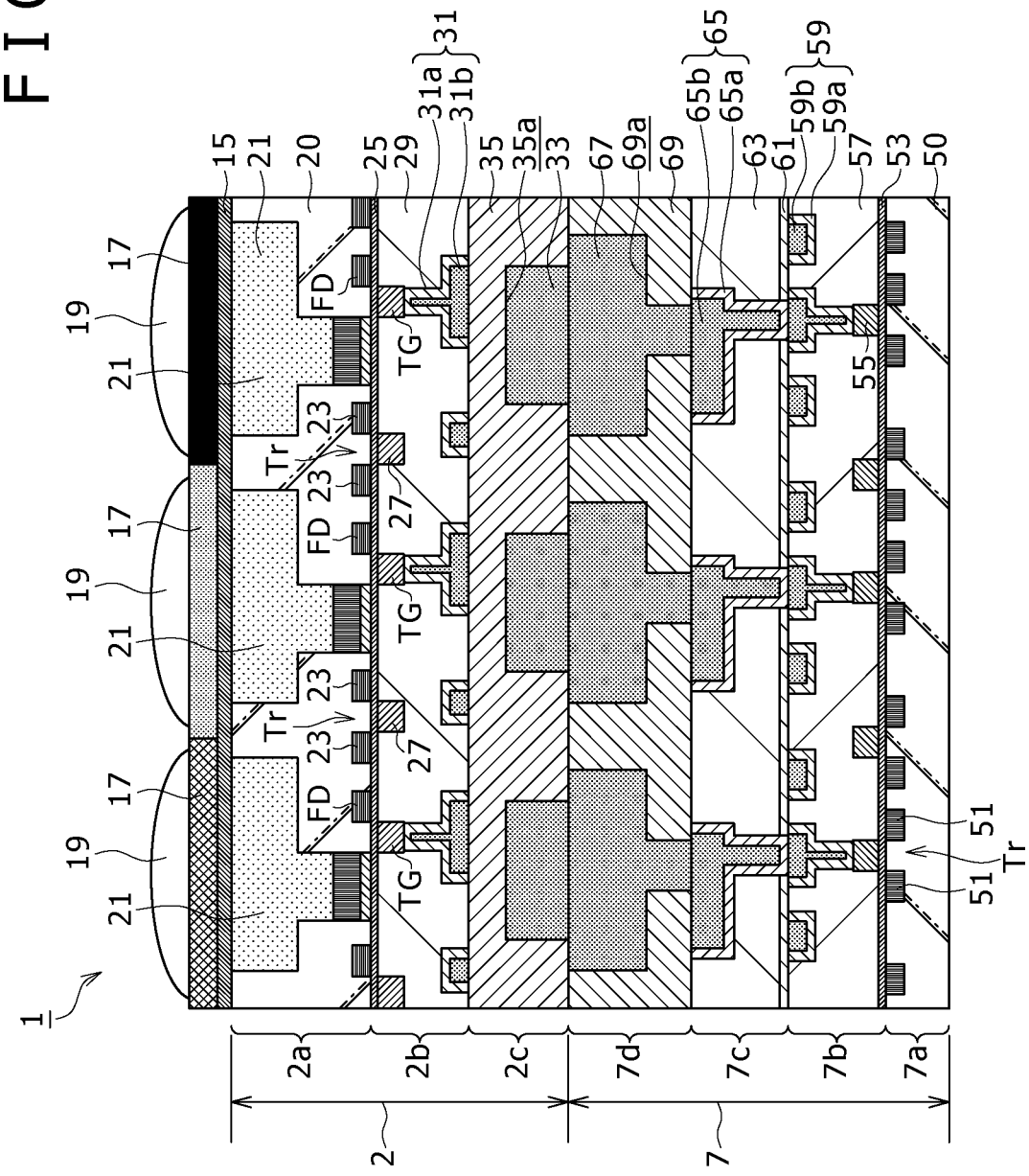
FIG. 2 is a partial sectional view showing a configuration of a semiconductor device according to a first embodiment of the present technology.

FIG. 2 shows a cross sectional configuration of the semiconductor device of the first embodiment and shows a cross section of three pixels shown in FIG. 1. In the following, a detailed configuration of the semiconductor device of the first embodiment is described with reference to the cross section of FIG. 2.

The semiconductor device 1 shown is a solid-state image pickup device of a three-dimensional structure wherein the sensor substrate 2 and the circuit substrate 7 are bonded in a laminated relationship to each other as described above. The sensor substrate 2 is configured from a semiconductor layer 2a, and a wiring line layer 2b and an electrode layer 2c disposed on a face of the semiconductor layer 2a on the circuit substrate 7 side. The circuit substrate 7 is configured from a semiconductor layer 7a, and a first wiring line layer 7b, a second wiring line layer 7c and an electrode layer 7d disposed on a face of the semiconductor layer 7a on the sensor substrate 2 side.

The sensor substrate 2 and the circuit substrate 7 configured in such a manner as described above are bonded to each other at the surface of the electrode layer 2c and the surface of the electrode layer 7d as bonding faces. The semiconductor device 1 of the present embodiment is characterized in the configuration of the electrode layer 2c and the electrode layer 7d as hereinafter described in detail.

Further, on the face of the sensor substrate 2 on the opposite side to the circuit substrate 7, a protective film 15, a color filter layer 17 and on-chip lenses 19 are laminated in order.

Now, a detailed confirmation of the layers configuring the sensor substrate 2 and the circuit substrate 7 is described successively, and a configuration of the protective film 15, color filter layer 17 and on-chip lenses 19 is described successively.

[Semiconductor Layer 2a (Sensor Substrate 2 Side)]

The semiconductor layer 2a of the sensor substrate 2 side is formed by a semiconductor substrate made of, for example, single crystal silicon in the form of a thin film. In the semiconductor layer 2a, a photoelectric conversion portion 21 formed, for example, from an n-type impurity layer or a p-type impurity layer is provided for each pixel on a first face side on which the color filter layer 17, on-chip lenses 19 and so forth are disposed. Meanwhile, on a second face side of the semiconductor layer 2a, a floating diffusion FD and a source/drain 23 of a transistor Tr made of, for example, an n+ type impurity layer, a different impurity layer not shown and so forth are provided.

[Wiring Line Layer 2b (Sensor Substrate 2 Side)]

The wiring line layer 2b provided on the semiconductor layer 2a of the sensor substrate 2 has, on the interface side thereof with the semiconductor layer 2a, for each pixel, a transfer gate TG and a gate electrode 27 of a transistor Tr provided thereon with a gate insulating film 25 interposed therebetween, and other electrodes not shown. The transfer gate TG and the gate electrode 27 are covered with an interlayer insulating film 29, and an embedded wiring line 31 of, for example, Cu is provided in a groove pattern provided in the interlayer insulating film 29.

In this instance, the interlayer insulating film 29 is configured using, for example, silicon oxide. On the other hand, where the embedded wiring lines 31 are laid out densely, the interlayer insulating film 29 may be configured using a material having a dielectric constant lower than that of silicon oxide in order to reduce the capacitance between the embedded wiring lines 31. In such an interlayer insulating film 29 as just described, groove patterns open to the circuit substrate 7 side are formed such that they partly extend to the transfer gates TG or the gate electrodes 27.

In each of such groove patterns as described above, a wiring line layer 31b made of copper (Cu) is provided with a barrier metal layer 31a interposed therebetween, and the embedded wiring lines 31 are configured from the two layers. The barrier metal layer 31a is a layer for preventing diffusion of copper (Cu) into the interlayer insulating film 29 made of silicon oxide or a material having a dielectric constant lower than that of silicon oxide and is configured using, for example, tantalum (Ta) or tantalum nitride (TaN).

It is to be noted that such a wiring line layer 2b as described above may be configured as a laminated multilayer wiring line layer.

[Electrode Layer 2c (Sensor Substrate 2 Side)]

The electrode layer 2c on the sensor substrate 2 side provided on the wiring line layer 2b includes, for each pixel, a first electrode 33 led out to the surface of the sensor substrate 2 on the circuit substrate 7 side, and a first insulating film 35 for covering the periphery of the first electrode 33. The first electrode 33 and the first insulating film 35 configure a bonding face 41 of the sensor substrate 2 to the circuit substrate 7.

The first electrode 33 is configured from a single material layer using, for example, copper (Cu). Such a first electrode 33 as just described is configured as an embedded wiring line embedded in the first insulating film 35.

The first insulating film 35 is provided in such a manner as to cover the wiring line layer 2b and includes a groove pattern 35a open to the circuit substrate 7 side and a first electrode 33 embedded in the groove pattern 35a. In other words, the first insulating film 35 is provided in contact with the periphery of the first electrode 33. It is to be noted that, though not shown, the groove pattern 35a provided in the first insulating film 35 partly extends to the embedded wiring line 31 embedded in the wiring line layer 2b and the first electrode 33 embedded in this manner is connected to the embedded wiring line 31 as occasion demands.

Such a first insulating film 35 as described above is configured from a diffusion preventing material with respect to a material from which the first electrode 33 is configured. As such a diffusion preventing material as just described, a material having a low diffusion coefficient with respect to a material which configures the first electrode 33 is used. Particularly in the present embodiment, the first insulating film 35 is configured as a single material layer for which a diffusion preventing material is used is configured. Further, in the present embodiment, the first insulating film 35 is configured from a diffusion preventing material not only with respect to the first electrode 33 but also with respect to a material which configures a second electrode 67 led out to the surface of the circuit substrate 7 on the sensor substrate 2 side.

For example, if the first electrode 33 and the second electrode 67 are configured using copper (Cu), then as the diffusion preventing material which configures the first insulating film 35, an inorganic insulating material or an organic insulating material having a molecular structure denser than that of silicon oxide is used. As such an inorganic insulation material, silicon nitride (SiN), silicon carbonitride (SiCN), silicon oxynitride (SiON) and silicon carbide (SiC) are applicable. Meanwhile, as the organic insulating material, benzocyclobutene (BCB), polybenzoxazole (PBO), polyimide and polyallyl ether (PAE) are applicable. It is to be noted that, since the electrode layer 2c is the uppermost layer on the sensor substrate 2 side, also the layout of the first electrodes 33 is rough. Therefore, the capacitance is less likely to be formed between the first electrodes 33, and a low dielectric constant is not demanded for the first insulating film 35.

As described above, the surface of the sensor substrate 2 on the circuit substrate 7 side is configured as the bonding face 41 to the circuit substrate 7 and is in a state in which it is configured only from the first electrode 33 and the first insulating film 35. This bonding face 41 is configured as a flattened face.

[Semiconductor Layer 7a (Circuit Substrate 7 Side)]

The semiconductor layer 7a on the circuit substrate 7 side is formed by forming a semiconductor substrate made of, for example, single crystal silicon as a thin film. On the surface layer of the semiconductor layer 7a on the sensor substrate 2 side, a source/drain 51 of a transistor Tr and an impurity layer and so forth which are not shown in FIG. 2 are provided for each pixel.

[First Wiring Line Layer 7b (Circuit Substrate 7 Side)]

The first wiring line layer 7b on the circuit substrate 7 side has, on an interface side thereof with the semiconductor layer 7a, for each pixel, a gate electrode 55 provided thereon with a gate insulating film 53 interposed therebetween and other electrodes not shown in FIG. 2. The gate electrode 55 and other electrodes are covered with an interlayer insulating film 57, and embedded wiring lines 59 formed using, for example, copper (Cu) are provided in groove patterns provided in the interlayer insulating film 57.

The interlayer insulating film 57 and the embedded wiring lines 59 have a configuration similar to that of the wiring line layer 2b of the sensor substrate 2 side. In particular, on the interlayer insulating film 57, groove patterns open to the sensor substrate 2 side are formed such that they partly extend to the gate electrode 55 or the source/drain 51. Further, a wiring line layer 59b made of copper (Cu) is provided in such groove patterns with a barrier metal layer 59a interposed between, and the embedded wiring lines 59 are configured from the two layers.

[Second Wiring Line Layer 7c (Circuit Substrate 7 Side)]

The second wiring line layer 7c on the circuit substrate 7 side includes, on an inter face side thereof with the first wiring line layer 7b, an interlayer insulating film 63 laminated with a diffusion preventing insulating layer 61 interposed therebetween. An embedded wiring line 65 formed using, for example, copper (Cu) is provided in each of groove patterns provided in the diffusion preventing insulating layer 61 and the interlayer insulating film 63.

The diffusion preventing insulating layer 61 is configured from a diffusion preventing material with respect to the material which configures the embedded wiring lines 59 provided in the first wiring line layer 7b. Such a diffusion preventing insulating layer 61 as just described is formed, for example, from silicon nitride (SiN), silicon carbonitride (SiCN), silicon oxynitride (SiON) or silicon carbide (SiC).

The interlayer insulating film 63 and the embedded wiring lines 65 have a configuration similar to that of the wiring line layer 2b on the sensor substrate 2 side. In particular, the interlayer insulating film 63 has groove patterns formed thereon so as to open to the sensor substrate 2 side and partly extend to the embedded wiring lines 59 of the first wiring line layer 7b. Further, a wiring line layer 65b made of copper (Cu) is provided in such groove patterns as just described with a barrier metal layer 65a interposed therebetween, and the embedded wiring lines 65 are configured from the two layers.

It is to be noted that such a first wiring line layer 7b and a second wiring line layer 7c as described above may be configured as a laminated multiplayer wiring line layer.

[Electrode Layer 7d (Circuit Substrate 7 Side)]

The electrode layer 7d of the circuit substrate 7 side which is a second substrate includes, for each pixel, a second electrode 67 led out to the surface of the circuit substrate 7 on the sensor substrate 2 side and bonded to the first electrode 33, and a second insulating film 69 which covers the periphery of the second electrode 67. The second electrode 67 and the second insulating film 69 configure a bonding face 71 of the circuit substrate 7 to the sensor substrate 2 and are configured similarly to the electrode layer 2c of the sensor substrate 2 side as described below.

In particular, the second electrode 67 is formed from a single material layer and is configured from a material which can keep good bondability to the first electrode 33 provided on the sensor substrate 2 side. Therefore, the second electrode 67 may be configured from the same material as that of the first electrode 33 and configured, for example, using copper (Cu). Such a second electrode 67 as just described is configured as an embedded wiring line embedded in the second insulating film 69.

Further, the second insulating film 69 is configured in such a manner as to cover the second wiring line layer 7c, and has, for each pixel, a groove pattern 69a open to the sensor substrate 2 side and having a second electrode 67 embedded therein. In other words, the second insulating film 69 is provided in contact with the periphery of the second electrode 67. It is to be noted that the groove pattern 69a provided in the second insulating film 69 partly extends to the embedded wiring line 65 which is an underlying layer, and the second electrode 67 embedded in the groove pattern 69a is connected to the embedded wiring line 65 as occasion demands.

Such a second insulating film 69 as described above is configured from a diffusion preventing material with respect to the material which configures the second electrode 67. Particularly in the present embodiment, the second insulating film 69 is configured as a single material layer for which a diffusion preventing material is used is configured. Further, in the present embodiment, the second insulating film 69 is configured from a diffusion preventing material not only with respect to the second electrode 67 but also with respect to the material which configures the first electrode 33 led out to the bonding face of the sensor substrate 2 to the circuit substrate 7.

Such a second insulating film 69 as just described can be formed using a material selected from the materials listed with regard to the first insulating film 35 provided on the sensor substrate 2 side. It is to be noted that the second insulating film 69 is configured from a material with which good bondability can be kept to the first insulating film 35 on the sensor substrate 2 side. Therefore, the second insulating film 69 may be configured from the same material as that of the first insulating film 35. Further, since the electrode layer 7d is the uppermost layer on the circuit substrate 7 side. Also the second electrodes 67 may be laid out roughly. Therefore, the second electrodes 67 are less likely to have capacitance therebetween, and a low dielectric constant is not demanded for the second insulating film 69.

As described above, the surface of the circuit substrate 7 on the sensor substrate 2 side is configured as the bonding face 71 to the sensor substrate 2 and is configured only from the second electrode 67 and the second insulating film 69. This bonding face 71 is configured as a flattened face.

[Protective Film 15]

The protective film 15 which covers the photoelectric conversion portions 21 of the sensor substrate 2 is configured from a material film having a passivation property and configured using, for example, a silicon oxide film, a silicon nitride film or a silicon oxynitride film.

[Color Filter Layer 17]

The color filter layer 17 is configured from color filters provided in a 1:1 corresponding relationship to the photoelectric conversion portions 21. The array of the color filters of the colors is not restricted.

[On-Chip Lens 19]

The on-chip lenses 19 are provided in a 1:1 corresponding relationship to each of the color filters of the colors which configure the photoelectric conversion portions 21 and the color filter layers 17 and are configured so as to condense incident light upon the photoelectric conversion portions 21.

[Working Effect of the Semiconductor Device of the First Embodiment]

With the semiconductor device 1 configured in such a manner as described above, since it is structured such that the periphery of the first electrode 33 is covered with the first insulating film 35 configured from a diffusion preventing material with respect to the first electrode 33, there is no necessity to provide a barrier metal layer between the first electrode 33 and the first insulating film 35. Similarly, since the semiconductor device 1 is structured such that the periphery of the second electrode 67 is covered with the second insulating film 69 configured from a diffusion preventing material with respect to the second electrode 67, there is no necessity to provide a barrier metal layer between the second electrode 67 and the second insulating film 69.

Therefore, while the bonding face 41 of the sensor substrate 2 and the bonding face 71 of the circuit substrate 7 are configured only from the insulating films 35 and 69 and the electrodes 33 and 67, respectively, to assure bonding strength, diffusion of the materials configuring the electrodes 33 and 67 into the insulating films 35 and 69 can be prevented.

As a result, in the semiconductor device 1 of a three-dimensional structure in which bonding between the electrodes 33 and 67 is established by bonding between the sensor substrate 2 and the circuit substrate 7, while diffusion of the electrode materials into the insulating films 35 and 69 is prevented, bonding strength is assured, and enhancement of the reliability can be anticipated.

<<3. Production Procedure of the Sensor Substrate in the Structure of the Semiconductor Device of the First Embodiment>>

FIGS. 3A to 3F illustrate different steps of a production procedure of the sensor substrate used in fabrication of the semiconductor device of the configuration described hereinabove in connection with the first embodiment. In the following, a production procedure of the sensor substrate used in the present embodiment is described.

[FIG. 3A]

Figure 3A:
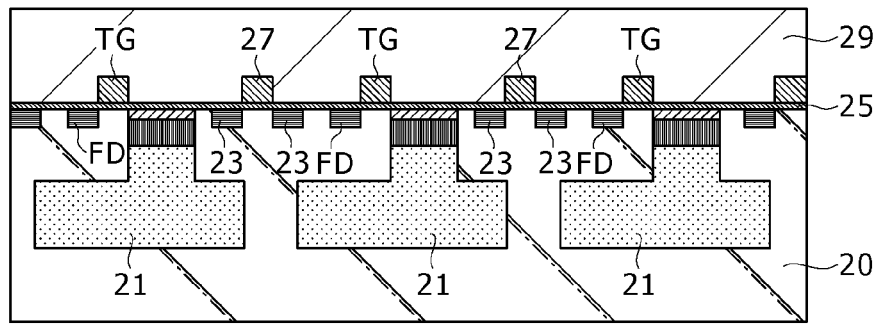
FIGS. 3A to 3F are schematic sectional views illustrating different steps of a production process of a sensor substrate in fabrication of the semiconductor device of FIG. 2.

First, a semiconductor substrate 20 made of, for example, single crystal silicon is prepared as shown in FIG. 3A. A photoelectric conversion portion 21 made of an n-type impurity is formed, for each pixel, at a predetermined depth of the semiconductor substrate 20, and then a charge transfer portion formed from an n+ type impurity layer and a charge accumulation portion for holes formed from a p+ type impurity layer are formed on a surface layer of the photoelectric conversion portion 21. A floating diffusion FD, a source/drain 23 and a further impurity layer not shown formed from an n+ type impurity layer are formed on the surface layer of the semiconductor substrate 20.

Further, a gate insulating film 25 is formed on the surface of the semiconductor substrate 20, and a transfer gate TG and a gate electrode 27 are formed on the gate insulating film 25. The transfer gate TG is formed between the floating diffusion FD and the photoelectric conversion portion 21, and the gate electrode 27 is formed between the source/drain 23. Further, at the same step, also other electrodes not shown are formed.

Thereafter, an interlayer insulating film 29 made of, for example, silicon oxide is formed on the semiconductor substrate 20 in such a state in which it covers the transfer gates TG and the gate electrodes 27.

[FIG. 3B]

Figure 3B:
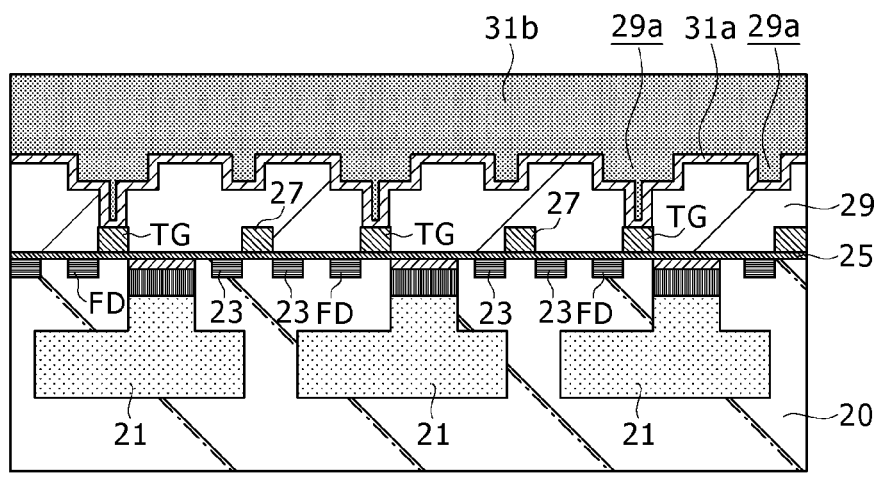

Then, groove patterns 29a are formed on the interlayer insulating film 29 as shown in FIG. 3B. The groove patterns 29a are formed in a shape in which they extend at necessary places to the transfer gates TG. Further, though not shown in FIG. 3B, groove patterns extending to the sources/drains 23 are formed in the interlayer insulating film 29 and the gate insulating film 25 as occasion demands.

Then, a barrier metal layer 31a is formed in such a state that it covers the inner wall of the groove patterns 29a, and a wiring line layer 31b made of copper (Cu) is formed in a state in which it is embedded in the groove patterns 29a.

[FIG. 3C]

Figure 3C:
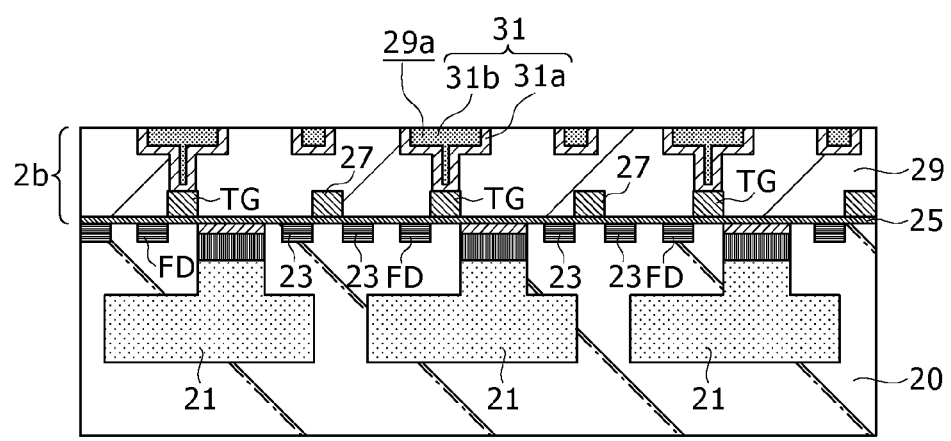

Thereafter, as shown in FIG. 3C, the wiring line layer 31b is removed and flattened by a chemical mechanical polishing (hereinafter CMP) method until the barrier metal layer 31a is exposed, and then the barrier metal layer 31a is removed and flattened until the interlayer insulating film 29 is exposed. Consequently, embedded wiring lines 31 in which the wiring line layer 31b is embedded with the barrier metal layer 31a interposed therebetween are formed in the groove patterns 29a thereby to obtain a wiring line layer 2b which includes the embedded wiring lines 31.

The steps described above are not particularly restricted in the step procedure and may be carried out in a suitably selected ordinary step procedure. In the present technology, the following steps are characteristic steps.

[FIG. 3D]

Figure 3D:
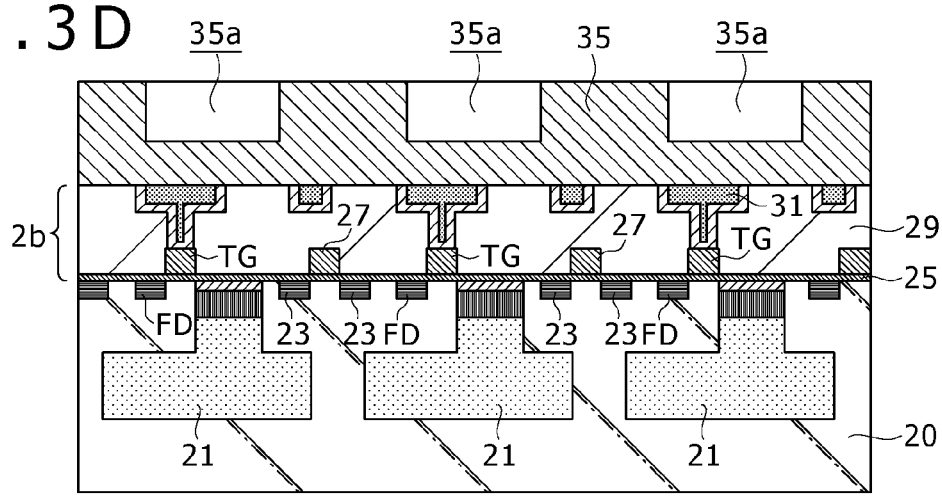

In particular, a first insulating film 35 is formed on the wiring line layer 2b as shown in FIG. 3D. The first insulating film 35 is formed using a diffusion preventing material with respect to a material which configures a first electrode film to be formed next. For example, where the first electrode film is made of copper (Cu), the first insulating film 35 is formed using an inorganic insulating material or an organic insulating material having a molecular structure denser than silicon oxide. As such an inorganic insulating material as just described, silicon nitride (SiN), silicon carbonitride (SiCN), silicon oxynitride (SiON) and silicon carbide (SiC) are applicable. Meanwhile, as the organic insulating material, benzocyclobutene (BCB), polybenzoxazole (PBO), polyimide and polyallyl ether (PAE) are applicable.

The first insulating film 35 made of any of such materials as described above is formed by a formation method suitable for the material. For example, if an inorganic insulating material is used, then a chemical vapor deposition method (CVD) is applied, but if an organic insulating material is used, then a CVD method or an application method is applied.

Then, groove patterns 35a are formed in the first insulating film 35. The groove patterns 35a have a shape in which electrode pads are embedded and extend at necessary places not shown to the embedded wiring lines 31 of the lower layer.

Such groove patterns 35a are formed in the following manner. For example, if the first insulating film 35 is made of an inorganic insulating material, then a resist pattern is formed on the first insulating film 35 by a photolithography method first, and then the first insulating film 35 is etched using the resist pattern as a mask. On the other hand, if the first insulating film 35 is made of an organic insulating material, then an inorganic material layer is formed on the first insulating film 35 first, and then a resist pattern is formed on the inorganic material layer. Then, the inorganic material layer is etched using the resist pattern as a mask to form an inorganic mask, and the first insulating film 35 is etched from above the inorganic mask. Groove patterns 35a are formed by the etching, and thereafter, the inorganic mask is removed from the first insulating film 35.

[FIG. 3E]

Figure 3E:
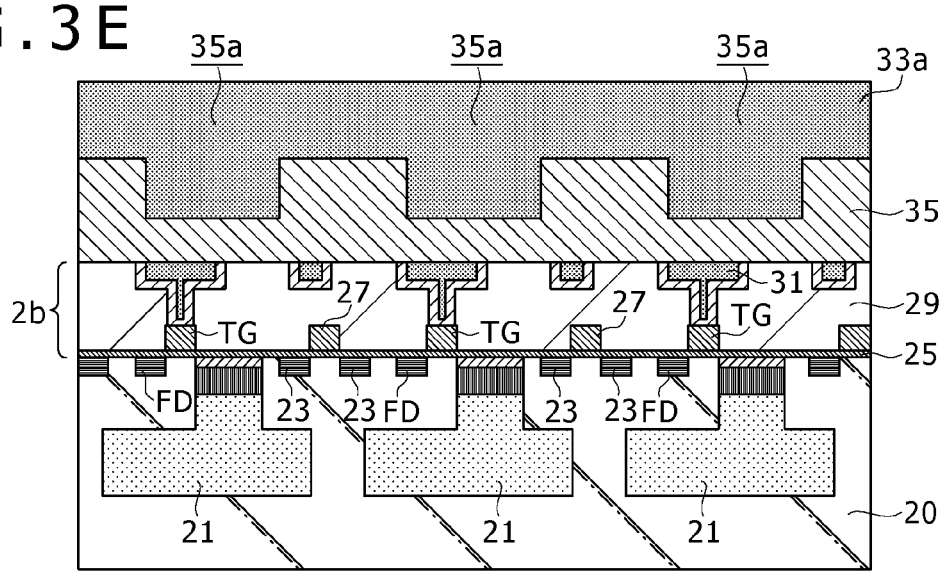

Thereafter, a first electrode film 33a is formed directly on the first insulating film 35 in a state in which it embeds the groove patterns 35a as seen in FIG. 3E. The first electrode film 33a is made of a material whose diffusion into the first insulating film 35 is prevented and is configured, for example, using copper (Cu). Formation of such a first electrode film 33a as just described is carried out by forming a thin seed layer, for example, by a sputtering method and then using a plating method wherein the seed layer is used as an electrode.

[FIG. 3F]

Figure 3F:
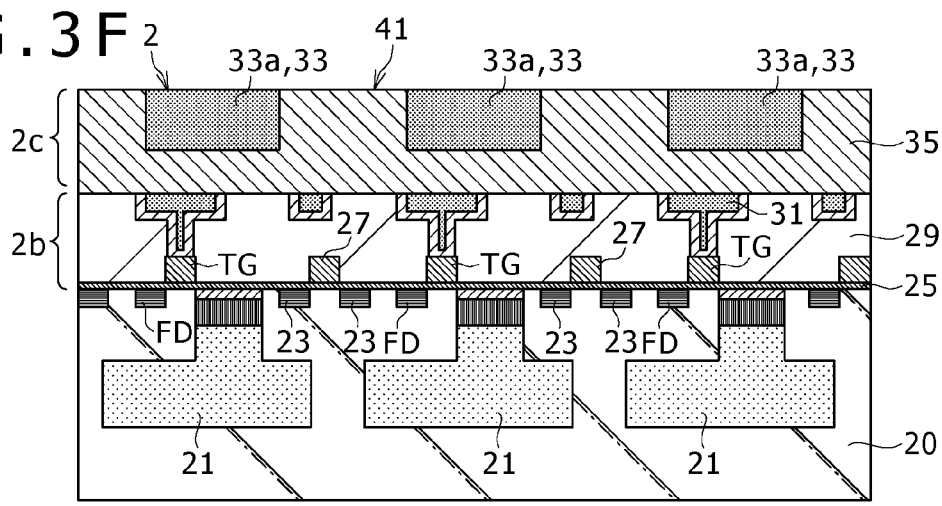

Then, the first electrode film 33a formed directly on the first insulating film 35 is removed and flattened by a CMP method until the first insulating film 35 is exposed as seen in FIG. 3F. Thereupon, using the first insulating film 35 as a polishing stopper, such CMP that the polishing stops automatically is carried out in order from the first electrode film 33a portion around which the first insulating film 35 is exposed in the polishing face. It is only necessary that the first electrode film 33a be made from a material which chemically active as typified by copper (Cu) to carry out such CMP. Various methods are used as follows.

For example, in a region around which the first insulating film 35 is exposed by advancement of the polishing by the CMP of the first electrode film 33a, a local temperature variation of polishing slurry or a local variation of the population of the first electrode film 33a on the polishing face occurs. Therefore, a method is recommendable wherein a chemical action which utilizes such local variations is utilized to locally and automatically stop the advancement of the polishing by the CMP in a region of the first electrode film 33a around which the first insulating film 35 is exposed.

Another method may be used wherein only the surface of the first electrode film 33a is degenerated and polishing is advanced only at a position at which a polishing pad contacts without using a chemical etching action. In this instance, in the region of the first electrode film 33a around which the first insulating film 35 is exposed by the advancement of the polishing by the CMP of the first electrode film 33a, the surface of the first insulating film 35 is used as a reference plane and the polishing does not advance any more. Therefore, the polishing stops automatically in order beginning with the region of the first electrode 33 around which the first insulating film 35 is exposed. In particular, such CMP is carried out by using abrasive grain-less polishing slurry for Cu "HS-C430" (product name by Hitachi Chemical Co., Ltd.) as the polishing slurry.

From the foregoing, the first electrodes 33 in which the first electrode film 33a is embedded are formed as embedded electrodes in the groove patterns 35a to obtain the electrode layer 2c which includes the first electrodes 33. By this, the sensor substrate 2 which has the flattened bonding face 41 configured from the first electrodes 33 and the first insulating film 35 is produced as a first substrate.

<<4. Production Procedure of the Circuit Substrate in Fabrication of the Semiconductor Device of the First Embodiment>>

FIGS. 4A to 4E illustrate a production procedure of a circuit substrate for use with fabrication of the semiconductor device of the configuration described hereinabove in connection with the first embodiment. In the following, the production procedure of the circuit substrate used in the embodiment is described with reference to FIGS. 4A to 4E.

[FIG. 4A]

Figure 4A:
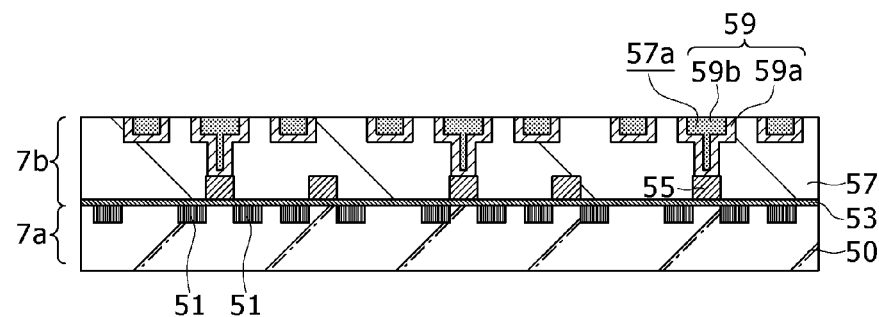
FIGS. 4A to 4E are schematic sectional views illustrating different steps of a production process of a circuit board in fabrication of the semiconductor device of FIG. 2.

First, a semiconductor substrate 50 made of, for example, single crystal silicon is prepared as shown in FIG. 4A. Sources/drains 51 of individual conductive types and other impurity layers not shown in FIG. 4A are formed on a surface layer of the semiconductor substrate 50. Further, a gate insulating film 53 is formed on the surface of the semiconductor substrate 50, and gate electrodes 55 are formed on the gate insulating film 53. The gate electrodes 55 are formed between the sources/drains 61. Further, at the same step, the other electrodes not shown are formed.

Thereafter, an interlayer insulating film 57 made of, for example, silicon oxide is formed on the semiconductor substrate 50 in such a state that it covers the gate electrodes 55.

Thereafter, groove patterns 57a are formed in the interlayer insulating film 57. The groove patterns 57a are formed in a shape in which the extend to the gate electrodes 55 at necessary places. Further, though not shown in FIG. 4A, groove patterns extending to the sources/drains 51 are formed at necessary places in the interlayer insulating film 57 and the gate insulating film 53. Then, a barrier metal layer 59a is formed in a state in which it covers the inner wall of the groove patterns 57a, and a wiring line layer 59b made of copper (Cu) is formed on the barrier metal layer 59a in such a state that it embeds the groove patterns 57a. Thereafter, the wiring line layer 59b and the barrier metal layer 59a are successively flattened and removed by CMP. By this, embedded wiring lines 59 in which wiring line layer 59b is embedded with the barrier metal layer 59a interposed therebetween are formed in the groove patterns 57a to obtain a first wiring line layer 7b which includes the embedded wiring lines 59.

[FIG. 4B]

Figure 4B:
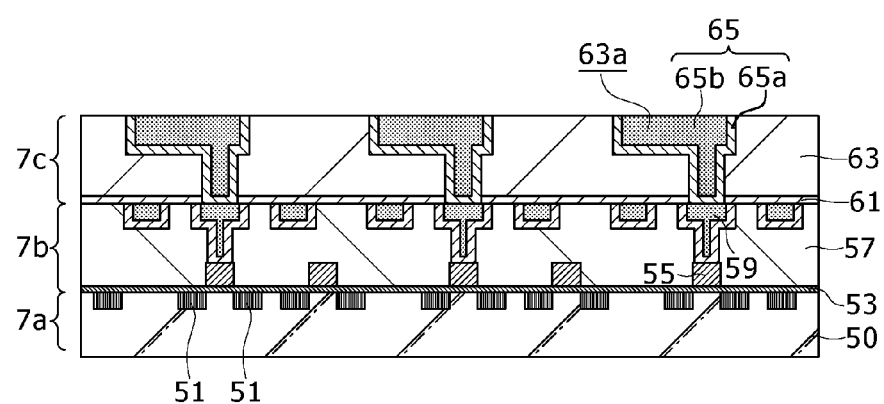

As shown in FIG. 4B, an interlayer insulating film 63 is laminated to form a film on the first wiring line layer 7b with the diffusion preventing insulating layer 61 interposed therebetween to form groove patterns 63a in the interlayer insulating film 63 and the diffusion preventing insulating layer 61. The groove patterns 63a are formed so as to extend to the embedded wiring lines 59 of the lower layer at necessary places. Thereafter, a wiring line layer 65b is embedded into the groove patterns 63a with a barrier metal layer 65a interposed therebetween to form embedded wiring lines 65 thereby to obtain a second wiring line layer 7c.

The steps described above may be carried out in an ordinary step procedure, and are not limited to a specific step procedure but can be carried out by a suitable procedure. In the present technology, steps described below are characteristic steps.

[FIG. 4C]

Figure 4C:
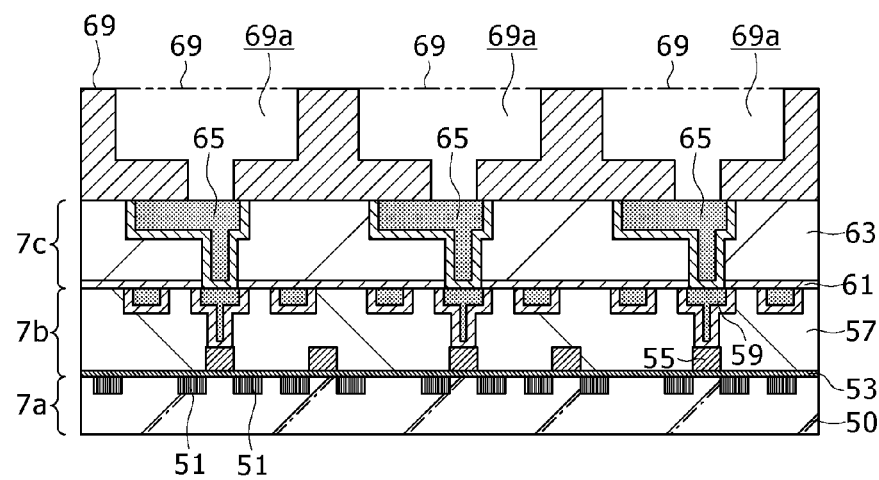

First, a second insulating film 69 is formed on the second wiring line layer 7c as shown in FIG. 4C. The second insulating film 69 is formed using a diffusion preventing material with respect to the material which configures a second conductive film to be formed next. For example, if the second electrode layer is made of copper (Cu), then the second insulating film 69 is configured using a material similar to that that of the first insulating film 35 on the sensor substrate 2 side described hereinabove and is formed as a film.

Then, groove patterns 69a are formed in the second insulating film 69. The groove patterns 69a have a shape in which electrode pads are embedded, and extend at necessary places to the embedded wiring lines 65 formed in the second wiring line layer 7c. Formation of such groove patterns 69a is carried out similarly to that of the groove patterns 35a formed in the first insulating film 35 on the sensor substrate 2 side described hereinabove.

[FIG. 4D]

Figure 4D:
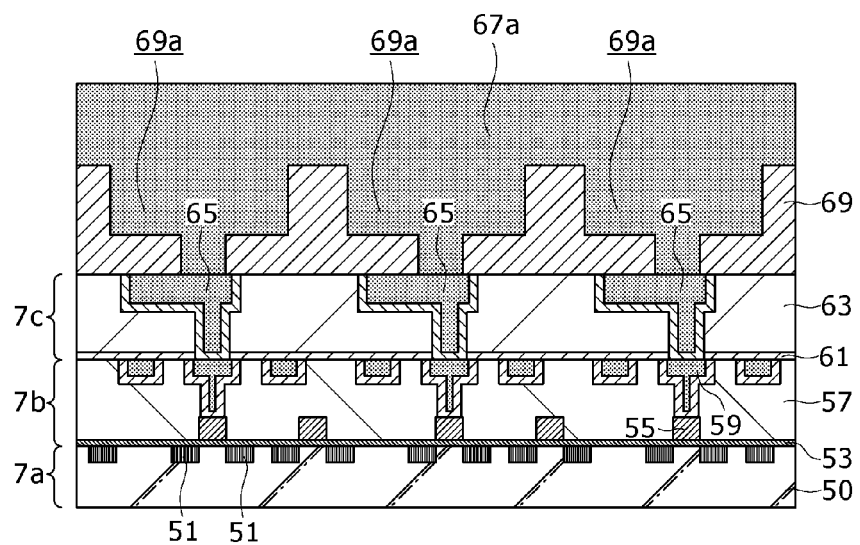

Then as shown in FIG. 4D, a second electrode film 67a is directly formed on the second insulating film 69 in a state in which it embeds the groove patterns 69a therein. The second electrode film 67a is made of a material whose diffusion into the second insulating film 69 is prevented, and is configured, for example, using copper (Cu). Formation of such the second electrode film 67a as just described is carried out, for example, by forming a thin seed film by a sputtering method and then carrying out a plating method using the seed layer as an electrode.

[FIG. 4E]

Figure 4E:
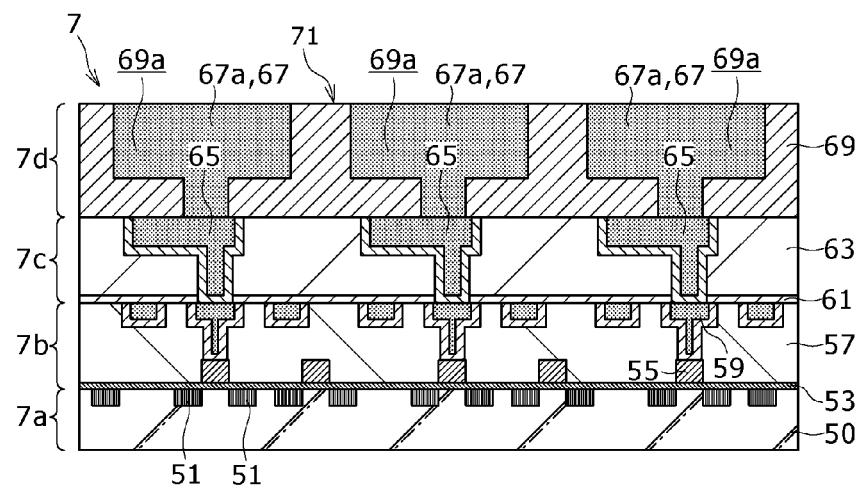

Then, as shown in FIG. 4E, the second electrode film 67a is flattened and removed by a CMP method until the second insulating film 69 is exposed. The flattening of the second electrode film 67a is carried out by CMP wherein polishing stops automatically in order beginning with a portion of the second electrode film 67a around which the second insulating film 69 is exposed in the polishing face using the second insulating film 69 as a polishing stopper similarly as in the flattening of the first electrode film 33a described hereinabove with reference to FIG. 3F.

By the procedure described above, the second electrodes 67 in which the second electrode film 67a is embedded are formed in the groove patterns 69a to obtain an electrode layer 7d which includes the second electrodes 67 as embedded electrodes. Further, a circuit substrate 7 having a bonding face 71 configured from the second electrode 67 and the second insulating film 69 is produced as a second substrate.

<<5. Bonding of the Substrates in Fabrication of the Semiconductor Device of the First Embodiment>>

Now, a bonding procedure of the sensor substrate 2 on which the flat bonding face 41 is formed and the circuit substrate 7 on which the flat bonding face 71 is formed to each other is described with reference to FIGS. 5A and 5B.

[FIG. 5A]

Figure 5A:
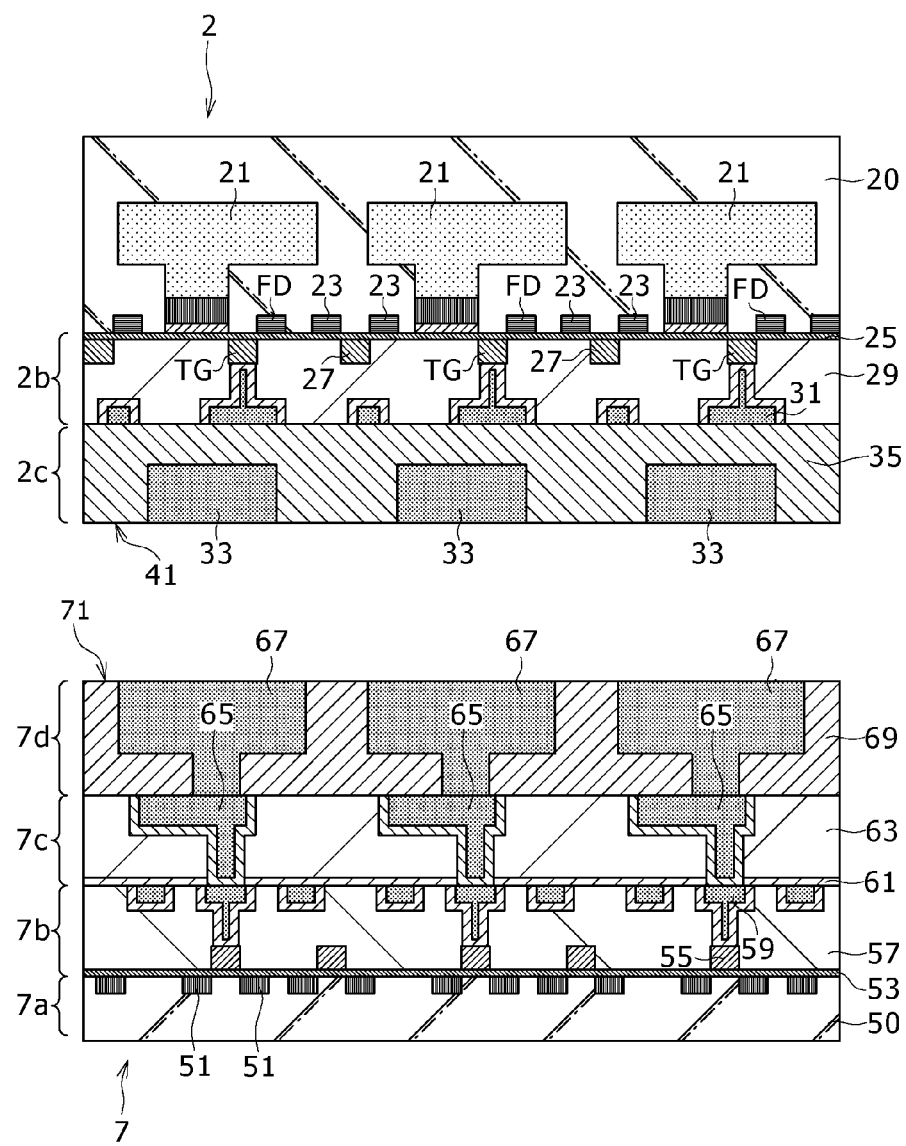
FIGS. 5A and 5B are schematic sectional views illustrating different steps of bonding in fabrication of the semiconductor device of FIG. 2.

First, as seen in FIG. 5A, the sensor substrate 2 and the circuit substrate 7 configured by the procedures described above are disposed in an opposing relationship to each other with the flat bonding face 41 and the flat bonding face 71 opposed to each other. Further, the sensor substrate 2 and the circuit substrate 7 are positioned such that the first electrodes 33 of the sensor substrate 2 side and the second electrodes 67 of the circuit substrate 7 side correspond to each other. In the example illustrated, while the first electrodes 33 and the second electrodes 67 are in a state in which they correspond in a 1:1 corresponding relationship to each other, the corresponding relationship of the sensor substrate 2 and the circuit substrate 7 is not limited to this.

It is to be noted that, for the bonding face 41 of the sensor substrate 2 and the bonding face 71 of the circuit substrate 7, pre-processing for bonding by a wet process or a plasma process is carried out as occasion demands.

[FIG. 5B]

Figure 5B:
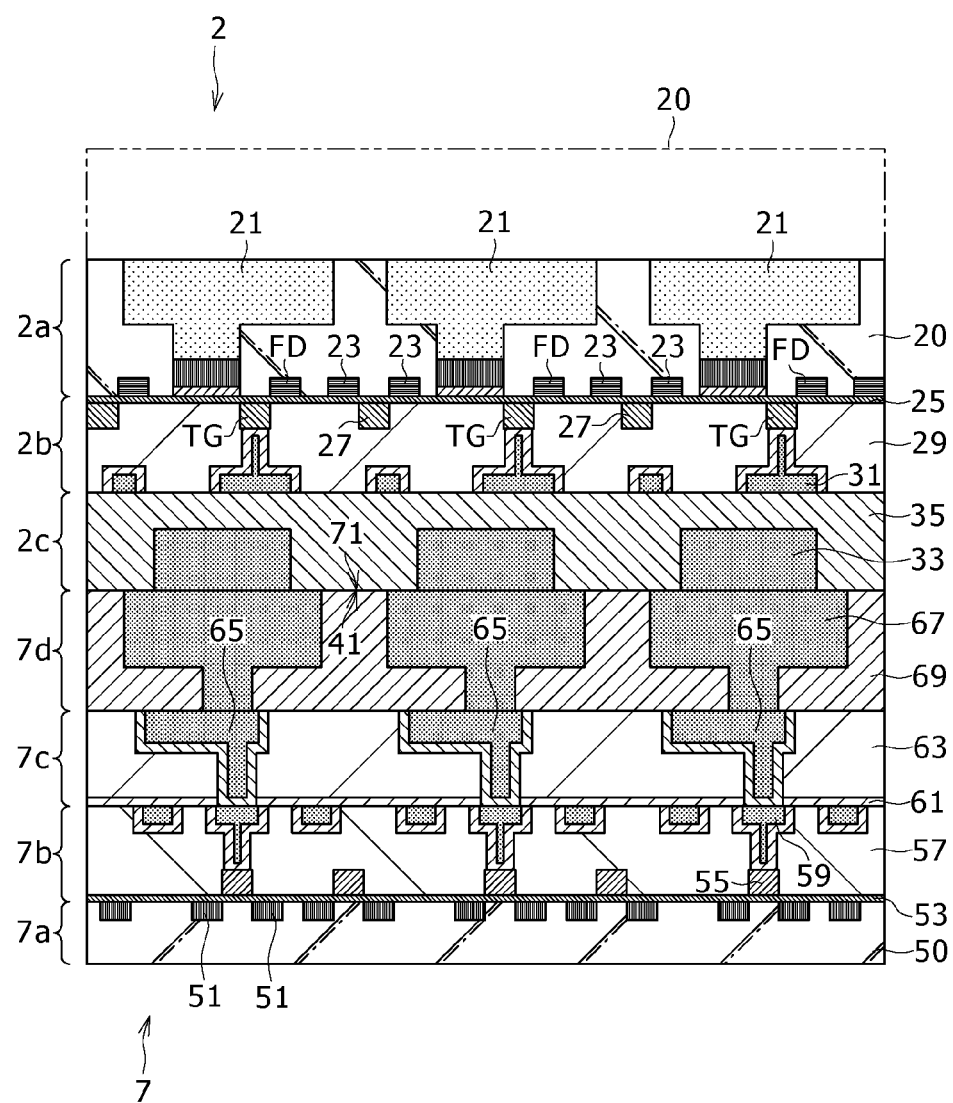

Then, as shown in FIG. 5B, the sensor substrate 2 and the circuit substrate 7 are laminated such that the bonding face 41 and the bonding face 71 contact with each other. Then, heat treatment is carried out in this state to bond the first electrodes 33 of the bonding face 41 and the second electrodes 67 of the bonding face 71 to each other. Further, the first insulating film 35 of the bonding face 41 and the second insulating film 69 of the bonding face 71 are bonded to each other. Such heat treatment is carried out at a temperature and for time sufficient to allow the electrodes 33 and 67 to be bonded to each other within a range within which the heat treatment does not have an influence on the elements and wiring lines formed on the sensor substrate 2 and the circuit substrate 7 based on the materials which configure the first electrodes 33 and the second electrodes 67.

For example, in the case where the first electrodes 33 and the second electrodes 67 are configured from materials containing copper (Cu) as a principal component, heat treatment is carried out at 200 to 600° C. for approximately one to five hours. Such heat treatment may be carried out under a pressurized atmosphere or may be carried out in a state in which the sensor substrate 2 and the circuit substrate 7 are pressed to each other from the opposite face sides. As an example, heat treatment at 400° C. for four hours is carried out to carry out Cu—Cu joining.

After the sensor substrate 2 and the circuit substrate 7 are laminated and bonded at the joining faces 41 and 71 to each other in such a manner as described above, the semiconductor substrate 20 of the sensor substrate 2 side is thinned into a semiconductor layer 2a to expose the photoelectric conversion portion 21. Further, as occasion demands, the semiconductor substrate 50 of the circuit substrate 7 is thinned to form a semiconductor layer 7a.

[FIG. 2]

Thereafter, a protective film 15 is formed on the exposed face of the photoelectric conversion portions 21 of the sensor substrate 2 as shown in FIG. 2, and then a color filter layer 17 and on-chip lenses 19 are formed on the protective film 15 thereby to complete a semiconductor device 1 which is a solid-state image pickup device.

[Working Effects of the Fabrication Method of the Semiconductor Device of the First Embodiment]

With the fabrication method according to the first embodiment described above, as described hereinabove with reference to FIG. 3F, in formation of the sensor substrate 2, the first electrode films 33a formed directly on the first insulating film 35 are flattened and removed by CMP in which the first insulating film 35 is used as a polishing stopper. Thereupon, since the CMP in which polishing is stopped automatically is carried out in order beginning with the portion of the first electrode film 33a around which the first insulating film 35 is exposed, occurrence of dishing or erosion can be prevented over the overall area of the polishing face, and a flat polished face can be obtained as the bonding face 41.

Further, also at the step described hereinabove with reference to FIG. 4E, a flat polished face can be obtained as the bonding face 71 similarly as in the foregoing description.

Accordingly, at the bonding step described hereinabove with reference to FIGS. 5A and 5B, the sensor substrate 2 and the circuit substrate 7 are bonded to each other between the flat bonding face 41 and the flat bonding face 71 thereof. Consequently, bonding by which good joining between the electrodes 33 and 67 is established is carried out over the overall area of the bonding face 41 and the bonding face 71, and high bonding strength between the sensor substrate 2 and the circuit substrate 7 can be maintained.

Further, the first insulating film 35 which configures the bonding face 41 of the sensor substrate 2 side is configured from a diffusion preventing material with respect to the first electrode 33. Therefore, diffusion of the first electrodes 33 into the first insulating film 35 can be prevented. Similarly, the second insulating film 69 which configures the bonding face 71 of the circuit substrate 7 side is configured from a diffusion preventing material with respect to the second electrode 67. Therefore, diffusion of the second electrodes 67 into the second insulating film 69 can be prevented. Accordingly, bonding wherein such joining strength between the electrodes 33 and 67 as described above is maintained can be achieved.

Besides, the first insulating film 35 of the sensor substrate 2 side is configured from a diffusion preventing material with respect to the second electrode 67 of the circuit substrate 7 side, and the second insulating film 69 on the circuit substrate 7 side is configured from a diffusion preventing material with respect to the first electrode 33 of the sensor substrate 2 side. Consequently, mutual diffusion of an electrode material between the sensor substrate 2 and the circuit substrate 7 can be prevented.

In addition, the bonding face 41 on the sensor substrate 2 side is configured only from the first electrodes 33 and the first insulating film 35, and the bonding face 71 on the circuit substrate 7 side is configured only from the second electrodes 67 and the second insulating film 69. Therefore, the bonding faces 41 and 71 are not configured from a barrier metal layer which is chemically inactive and is not likely to maintain the joining strength, and the configuration of the bonding faces is simplified. Also by this, the joining strength can be maintained.

FIGS. 6A to 6C, 6A' to 6C' and 6D illustrate a fabrication procedure of a semiconductor device of a comparative example. The procedure of the comparative example illustrated in FIGS. 6A to 6D is carried out in the following manner.

First, as seen in FIG. 6A, a groove pattern 101a is formed on a first insulating film 101 which covers the surface of one of substrates and a barrier metal layer 102 for an electrode material is formed along the groove pattern 101a, whereafter a first electrode film 103a made of copper (Cu) is formed on the barrier metal layer 102. Then, as seen in FIG. 6B, the first electrode film 103a is flattened and removed by CMP to expose the barrier metal layer 102. Thereupon, CMP in which the barrier metal layer 102 is used as a polishing stopper is carried out. Further, as this CMP, such CMP wherein polishing is automatically stopped is carried out in order beginning with a portion of the first electrode film 103a around which the barrier metal layer 102 is exposed to the polishing face.

Thereafter, as shown in FIG. 6C, the barrier metal layer 102 is flattened and removed by polishing to expose the first insulating film 101. By the foregoing, a first electrode 103 in which the first electrode film 103a made of copper (Cu) is embedded in the groove pattern 101a of the first insulating film 101 with the barrier metal layer 102 interposed therebetween is formed.

Meanwhile, as shown in FIGS. 6A' to 6C', also on the surface side of the other substrate, a second electrode 203 in which a second electrode film 203a made of copper (Cu) is embedded with a barrier metal layer 202 interposed therebetween is formed in a groove pattern 201a of a second insulating film 201 by a similar procedure.

Thereafter, as shown in FIG. 6D, the substrates are disposed such that the polished faces thereof are opposed to each other and are joined together at the first electrode 103 and the second electrode 203 thereof facing each other to bond them to each other.

In such a procedure of the comparative example as just described, in polishing of the barrier metal layer 102 and the first electrode film 103a in FIG. 6B to FIG. 6C, a sudden change in exposure area of the first electrode film 103a made of copper (Cu) which is chemically active does not occur. Therefore, CMP wherein polishing is automatically stopped in order beginning with a portion of the first electrode film 103a around which the first insulating film 101 is exposed cannot be carried out. Accordingly, occurrence of dishing or erosion in the polishing face cannot be prevented, and it is difficult to obtain a flat polished face. This similarly applies also to the step illustrated in FIG. 6C'.

Accordingly, as seen in FIG. 6D, even if the polished faces which are inferior in flatness are opposed to each other to bond the substrates to each other, sufficient bonding strength cannot be obtained. Besides, also the joining strength between the first electrode 103 and the second electrode 203 cannot be obtained sufficiently.

Further, the polished face shown in FIG. 6C is configured from the first insulating film 101, barrier metal layer 102 and first electrode 103. Meanwhile, also the polished face shown in FIG. 6C' is configured from the second insulating film 201, barrier metal layer 202 and second electrode 203. Therefore, on a joining interface of the polished faces, also a joining interface between the first insulating film 101 and first electrode 103 and the barrier metal layer 202 and a joining interface between the second insulating film 201 and second electrode 203 and the barrier metal layer 102 are generated. However, since the barrier metal layers 102 and 202 are chemically inactive, pre-processing by a plasma process or a wet process is difficult upon bonding. To this end, at portions of the bonding faces at which the barrier metal layers 102 and 202 are exposed, high joining strength cannot be obtained. This makes a factor of inviting degradation of the bonding strength between the substrates.

In contrast with such a comparative example as described above, in the semiconductor device of the present embodiment shown in FIG. 2, bonding is carried out between the flat bonding face 41 and the flat bonding face 71, simplified to two kinds, of the first electrode 33 and first insulating film 35 and the second electrode 67 and second insulating film 69. Further, between the first electrode 33 and the second electrode 67, between the first insulating film 35 and the second insulating film 69, between the first electrode 33 and the second insulating film 69, and between the second electrode 67 and the first insulating film 35, sufficient joining strength can be obtained. Therefore, between the sensor substrate 2 which is a first substrate and the circuit substrate 7 which is a second substrate, sufficient bonding strength can be obtained.

<<6. Modification to the Semiconductor Device of the First Embodiment>>

Figure 7:
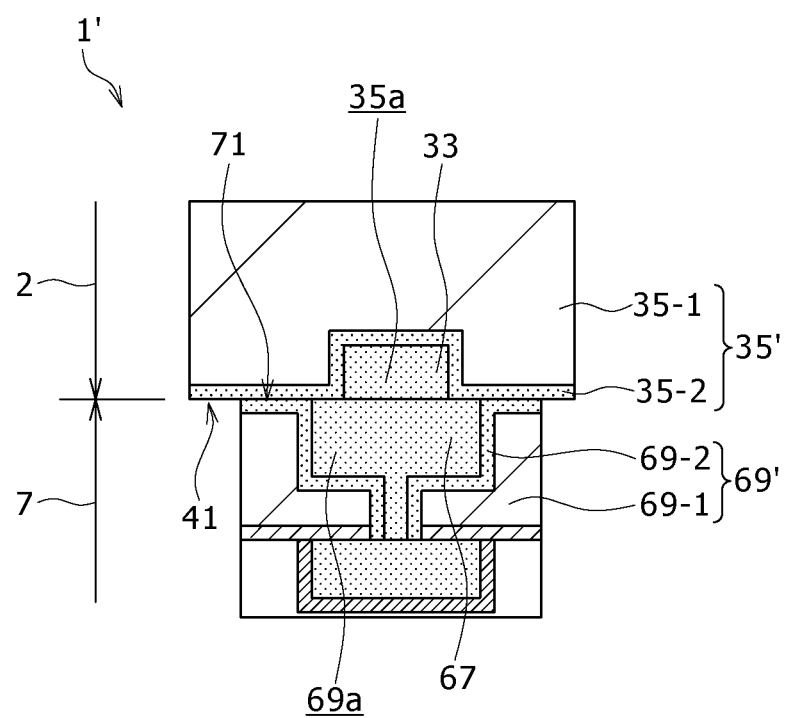
FIG. 7 is a partial schematic sectional view showing a configuration of a semiconductor device which is a modification to the semiconductor device of FIG. 2.

FIG. 7 shows a semiconductor device 1' according to a modification to the first embodiment. Referring to FIG. 7, a first insulating film 35' including an interlayer insulating film 35-1 and a diffusion preventing insulating film 35-2 may be provided on the sensor substrate 2 as a first substrate. In this instance, a groove pattern 35a is provided in the interlayer insulating film 35-1 made of, for example, silicon oxide or a low dielectric material, and the diffusion preventing insulating film 35-2 is provided in a state in which it covers the interlayer insulating film 35-1 including an inner face of the groove pattern 35a. Further, a first electrode 33 is provided in the groove pattern 35a with the diffusion preventing insulating film 35-2 interposed therebetween. Consequently, the periphery of the first electrode 33 is surrounded by the diffusion preventing insulating film 35-2, and a bonding face 41 is configured from the first electrode 33 and the diffusion preventing insulating film 35-2.

Also on the circuit substrate 7 as a second substrate, a second insulating film 69' including an interlayer insulating film 69-1 and a diffusion preventing insulating film 69-2 may be provided similarly. Consequently, the periphery of the second electrode 67 is surrounded by the diffusion preventing insulating film 69-2, and a bonding face 71 is configured from the second electrode 67 and the diffusion preventing insulating film 69-2.

Also with the semiconductor device 1' having such a configuration as described above, the bonding face 41 of the sensor substrate 2 and the bonding face 71 of the circuit substrate 7 can be configured only from the diffusion preventing insulating films 35-2 and 69-2 and the electrodes 33 and 67 to assure joining strength. Besides, diffusion of materials configuring the electrodes 33 and 67 into the interlayer insulating films 35-1 and 69-1 can be prevented.

As a result, in the semiconductor device 1' of a three-dimensional structure wherein the first electrode 33 and the second electrode 67 are joined together by bonding of the two substrates 2 and 7, bonding strength is assured while diffusion of an electrode material is prevented. Consequently, improvement in reliability can be achieved.

Further, in fabrication of the semiconductor device 1' having such a configuration as described above, when the sensor substrate 2 which is a first substrate is produced, the film which configures the first electrode 33 may be polished by CMP using the diffusion preventing insulating film 35-2 as a stopper. Therefore, the point of time at which the diffusion preventing insulating film 35-2 is exposed can be detected accurately as an end point of polishing, and CMP can be ended without generation of dishing to obtain a flat polished face as the bonding face 41.

Also in the case where the circuit substrate 7 which is a second substrate is to be produced, a film which configures the second electrode 67 may be polished by CMP using the diffusion preventing insulating film 69-2 as a stopper similarly. Therefore, a flat polished face can be obtained as the bonding face 71 similarly.

As a result, similarly as in the fabrication method of the first embodiment described above, bonding wherein the bonding face 41 and the bonding face 71 are joined together over the overall area is carried out, and bonding strength between the sensor substrate 2 and the circuit substrate 7 can be maintained. Besides, the diffusion preventing insulating film 35-2 of the sensor substrate 2 side may be configured from a diffusion preventing material with respect to the second electrode 67 of the circuit substrate 7 side, and the diffusion preventing insulating film 69-2 of the circuit substrate 7 side may be configured from a diffusion preventing material with respect to the first electrode 33 of the sensor substrate 2 side. Consequently, also diffusion of an electrode material between the sensor substrate 2 and the circuit substrate 7 can be prevented. In addition, the bonding face 41 of the sensor substrate 2 side is configured only from the first electrode 33 and the diffusion preventing insulating film 35-2, and the bonding face 71 of the circuit substrate 7 side is configured only from the second electrode 67 and the diffusion preventing insulating film 69-2. Therefore, the configuration of the bonding face is simplified, and also by this, joining strength can be maintained.

Second Embodiment

<<1. Configuration of the Semiconductor Device of the Second Embodiment>>

Figure 8:
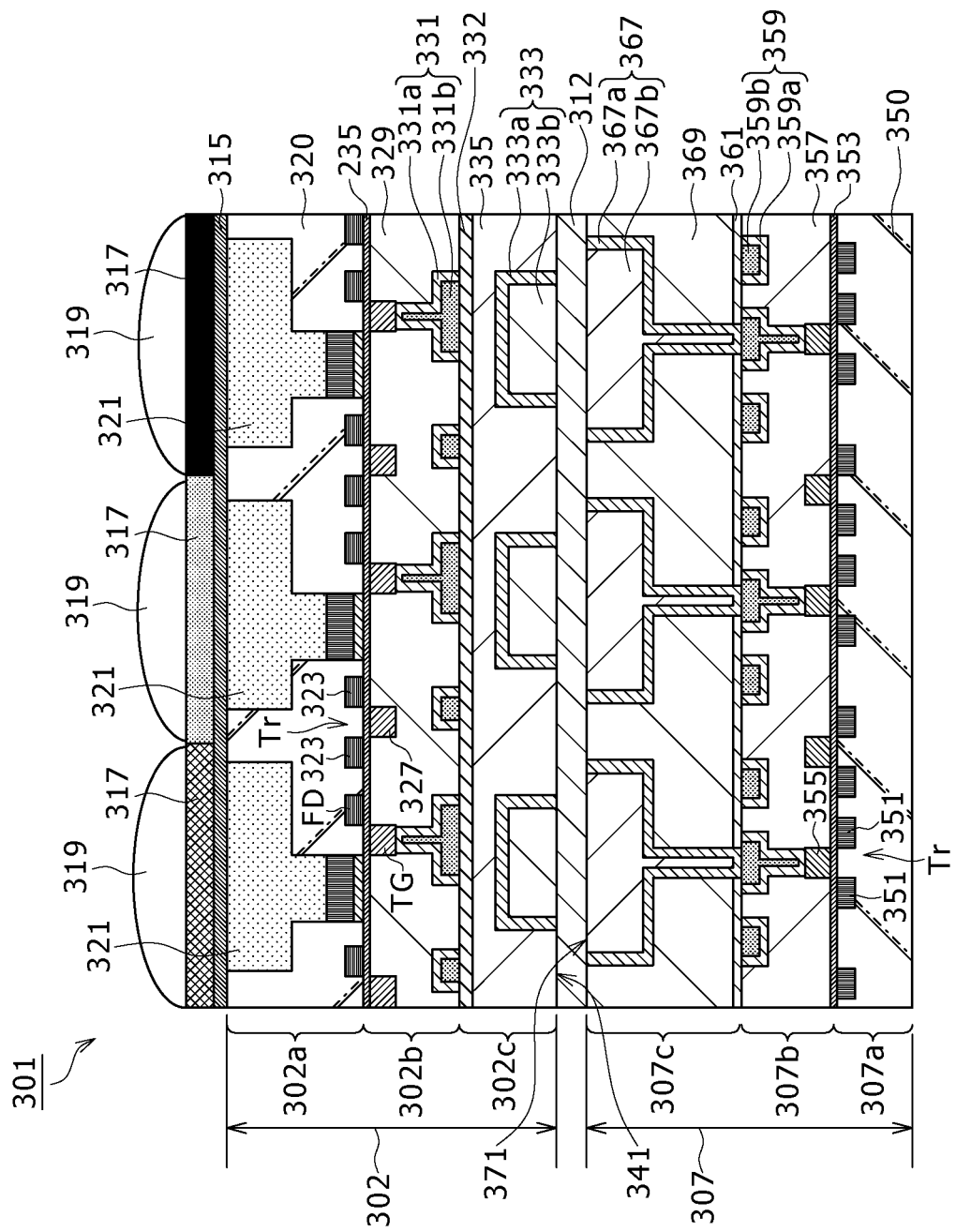
FIG. 8 is a partial sectional view showing a configuration of a semiconductor device according to a second embodiment of the present technology.

FIG. 8 shows a partial sectional configuration of a semiconductor device according to a second embodiment of the present disclosure. In the following, a detailed configuration of the semiconductor device of the present embodiment is described with reference to FIG. 8.

The semiconductor device 301 shown in FIG. 8 is a solid-state image pickup device of a three-dimensional structure wherein a first substrate 302 and a second substrate 307 are bonded to each other such that a bonding face 341 of the first substrate 302 and a bonding face 371 of the second substrate 307 are disposed in an opposing relationship to each other in a state in which an insulating thin film 312 is sandwiched therebetween. In the present embodiment, the semiconductor device 301 is characterized in the structure that the first substrate 302 and the second substrate 307 are bonded to each other with the insulating thin film 312 interposed therebetween.

The first substrate 302 includes a semiconductor layer 302a, a wiring line layer 302b and an electrode layer 302c laminated in order from the opposite side to the second substrate 307. The surface of the electrode layer 302c is configured as a bonding face 341 to the second substrate 307. Meanwhile, the second substrate 307 includes a semiconductor layer 307a, a wiring line layer 307b and an electrode layer 307c laminated in order from the opposite side to the first substrate 302. The surface of the electrode layer 307c is configured as a bonding face 371 to the first substrate 302.

On the face of the first substrate 302 on the opposite side to the second substrate 307, a protective film 315, a color filter layer 317 and an on-chip lenses 319 are laminated in the order as shown in FIG. 8.

Now, a detailed configuration of the layers which configure the first substrate 302 and the second substrate 307 and the insulating thin film 312 is described successively, and then a configuration of the protective film 315, color filter layer 317 and on-chip lenses 319 is described successively.

[Semiconductor Layer 302a (First Substrate 302 Side)]

The semiconductor layer 302a of a first substrate 302 is a thin film of the semiconductor substrate 320 made of, for example, single crystal silicon. On the first face side of the semiconductor layer 302a on which the color filter layer 317, on-chip lenses 319 and so forth are disposed, a photoelectric conversion portion 321 formed, for example, from an n-type impurity or a p-type purity is provided for each pixel. Meanwhile, on the second face of the semiconductor layer 302a, a floating diffusion FD and a source/drain region 323 of a transistor Tr formed from an n+-type impurity layer as well as other impurity layers and so forth not shown are provided.

[Wiring Line Layer 302b (First Substrate 302 Side)]

The wiring line layer 302b provided on the semiconductor layer 302a of the first substrate 302 has, on an interface side thereof with the semiconductor layer 302a, a transfer gate TG and a gate electrode 327 of the transistor Tr as well as other electrodes not shown provided with a gate insulating film 325 interposed therebetween. The transfer gate TG and the gate electrode 327 are covered with an interlayer insulating film 329, and an embedded wiring line 331 is provided in a groove pattern formed on the interlayer insulating film 329. The embedded wiring line 331 is configured from a barrier metal layer 331a which covers the inner wall of the groove pattern, and a wiring line layer 331b made of copper (Cu) and embedded in the groove pattern with the barrier metal layer 331a interposed therebetween.

It is to be noted that such a wiring line layer 302b as described above may be configured further as a laminated multilayer wiring line layer.

[Electrode Layer 302c (First Substrate 302 Side)]

The electrode layer 302c provided on the wiring line layer 302b of the first substrate 302 includes, on the interface side with the wiring line layer 302b, a diffusion preventing insulating film 332 for copper (Cu) and a first insulating film 335 laminated on the diffusion preventing insulating film 332. The first insulating film 335 is formed, for example, from a TEOS film, and a first electrode 333 as an embedded electrode is provided in the groove pattern formed on the first insulating film 335. It is to be noted that the TEOS film is a silicon oxide film formed by a chemical vapor deposition method (hereinafter referred to as CVD method) wherein TEOS gas (Tetra Ethoxy Silane gas: composition Si(OC2H5)4) as source gas. The first electrode 333 is configured from a barrier metal layer 333a which covers the inner wall of the groove pattern, a first electrode film 333b made of copper (Cu) and embedded in the groove pattern with the barrier metal layer 333a interposed therebetween.

The surface of the electrode layer 302c having such a configuration as described above is used as a bonding face 341 on the first substrate 302 side to the second substrate 307. The bonding face 341 is configured such that the first electrode 333 and the first insulating film 335 are exposed thereto and is in a state flattened, for example, by chemical mechanical polishing (hereinafter referred to as CMP).

It is to be noted that, though not shown in FIG. 8, the groove pattern provided in the first insulating film 335 partly extends to the embedded wiring line 331 provided in the wiring line layer 302b, and the first electrode 333 embedded in the groove pattern is in a state connected to the embedded wiring line 331 as occasion demands.

[Semiconductor Layer 307a (Second Substrate 307 Side)]

Meanwhile, the semiconductor layer 307a of the second substrate 307 is formed from a thin film of a semiconductor substrate 350 made of, for example, single crystal silicon. On the surface layer of the semiconductor layer 307a on the first substrate 302 side, a source/drain 351 of the transistor Tr and impurity layers not shown are provided.

[Wiring Line Layer 307b (Second Substrate 307 Side)]

The wiring line layer 307b provided on the semiconductor layer 307a of the second substrate 307 has, on the interface side thereof with the semiconductor layer 307a, a gate electrode 355 provided with a gate insulating film 353 interposed therebetween and other electrodes not shown. The gate electrode 355 and the other electrodes are covered with an interlayer insulating film 357, and an embedded wiring line 359 is provided in a groove pattern formed on the interlayer insulating film 357. The embedded wiring line 359 is configured from a barrier metal layer 359a which covers the inner wall of the groove pattern, and a wiring line layer 359b made of copper (Cu) and embedded in the groove pattern with the barrier metal layer 359a interposed therebetween.

It is to be noted that such a wiring line layer 307b as described above may have a multilayer wiring line layer structure.

[Electrode Layer 307c (Second Substrate 307 Side)]

The electrode layer 307c provided on the wiring line layer 307b of the second substrate 307 includes, on the interface side thereof with the wiring line layer 307b, a diffusion preventing insulating film 361 with respect to copper (Cu) and a second insulating film 369 laminated on the diffusion preventing insulating film 361. The second insulating film 369 is formed, for example, from a TEOS film, and a second electrode 367 as an embedded electrode is provided in a groove pattern formed in the second insulating film 369. The second electrode 367 is configured from a barrier metal layer 367a which covers the inner wall of the groove pattern, and a second electrode film 367b made of copper (Cu) and embedded in the groove pattern with the barrier metal layer 367a interposed therebetween. The second electrode 367 is disposed so as to correspond to the first electrode 333 of the first substrate 302 side and is electrically connected to the first electrode 333 on the first substrate 302 side with the insulating thin film 312 interposed therebetween.

The surface of such an electrode layer 307c as described above is formed as the bonding face 371 on the second substrate 307 to the first substrate 302. The bonding face 371 is configured such that the second electrode 367 and the second insulating film 369 are exposed thereto and is in a state flattened, for example, by CMP.

[Insulating Thin Film 312]

The insulating thin film 312 is sandwiched between the bonding face 341 of the first substrate 302 side and the bonding face 371 on the second substrate 307 side and covers the overall area of the bonding face 341 and the bonding face 371. In other words, the first substrate 302 and the second substrate 307 are bonded to each other with the insulating thin film 312 interposed therebetween.

Such an insulating thin film 312 as described above is formed, for example, from an oxide film and a nitride film, and an oxide film and a nitride film which are used popularly with semiconductors are used for the insulating thin film 312. In the following, a component material of the insulating thin film 312 is described in detail.

In the case where the insulating thin film 312 is formed from an oxide film, for example, silicon oxide (SiO2) or hafnium oxide (HfO2) is used. In the case where the insulating thin film 312 is formed from an oxide film and the first electrode 333 and the second electrode 367 are made of copper (Cu), copper (Cu) which is an electrode material for them is liable to diffuse into the insulating thin film 312. Since the electric resistance of the insulating thin film 312 decreases by such diffusion of copper (Cu), the dielectric between the first electrode 333 and the second electrode 367 with the insulating thin film 312 interposed therebetween enhances. Therefore, in the case where the insulating thin film 312 is formed from an oxide film, the insulating thin film 312 may be formed rather thick.

In the case where the insulating thin film 312 is formed from a nitride film, for example, silicon nitride (SiN) is used. The insulating thin film 312 formed from a nitride film has a diffusion preventing property with respect to the first electrode 333 and the second electrode 367.

Consequently, within the same substrate, leak current which appears between electrodes of the same substrate through the insulating thin film 312 can be prevented. In other words, in the first substrate 302, leak current between adjacent first electrodes 333 which appears through the insulating thin film 312 can be prevented. Similarly, in the second substrate 307, leak current between adjacent second electrodes 367 which appears through the insulating thin film 312 can be prevented.

On the other hand, between different substrates, diffusion of an electrode material into an insulating film on the opposing electrode side can be prevented. In other words, diffusion of the first electrode 333 on the first substrate 302 side into the second insulating film 369 on the opposing second substrate 307 side can be prevented. Similarly, diffusion of the second electrode 367 on the second substrate 307 side into the first insulating film 335 on the opposing first substrate 302 side can be prevented. Therefore, it is not necessary to provide a barrier film made of a diffusion preventing material with respect to an electrode of the opposite electrode side at a portion of each of the bonding faces of the substrates at which an insulating film is exposed.

Further, particularly in the present embodiment, it is important that the first electrode 333 of the first substrate 302 side and the second electrode 367 of the second substrate 307 side are electrically connected to each other with the insulating thin film 312 interposed therebetween. Therefore, the thickness of the insulating thin film 312 is very small.

The film thickness of the insulating thin film 312 differs depending upon the material of the insulating thin film 312 and is equal to or smaller than approximately 2 nm, for example, with regard to oxides such as silicon oxide (SiO2) and hafnium oxide (HfO2) and almost all of the other materials. However, depending upon the film quality of the insulating thin film 312, a further thicker film may be used. Between the first electrode 333 and the second electrode 367 disposed in an opposing relationship with the insulating thin film 312 interposed therebetween, tunnel current flows. Further, if a voltage equal to or higher than a fixed level is applied to cause breakdown, then the first electrode 333 and the second electrode 367 are placed into a fully conducting state therebetween and current flows between them.

It is to be noted that, in the semiconductor device 301 of the present embodiment, the insulating thin film 312 may not necessarily have a one-layer structure described hereinabove but may have a laminated structure of the same material or a laminated structure of different materials.

[Protective Film 315, Color Filter Layer 317 and on-Chip Lenses 319]

The protective film 315 is provided covering the photoelectric conversion portion 321 of the first substrate 302. The protective film 315 is configured from a material film having a passivation property, and, for example, a silicon oxide film, a silicon nitride film, a silicon oxynitride film or a like film is used for the protective film 315.

The color filter layer 317 is configured from color filters of different colors provided in a one-by-one corresponding relationship to the photoelectric conversion portions 321. The array of the color filters of the colors is not limited particularly.

The on-chip lenses 319 are provided in a one-by-one corresponding relationship to the photoelectric conversion portions 321 and the color filters of the different colors which configure the color filter layer 317 and are configured such that incident light is condensed at the photoelectric conversion portions 321.

[Effects by the Configuration of the Semiconductor Device of the Present Embodiment]

In the semiconductor device 301 of the present embodiment configured in such a manner as described above, since the first substrate 302 and the second substrate 307 are bonded to each other with the insulating thin film 312 interposed therebetween as seen in FIG. 8, the bonding face 341 of the first substrate 302 and the bonding face 371 of the second substrate 307 do not directly contact with each other. Accordingly, generation of voids which are normally generated, in the configuration wherein the bonding faces of them are joined directly to each other, along the joining interface is prevented. Consequently, with the semiconductor device, the joining strength between the two substrates is increased and enhancement of the reliability is achieved.

Particularly in the case where the first insulating film 335 and the second insulating film 369 are formed from a TEOS film, since many OH groups exist on the surface of the TEOS film, voids by dehydration condensation are generated along the joining interface along which the insulating films each in the form of a TEOS film contact are jointed directly with each other. Also in the case where an insulating film is a TEOS film, since, in the semiconductor device 301 of the present embodiment, substrates are bonded to each other with the insulating thin film 312 interposed therebetween, the TEOS films are not joined directly to each other, and generation of voids by dehydration condensation can be prevented. Consequently, with the semiconductor device, the joining strength between the two substrates increases and enhancement of the reliability is achieved.

<<2. Production Procedure of the First Substrate (Sensor Substrate) in Fabrication of the Semiconductor Device of the Second Embodiment>>

FIGS. 9A to 9E illustrate a production procedure of a first substrate 302 for use with fabrication of the semiconductor device of the second embodiment. In the following, a production procedure of the first substrate 302 as a sensor substrate used in the present embodiment is described with reference to FIGS. 9A to 9E.

Figure 9A:
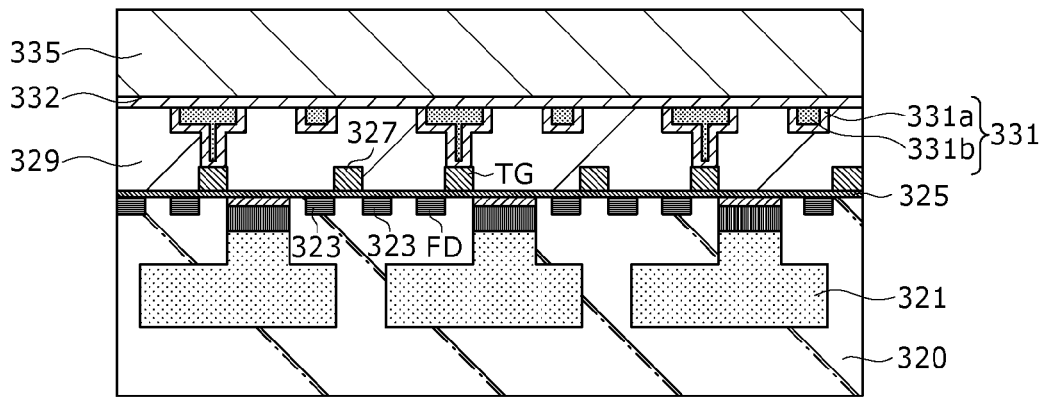
FIGS. 9A to 9E are schematic sectional views illustrating a production procedure of a first substrate or sensor substrate in fabrication of a semiconductor device according to the second embodiment of the present technology.

A semiconductor substrate 320 made of, for example, single crystal silicon is prepared as shown in FIG. 9A. A photoelectric conversion portion 321 made of an n-type impurity layer is formed at a predetermined depth of the semiconductor substrate 320, and then a charge transfer portion formed from an n+ type impurity layer and a charge accumulation portion for holes formed from a p+ type impurity layer are formed on a surface layer of the photoelectric conversion portion 321. A floating diffusion FD, a source/drain 323 and a further impurity layer not shown formed from an n+ type impurity layer is formed for each pixel on the surface layer of the semiconductor substrate 320.

Then, a gate insulating film 325 is formed on the surface of the semiconductor substrate 320, and a transfer gate TG and a gate electrode 327 are formed on the gate insulating film 325. The transfer gate TG is formed between the floating diffusion FD and the photoelectric conversion portion 321, and the gate electrode 327 is formed between the source/drain 323. Further, at the same step, also other electrodes not shown are formed.

It is to be noted that the steps described may be carried out in an ordinary production procedure selected suitably.

Thereafter, an interlayer insulating film 329 made of, for example, silicon oxide is formed on the gate insulating film 325 in a state in which it covers the transfer gates TG and the gate electrodes 327. Further, for each pixel a groove pattern is formed in the interlayer insulating film 329, and an embedded wiring line 331 in which a wiring line layer 331b is embedded with a barrier metal layer 331a interposed therebetween is formed in the groove pattern. The embedded wiring lines 331 are formed such that they connect to the transfer gates TG at necessary places. Further, though not shown, some of the embedded wiring line 331 are formed in contact with the sources/drains 23. As a result, a wiring line layer 302b including the embedded wiring lines 331 is obtained. It is to be noted that, for the formation of the embedded wiring lines 331, an embedded wiring technique hereinafter described with reference to FIG. 9B and so forth is applied.

Then, a diffusion preventing insulating film 332 is formed on the wiring line layer 302b, and a first insulating film 335 is formed on the diffusion preventing insulating film 332. For example, a CVD method in which TEOS (tetraethylorthosilicate) gas is used is applied to form the first insulating film 335 formed from a TEOS film. Thereafter, first electrodes 333 are formed on the first insulating film 335 applying an embedded wiring technique described below.

Figure 9B:
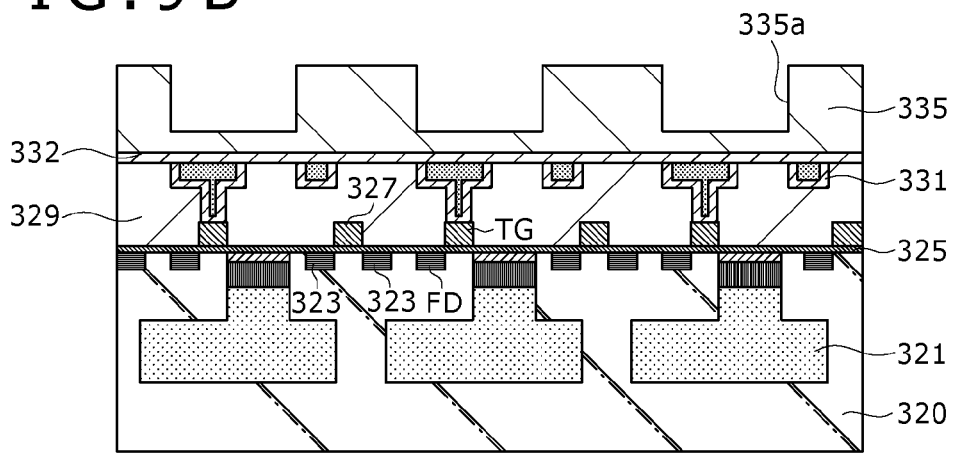

A groove pattern 335a is formed for each pixel on the first insulating film 335 as shown in FIG. 9B. Though not shown, the groove pattern 335a is formed in a shape in which it extends to the embedded wiring line 331 at a necessary place.

Figure 9C:
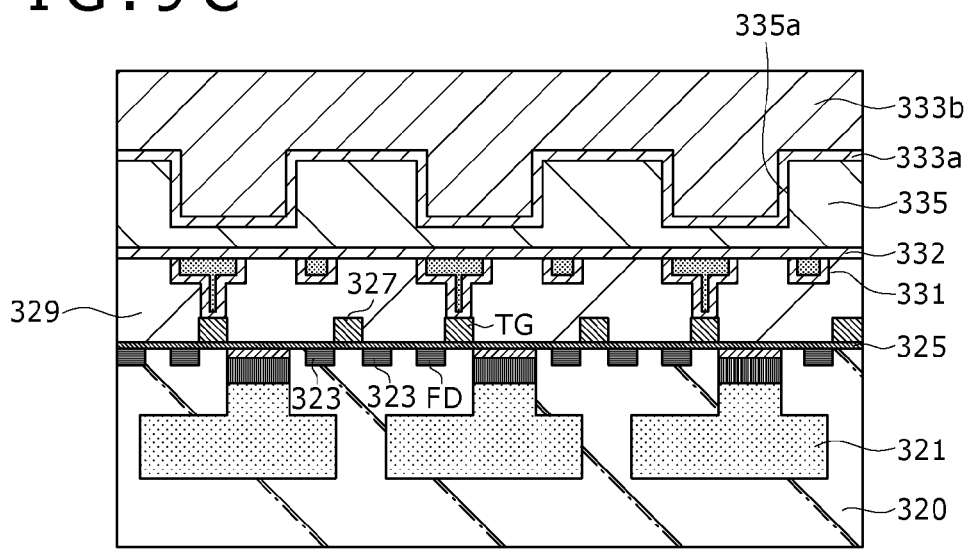

As shown in FIG. 9C, a barrier metal layer 333a is formed in a state in which it covers the inner wall of the groove pattern 335a, and a first electrode film 333b is formed on the barrier metal layer 333a in a state in which the groove pattern 335a is embedded. The barrier metal layer 333a is configured from a material having a barrier property with which the first electrode film 333b diffuses into the first insulating film 335 while the first electrode film 333b is made of copper (Cu). However, the material of the first electrode film 333b is not limited to this, but the first electrode film 333b may be configured from a conductive material.

Figure 9D:
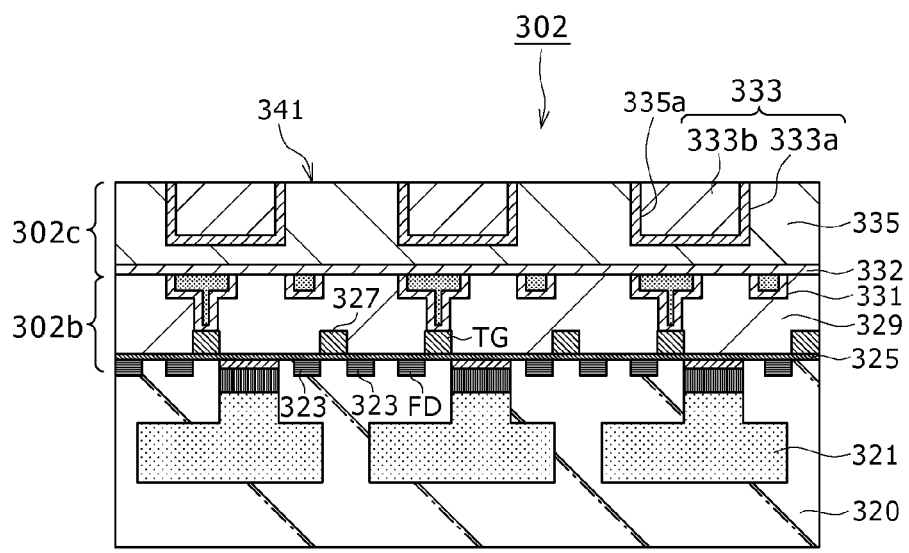

As shown in FIG. 9D, the first electrode film 333b is flattened and removed by a CMP method until the barrier metal layer 333a is exposed, and the barrier metal layer 333a is flattened and removed until the first insulating film 335 is exposed. By this, the first electrode 333 in which the first electrode film 333b is embedded with the barrier metal layer 333a interposed therebetween is formed in the groove pattern 335a. As a result, an electrode layer 302c including the first electrodes 333 is obtained.

By the steps described above, the first substrate 302 having a flat bonding face 341 to which the first electrodes 333 and the first insulating film 335 are exposed is produced as a sensor substrate. It is to be noted that, as occasion demands, pre-processing by a wet process or a plasma process is carried out for the bonding face 341.

The foregoing steps may be carried out in an ordinary step order, and the step procedure is not restricted particularly but the steps may be carried out in a suitable order. In the present technology, the following formation of an insulating thin film is a characteristic step.

[Formation Step of the Insulating Thin Film]

Figure 9E:
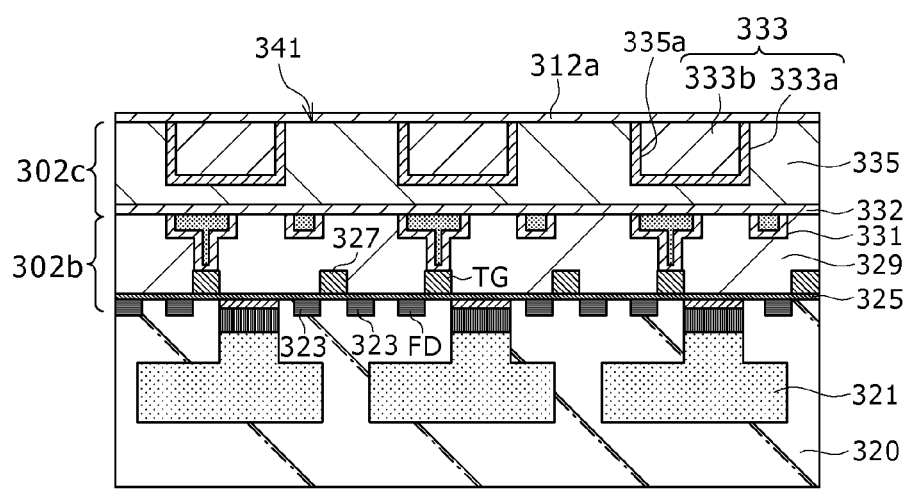

As shown in FIG. 9E, an insulating thin film 312a is formed by an atomic layer deposition method (hereinafter referred to as ALD method) in a state in which it covers the overall area of the bonding face 341 of the first substrate 302.

An outline of a procedure of the ALD method is described.

First, a first reactant and a second reactant which contain component elements of a thin film to be formed are prepared. As a film formation step, a first step at which gas containing the first reactant is supplied to a substrate so as to be absorbed by the substrate and a second step at which gas containing the second reactant is supplied so as to be absorbed by the substrate are carried out. Further, between the steps, inert gas is supplied to purge unabsorbed reactant. By carrying out the film formation step by one cycle, one atomic layer is accumulated, and by repeating the film formation cycle, a film of a desired thickness is obtained. It is to be noted that any one of the first and second steps may be carried out first.

Such a film formation method as described above is the ALD method and has such characteristics as described below.

The ALD method is a method of repeating a cycle of the film formation step to form a film. By adjustment of the number of cycles, formation of a film whose film thickness is controlled with a high degree of accuracy in a unit of an atomic layer can be carried out. If such an ALD method as just described is applied to formation of the insulating thin film 312a, then even if the insulating thin film 312a is very thin, it can be formed with high film thickness controllability.

Further, the ALD method is a method by which a film can be formed by a low temperature process at a temperature lower than approximately 500° C. Since the electrode layer 302c is formed already upon formation of the insulating thin film 312a, the heat resisting property of a metal which configures the electrode layer 302c is taken into consideration, and for the formation of the insulating thin film 312a, a low temperature process is demanded. Therefore, if such an ALD method is applied to formation of the insulating thin film 312a, then the insulating thin film 312a can be formed without deterioration of the electrode layer 302c by the low temperature process.

The ALD method is a method of depositing one by one atomic layer to form a film as described hereinabove. If such an ALD method is applied to formation of the insulating thin film 312a, then the overall area of the bonding face 341 can be covered with the flat and uniform insulating thin film 312 without deteriorating the flatness of the substrate surface flattened very much by CMP.

In the following, film formation conditions by the ALD method of the insulating thin film 312a formed from an oxide film or a nitride film is described particularly as an example.

In the case where the insulating thin film 312a is formed from an oxide film such as a film of SiO2 or HfO2, a Si containing reactant or a Hf containing reactant is used as the first reactant while an O containing reactant is used as the second reactant in the ALD method described above. Steps at which the reactants are supplied for an absorption reaction are carried out alternately to form an insulating thin film 312a formed from an oxide film of SiO2 or HfO2 on the bonding face 341. Here, as the Si containing reactant, a substance which can be supplied in the form of gas such as silane (SiH4) or dichlorosilane (H2SiCl2) is used. As the Hf containing reactant, tetrakis dimethyl amino hafnium (Hf[N(CH3)2]4) or the like is used. As the O containing reactant, water vapor gas, ozone gas or the like is used.

On the other hand, in the case where the insulating thin film 312a is formed from a nitride film (SiN) or the like, a Si containing reactant is used as the first reactant while a N containing reactant is used as the second reactant in the ALD method described hereinabove. By alternately repeating steps at which such reactants are supplied for an absorption reaction, an insulating thin film 312a formed from a nitride film (SiN) is formed on the bonding face 341. Here, as the N containing reactant, for example, nitrogen gas, ammonia gas or the like is used. As the O containing reactant, water vapor gas, ozone gas or the like is used.

By the foregoing process, a very thin and uniform insulating thin film 312a is formed on the first substrate 302 in such a state as to cover the overall area of the bonding face 341.

<<3. Production Procedure of the Second Substrate (Circuit Substrate) in Fabrication of the Semiconductor Device of the Second Embodiment>>

Figure 10A:
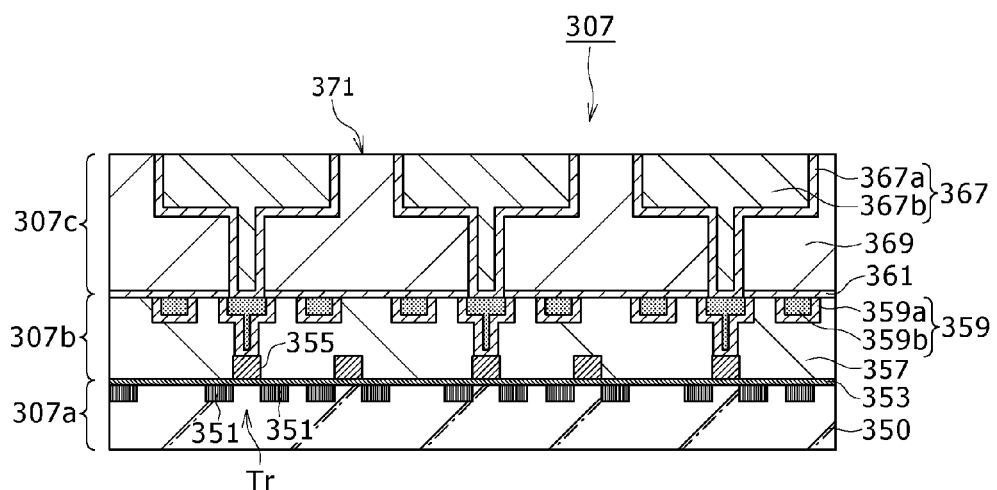
FIGS. 10A and 10B are schematic sectional views illustrating a production procedure of a second substrate or circuit substrate in fabrication of the semiconductor device according to the second embodiment.
Figure 10B:
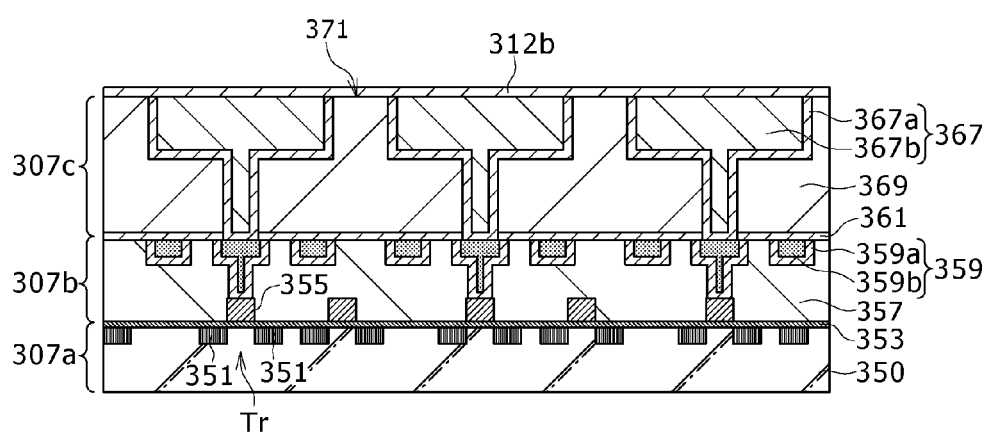

FIGS. 10A and 10B illustrate a production procedure of a second substrate 307 used for fabrication of the semiconductor device of the second embodiment described hereinabove. In the following, a production procedure of the second substrate or circuit substrate 307 used in the second embodiment is described with reference to FIGS. 10A and 10B.

As shown in FIG. 10A, a semiconductor substrate 350 made of, for example, single crystal silicon is prepared. On a surface layer of the semiconductor substrate 350, a source/drain 351 of individual conductive types and other impurity layers not shown are formed for each pixel. A semiconductor layer 307a is obtained thereby.

Then, a gate insulating film 353 is formed on the semiconductor layer 307a, and a gate electrode 355 is formed on the gate insulating film 353. The gate electrode 355 is formed between the source/drain 351. Further, at the same step, the other electrodes not shown are formed.

Then, an interlayer insulating film 357 made of, for example, silicon oxide is formed on the gate insulating film 353 in such a state as to cover the gate electrode 355. An embedded wiring line 359 in which a wiring line layer 359b is embedded with a barrier metal layer 359a interposed therebetween is formed in the groove pattern of the interlayer insulating film 357 to obtain a wiring line layer 307b which includes the embedded wiring line 359. The formation of the embedded wiring line 359 here is carried out applying the embedded wiring technique similarly to the formation of the first electrodes 333 described hereinabove.

Thereafter, a second insulating film 369 formed, for example, from a TEOS film is deposited to form a film on the wiring line layer 307b with a diffusion preventing insulating layer 361 interposed therebetween. Consequently, a second electrode 367 in which a second electrode film 367b is embedded with a barrier metal layer 367a interposed therebetween is formed in each groove pattern of the second insulating film 369 thereby to obtain an electrode layer 307c which includes the second electrode 367. The formation of the second electrode 367 here is carried out similarly to the formation of the first electrodes 333 described hereinabove.

By the steps described above, a second substrate 307 having a flat bonding face 371 to which the second electrode 367 and the second insulating film 369 are exposed is produced as a circuit substrate.

The steps described above may be carried out in an ordinary step procedure, and the step procedure is not limited to a special step procedure and the steps can be carried out in a suitable procedure. In the present technology, formation of an insulating thin film and bonding of substrates described below are characteristic steps.

As shown in FIG. 10B, an insulating thin film 312b is formed by an ALD method on the bonding face 371 similarly as in the formation of the insulating thin film 312a on the first substrate 302 side.

Consequently, the very thin and uniform insulating thin film 312b is formed on the second substrate 307 in such a state as to cover the overall area of the bonding face 371. It is to be noted that the insulating thin film 312b may be a film same as or different from the insulating thin film 312a on the first substrate 302 side. <<4. Bonding Procedure of the Substrates in Fabrication of the Semiconductor Device of the Second Embodiment>>

A bonding procedure of the first substrate 302 wherein the insulating thin film 312a is formed on the bonding face 341 and the second substrate 307 wherein the insulating thin film 312b is formed on the bonding face 371 is described with reference to FIGS. 11A and 11B.

Figure 11A:
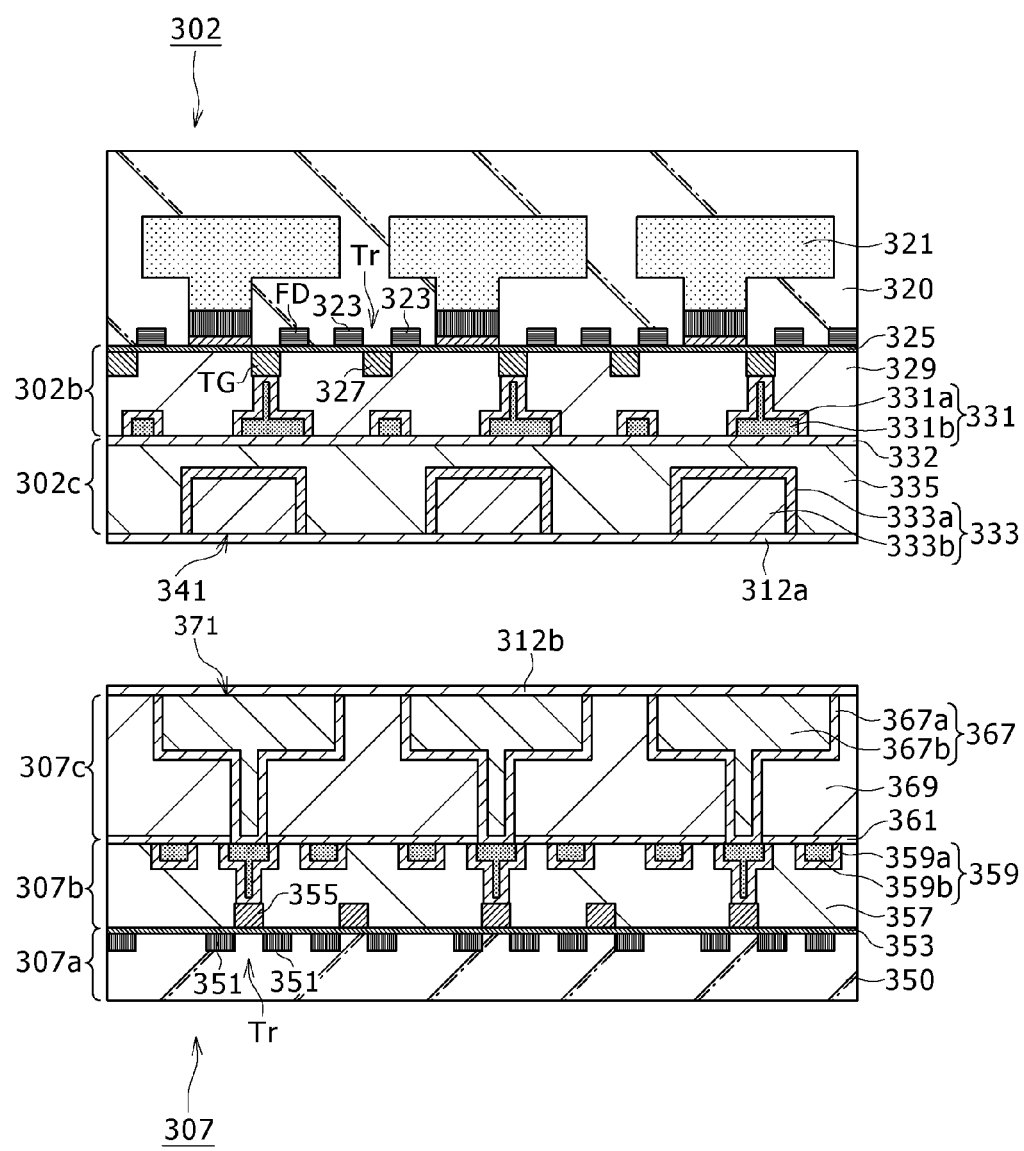
FIGS. 11A and 11B are schematic sectional views illustrating different steps of bonding in fabrication of the semiconductor device according to the second embodiment.

The bonding face 341 of the first substrate 302 and the bonding face 371 of the second substrate 307 are disposed in an opposing relationship to each other with an insulating thin film interposed therebetween as shown in FIG. 11A, and then are positioned such that the first electrodes 333 of the first substrate 302 and the second electrodes 367 of the second substrate 307 correspond to each other. While the example shown illustrates a state in which the first electrodes 333 and the second electrodes 367 correspond in a 1:1 corresponding relationship to each other, the corresponding relationship is not limited to this.

Figure 11B:
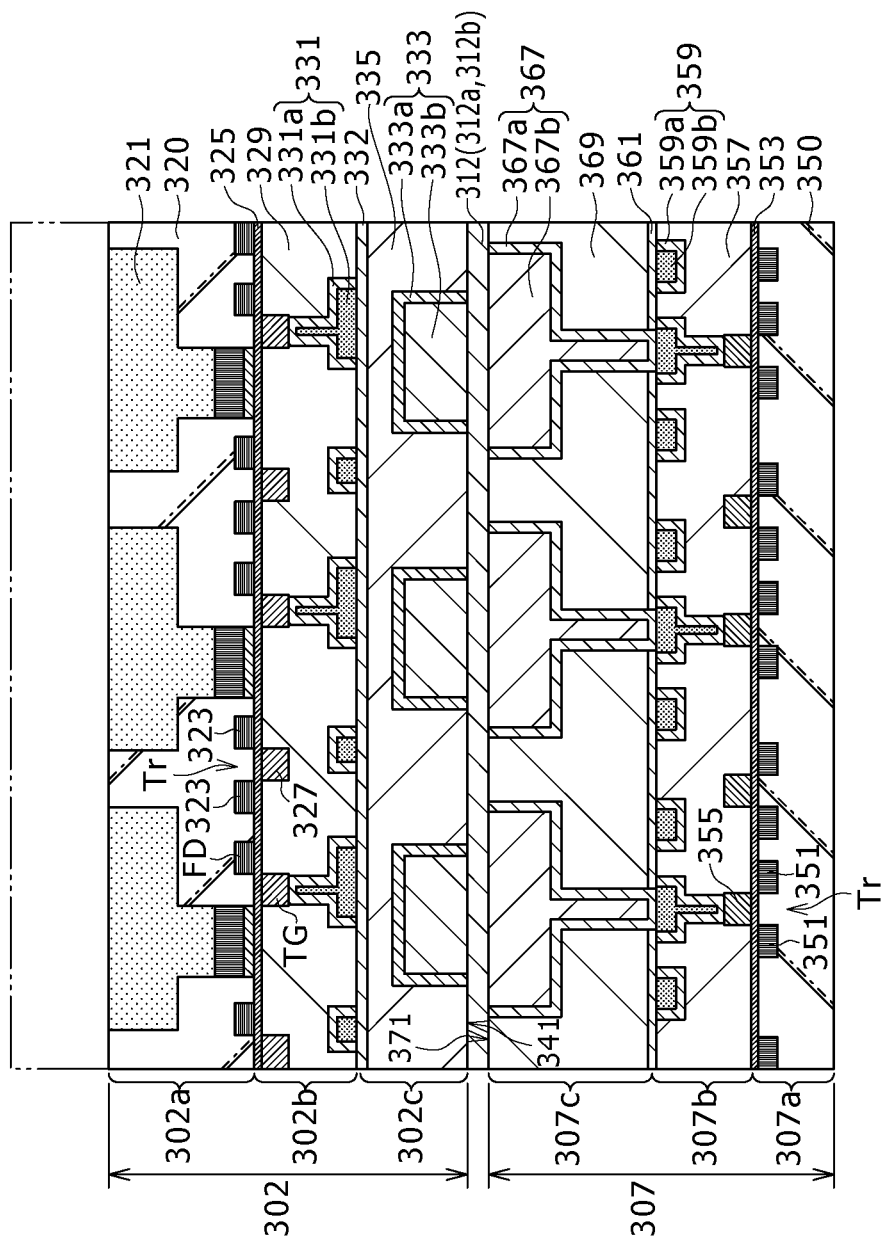

As shown in FIG. 11B, the first substrate 302 and the second substrate 307 are subjected to heat treatment in a state in which the insulating thin film 312a of the first substrate 302 and the insulating thin film 312b on the second substrate 307 are opposed to each other to join the insulating thin film 312a and the insulating thin film 312b to each other. Such heat treatment is carried out at a temperature and for a period of time sufficient to allow the insulating thin films 312 to be joined together sufficiently within a range within which no influence is had on the elements or the wiring lines formed on the first substrate 302 and the second substrate 307.

For example, in the case where the first electrodes 333 and the second electrodes 367 are configured using materials which contain copper (Cu) as a principal component, heat treatment is carried out at 200 to 600° C. for approximately one to five hours. Such heat treatment may be carried out under a pressurized atmosphere or may be carried out in a state in which the first substrate 302 and the second substrate 307 are pressed to each other from the opposite face sides thereof. As an example, heat treatment at 400° C. for four hours is carried out to carry out connection between the first electrodes 333 and the second electrodes 367 with the insulating thin films 312 interposed therebetween. Consequently, the insulating thin film 312a and the insulating thin film 312b are joined together while the first substrate 302 and the second substrate 307 are bonded to each other.

Here, in the case where the insulating thin films 312a and 312b are formed on the bonding faces 341 and 371 of both of the first substrate 302 and the second substrate 307 as described above, the insulating thin films 312a and 312b may be configured from a same material or from materials different from each other.

It is to be noted that, in the fabrication method of the semiconductor device of the present embodiment, an insulating thin film may be formed only on the bonding face of one of the first substrate 302 and the second substrate 307. For example, the insulating thin film 312a may be formed only on the bonding face 341 of the first substrate 302 such that the first substrate 302 and the second substrate 307 are bonded to each other by joining between the insulating thin film 312a of the first substrate 302 side and the bonding face 371 of the second substrate 307 side.

After the first substrate 302 and the second substrate 307 are bonded to each other as described above, the semiconductor substrate 320 of the first substrate 302 side is thinned into the semiconductor layer 302a to expose the photoelectric conversion portion 321. Further, as occasion demands, the semiconductor substrate 350 may be thinned on the semiconductor layer 307a of the second substrate 307 side.

Thereafter, a protective film 315 is formed on the exposed face of the photoelectric conversion portion 321 of the first substrate 302, and a color filter layer 317 and on-chip lenses 319 are formed on the protective film 315 to complete a semiconductor device 1 or a solid-state image pickup device.

[Effect by the Fabrication Method of the Semiconductor Device of the Second Embodiment]

In such a fabrication method of the semiconductor device of the present embodiment as described above, the insulating thin films 312a and 312b are formed on the first substrate 302 and the second substrate 307 and the first substrate 302 and the second substrate 307 are bonded to each other by joining the faces of the first substrate 302 and the second substrate 307 on which the insulating thin films 312a and 312b are formed, respectively. Therefore, in comparison with an alternative case in which the bonding faces 341 and 371 flattened by the CMP are joined directly to each other, the semiconductor device 1 in the present embodiment wherein the first substrate 302 and the second substrate 307 are bonded to each other by the joining of the faces thereof on which the insulating thin films 312a and 312b are formed, respectively, is superior in joining property. It is to be noted that, also in the case where the insulating thin film 312a is formed only on the bonding face 341 of the first substrate 302, the insulating thin film 312a of the first substrate 302 side and the bonding face 371 of the second substrate 307 side are joined together, and the joining property of the substrates is better than that in the alternative case in which the bonding faces 341 and 371 are joined directly to each other.

For example, there is the possibility that the first insulating film 335 and the second insulating film 369 which configure the bonding faces 341 and 371 flattened by the CMP may contain water at the CMP step. Further, if the first insulating film 335 and the second insulating film 369 which configure the bonding faces 341 and 371 are formed from a TEOS film, then the first insulating film 335 and the second insulating film 369 are formed as films originally having a high moisture content due to the formation conditions of the TEOS film. Accordingly, in the case where the bonding faces 341 and 371 containing water in this manner are to be joined directly to each other, in heat treatment after the bonding, outgoing gas is concentrated on the joining interface to form voids. However, in the present embodiment, since the insulating thin films 312a and 312b cover over the overall area of the bonding faces 341 and 371, it is possible to prevent outgoing gas from being concentrated on the joining interface thereby to suppress generation of voids.

Especially, in the case where the insulating thin film 312a on the bonding face 341 of the first substrate 302 and the insulating thin film 312b on the bonding face 371 of the second substrate 307 are configured from films of the same material, since the same material films are joined to each other, firmer joining can be achieved. Consequently, a semiconductor device which is enhanced in joining strength of the substrates and hence in reliability can be obtained.

Further, by using the ALD method to form the insulating thin films 312a and 312b, also the following advantages can be achieved.

First, since the ALD method is a method which is good in film thickness controllability by film formation in a unit of an atomic layer. Consequently, even with a structure wherein the first electrodes 333 of the first substrate 302 side and the second electrode 367 of the second substrate 307 are disposed in an opposing relationship to each other with the insulating thin film 312 interposed therebetween, since the insulating thin film 312 is a very thin film, electric connection between the first electrodes 333 and the second electrodes 367 is permitted.

Further, since the ALD method is a method which is good in film thickness uniformity due to film formation in a unit of an atomic layer, the uniform insulating thin films 312a and 312b are formed on the first substrate 302 and the second substrate 307, respectively, maintaining the flatness of the bonding faces 341 and 371 flattened by CMP. Since joining between the flattened joining faces of the insulating thin films 312a and 312b formed is achieved, the resulting joining is superior in close contactness, and joining of the substrates which is improved in joining strength can be anticipated.

Further, since the ALD method uses a low temperature process to form a film, the insulating thin films 312a and 312b can be formed on the electrode layer 302c of the first substrate 302 side and the electrode layer 307c of the second substrate 307 side without suffering from deterioration of the metals of the electrode layer 302c of the first substrate 302 side and the electrode layer 307c of the second substrate 307 by high heat.

Finally, since the ALD method is a film formation method in a unit of an atomic layer, the insulating thin films 312a and 312b formed are fine films and have a very low moisture content. Therefore, since the formed joining faces of the insulating thin films 312a and 312b having a low moisture content are joined together, there is no possibility that voids may appear on the joining face.

Consequently, a semiconductor device wherein the joining strength of the substrates increases to achieve enhancement of the reliability.

Third Embodiment

<<1. First Working Example>>

[Problems of a Cu—Cu Joining Technology in Related Art]

Figure 12A:
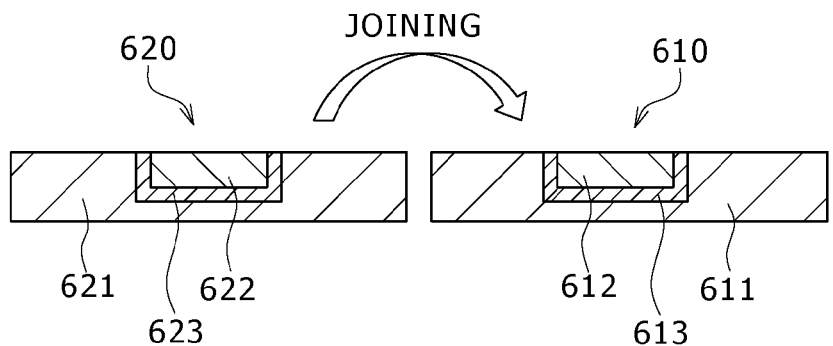
FIGS. 12A and 12B are schematic sectional views illustrating a problem which occurs upon Cu—Cu joining.
Figure 12B:
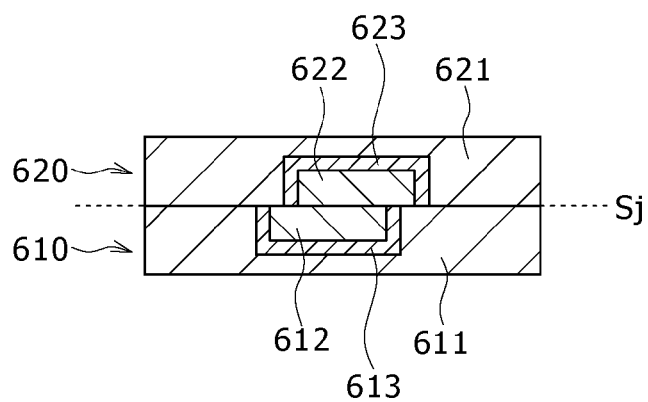

Before a semiconductor device according to a first working example of a third embodiment of the present disclosure is described, problems which may possibly occur with a Cu—Cu joining technique in related art are described with reference to FIGS. 12A, 12B and 13. FIG. 12A shows a general configuration of semiconductor members before two semiconductor members are joined together, and FIG. 12B shows a general cross section of the two semiconductor members after joined in the proximity of a joining interface. Further, FIG. 13 illustrates problems which may occur in the case where joining misalignment occurs upon bonding of the two semiconductor members.

Figure 13:
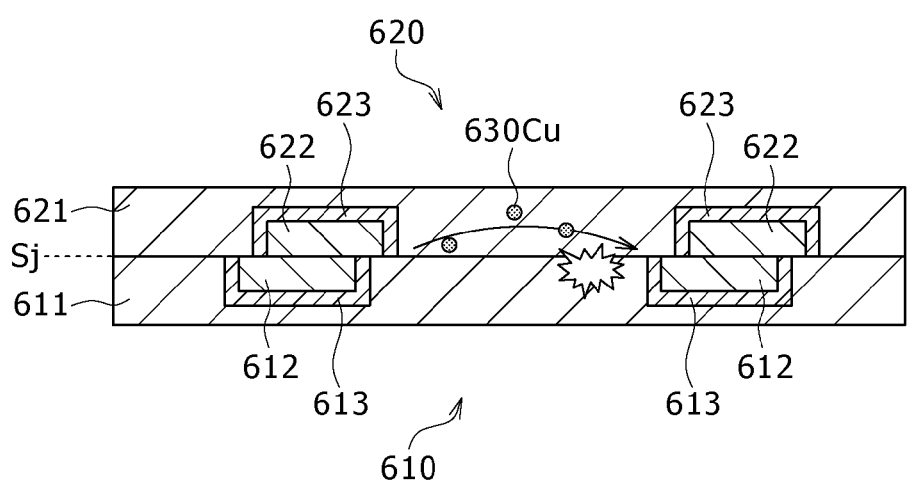
FIG. 13 is a schematic sectional view illustrating another problem which occurs upon Cu—Cu joining.

In FIGS. 12A, 12B and 13, an example is shown wherein a first semiconductor member 610 including a first SiO2 layer 611, a first Cu electrode 612 and a first Cu barrier layer 613 and a second semiconductor member 620 including a second SiO2 layer 621, a second Cu electrode 622 and a second Cu barrier layer 623 are joined together.

It is to be noted that, in the example shown in FIGS. 12A and 12B, the Cu electrodes are formed in an embedded manner on one surface of the SiO2 layer of the semiconductor members. In particular, the Cu electrodes are formed such that they are exposed to the one surface of the SiO2 layer and the exposed face is substantially in flush with the one surface of the SiO2 layer. Further, each Cu barrier layer is provided between a Cu electrode and a SiO2 layer. Further, the surface of the first semiconductor member 610 on the first Cu electrode 612 side and the surface of the second semiconductor member 620 on the second Cu electrode 622 side are bonded to each other.

When the first semiconductor member 610 and the second semiconductor member 620 are bonded to each other, if joining misalignment occurs between them, then a contact region between a Cu electrode of one of the semiconductor members and a SiO2 layer of the other semiconductor member is generated on a joining interface Sj as seen in FIG. 12B.

In this instance, there is the possibility that, by an annealing process or the like upon joining, Cu 630 may diffuse from the Cu electrodes into the SiO2 layers until the adjacent Cu electrodes are short-circuited on the joining interface Sj as seen in FIG. 13. Further, if the diffusion amount of the Cu 630 from the Cu electrodes into the SiO2 layers is great, then since the amount of Cu in the Cu electrodes decreases, for example, such a failure as an increase of the contact resistance or a failure in conduction occurs may occur.

If such a failure in electric characteristic on the joining interface Sj as described above occurs, then the performance of the semiconductor device is deteriorated. Therefore, in the present working example, the configuration of a semiconductor device which can eliminate such failures in electric characteristic on the joining interface Sj as described above is described.

[Configuration of the Semiconductor Device]

Figure 14:
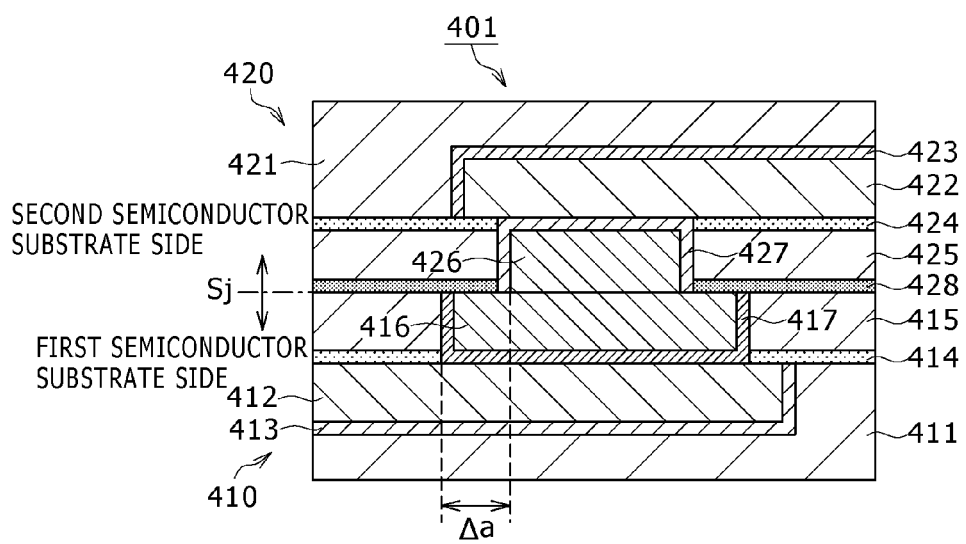
FIG. 14 is a schematic sectional view in the proximity of a joining interface of a semiconductor device according to a first working example of a third embodiment of the disclosed technology.
Figure 15:
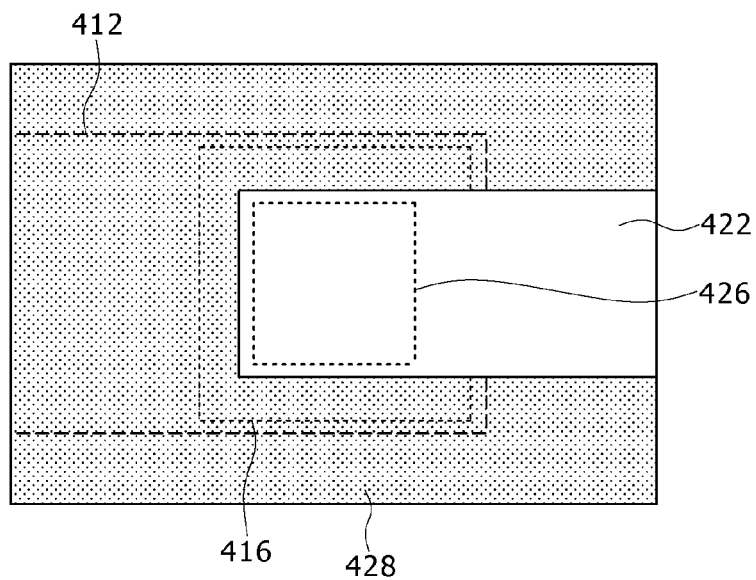
FIG. 15 is a schematic top plan view in the proximity of a joining interface of the semiconductor device of FIG. 14.

FIGS. 14 and 15 show a general configuration of the semiconductor device according to the first working example. In particular, FIG. 14 shows a general cross section of the semiconductor device of the first working example in the proximity of a joining interface, and FIG. 15 shows a schematic top plan in the proximity of the joining interface and illustrates an arrangement relationship between Cu joining portions and an interface Cu barrier film hereinafter described. It is to be noted that, in FIGS. 14 and 15, in order to simplify description, a configuration of only one joining interface is shown.

Referring first to FIG. 14, a semiconductor device 401 shown includes a first semiconductor member 410 which is a first semiconductor section and a second semiconductor member 420 which is a second semiconductor section. Further, in the semiconductor device 401 of the present working example, the first semiconductor member 410 is joined at a face thereof on a first interlayer insulating film 415 side to a face of the second semiconductor member 420 on an interface Cu barrier film 428 side hereinafter described.

The first semiconductor member 410 includes a first semiconductor substrate not shown, a first SiO2 layer 411, a first Cu wiring line portion 412, a first Cu barrier film 413, a first Cu diffusion preventing film 414, the first interlayer insulating film 415, a first Cu joining portion 416 and a first Cu barrier layer 417.

The first SiO2 layer 411 is formed on the first semiconductor substrate. The first Cu wiring line portion 412 is formed in an embedded state on the surface of the first SiO2 layer 411 on the opposite side to the first semiconductor substrate side. It is to be noted that the first Cu wiring line portion 412 is a Cu film extending in a predetermined direction as seen in FIG. 15 and is connected to a predetermined device, a signal processing circuit or the like in the semiconductor device 401 not shown or in an electronic apparatus including the semiconductor device 401.

The first Cu barrier film 413 is formed between the first SiO2 layer 411 and the first Cu wiring line portion 412. It is to be noted that the first Cu barrier film 413 is a thin film for preventing diffusion of Cu (copper) from the first Cu wiring line portion 412 into the first SiO2 layer 411 and is formed, for example, from Ti, Ta, Ru or a nitride (TiN, TaN, RuN) of any of them.

The first Cu diffusion preventing film 414 is formed in a region of the first SiO2 layer 411 and the first Cu wiring line portion 412 other than a formation region of the first Cu barrier layer 417. It is to be noted that the first Cu diffusion preventing film 414 is a thin film for preventing diffusion of Cu from the first Cu wiring line portion 412 into the first interlayer insulating film 415 and is configured from a thin film of, for example, SiC, SiN or SiCN.

The first interlayer insulating film 415 is formed on the first Cu diffusion preventing film 414 and configured from an oxide film such as a SiO2 film.

The first Cu joining portion 416 which is a first metal film is provided in an embedded manner on the surface of the first interlayer insulating film 415 on the opposite side to the first Cu diffusion preventing film 414 side. It is to be noted that, in the present working example, the first Cu joining portion 416 is configured from a Cu film having a surface (film face) of a square shape as shown in FIG. 15. However, the present disclosure is not limited to this, but the surface shape of the first Cu joining portion 416 can be changed suitably taking various conditions such as a required contact resistance and a design rule into consideration.

The first Cu barrier layer 417 is provided between the first Cu joining portion 416 and the first Cu wiring line portion 412, first Cu diffusion preventing film 414 and first interlayer insulating film 415 in such a manner as to cover the first Cu joining portion 416. Consequently, the first Cu joining portion 416 is electrically connected to the first Cu wiring line portion 412 through the first Cu barrier layer 417. It is to be noted that the first Cu barrier layer 417 is a thin film for preventing diffusion of Cu from the first Cu joining portion 416 into the first interlayer insulating film 415 and is formed, for example, from Ti, Ta, Ru or a nitride of any of them.

The second semiconductor member 420 includes a second semiconductor substrate not shown, a second SiO2 layer 421, a second Cu wiring line portion 422, a second Cu barrier film 423, a second Cu diffusion preventing film 424, a second interlayer insulating film 425, a second Cu joining portion 426, a second Cu barrier layer 427 and the interface Cu barrier film 428.

It is to be noted that the second semiconductor substrate, second SiO2 layer 421 and second Cu wiring line portion 422 of the second semiconductor member 420 have a configuration similar to that of the first semiconductor substrate, first SiO2 layer 411 and first Cu wiring line portion 412 of the first semiconductor member 410. Further, the second Cu barrier film 423, second Cu diffusion preventing film 424 and second interlayer insulating film 425 of the second semiconductor member 420 have a configuration similar to that of the first Cu barrier film 413, first Cu diffusion preventing film 414 and first interlayer insulating film 415 of the first semiconductor member 410.

The second Cu joining portion 426 which is a second metal film is provided in an embedded manner on the surface of the second interlayer insulating film 425 in the form of an insulating film on the opposite side to the second Cu diffusion preventing film 424 side. It is to be noted that, in the present working example, the second Cu joining portion 426 is configured form a Cu film having a surface of a square shape as shown in FIG. 15. However, the present disclosure is not limited to this, but the surface shape of the second Cu joining portion 426 can be changed suitably taking various conditions such as a required contact resistance and a design rule into consideration.

Further, in the present working example, the surface area of the second Cu joining portion 426 on the joining side, that is, on the joining interface Sj side, or the dimension of the joining side surface, is made smaller than that of the first Cu joining portion 416 as shown in FIGS. 14 and 15. Thereupon, the size of the second Cu joining portion 426 is set such that, even if maximum joining misalignment which is estimated between the first semiconductor member 410 and the second semiconductor member 420 occurs, the second Cu joining portion 426 and the first interlayer insulating film 415 do not contact with each other on the joining interface Sj. More particularly, the size of the second Cu joining portion 426 is set such that, for example, if the minimum distance between a side face of the second Cu joining portion 426 and a side face of the first Cu barrier layer 417 is represented by Δa as seen in FIG. 14, then Δa is a dimension greater than the estimated maximum joining misalignment.

The second Cu barrier layer 427 is provided between the second Cu joining portion 426 and the second Cu wiring line portion 422, second Cu diffusion preventing film 424 and second interlayer insulating film 425 in such a manner as to cover the second Cu joining portion 426. Consequently, the second Cu joining portion 426 is electrically connected to the second Cu wiring line portion 422 through the second Cu barrier layer 427. It is to be noted that the second Cu barrier layer 427 is a thin film for preventing diffusion of Cu from the second Cu joining portion 426 into the second interlayer insulating film 425 similarly to the first Cu barrier layer 417 and is formed from, for example, Ti, Ta, Ru or any of nitrides of them.

The interface Cu barrier film 428, that is, an interface barrier film or an interface barrier section, is formed on the second interlayer insulating film 425. In this instance, the interface Cu barrier film 428 is formed such that the surface of the interface Cu barrier film 428 and the surface of the second Cu joining portion 426 on the joining side may be substantially in flush with each other. In other words, the interface Cu barrier film 428 is provided in a region including a face region which does not join to the second Cu joining portion 426 from within the face region of the first Cu joining portion 416 on the joining interface Sj side. By providing the interface Cu barrier film 428 in such a region or position as just described, diffusion of Cu from the Cu joining portion into the interlayer insulating film in the form of a SiO2 film through the opposing region of the joining interface Sj to the first Cu joining portion 416 and the second interlayer insulating film 425 can be prevented.

It is to be noted that the interface Cu barrier film 428 can be formed using such a material as, for example, SiN, SiON, SiCN or organic resin. However, from the point of view of enhancement in close contactness with a Cu film, it is preferable to particularly form the interface Cu barrier film 428 from SiN.

[Fabrication Technique of the Semiconductor Device]

Now, a fabrication technique of the semiconductor device 401 of the present working example is described with reference to FIGS. 16A to 16M. It is to be noted that FIGS. 16A to 16L show schematic cross sections in the proximity of the Cu joining portion of a semiconductor member produced at different steps and FIG. 16M illustrates a manner of a joining process of the first semiconductor member 410 and the second semiconductor member 420.

First, a production technique of the first semiconductor member 410 is described with reference to FIGS. 16A to 16F. In the present working example, though not shown, a first Cu barrier film 413 and a first Cu wiring line portion 412 are formed in this order in a predetermined region of one of the surfaces of the first SiO2 layer 411 which is a ground insulating layer. Thereupon, the first Cu wiring line portion 412 is formed in such a manner that it is embedded in one of the surfaces of the first SiO2 layer 411, that is, it is exposed to the surface of the first SiO2 layer 411.

Figure 16A:
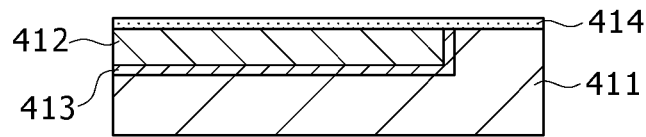
FIGS. 16A to 16M are schematic sectional views illustrating different steps of a production procedure of the semiconductor device of FIG. 15.

Then, as shown in FIG. 16A, a first Cu diffusion preventing film 414 is formed on the surface on the first Cu wiring line portion 412 side of the semiconductor member configured from the first SiO2 layer 411, first Cu wiring line portion 412 and first Cu barrier film 413. It is to be noted that the first SiO2 layer 411, first Cu wiring line portion 412, first Cu barrier film 413 and first Cu diffusion preventing film 414 can be formed by a method similar to such a fabrication method of a semiconductor device such as a solid-state image pickup device in related art as disclosed, for example, in Japanese Patent Laid-Open No. 2004-63859.

Then, a first interlayer insulating film 415 is formed on the first Cu diffusion preventing film 414. In particular, a SiO2 film or a carbon-containing silicon oxide (SiOC) film of a thickness of approximately 50 to 500 nm is formed on the first Cu diffusion preventing film 414 to form a first interlayer insulating film 415. It is to be noted that such a first interlayer insulating film 415 as just described can be formed, for example, by a CVD (Chemical Vapor Deposition) method or a spin coating method.

Figure 16B:
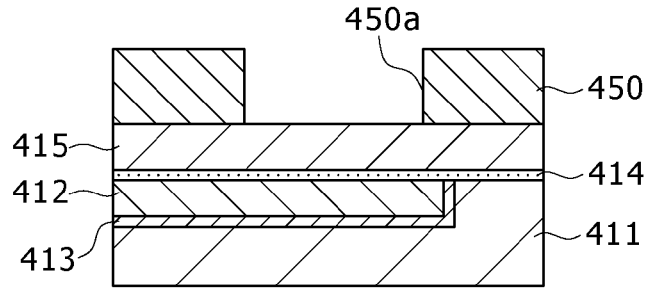

Thereafter, a resist film 450 is formed on the first interlayer insulating film 415 as shown in FIG. 16B. Then, a photolithography technique is used to carry out a patterning process for the resist film 450 to remove the resist film 450 in a formation region of a first Cu joining portion 416 to form an opening 450a.

Figure 16C:
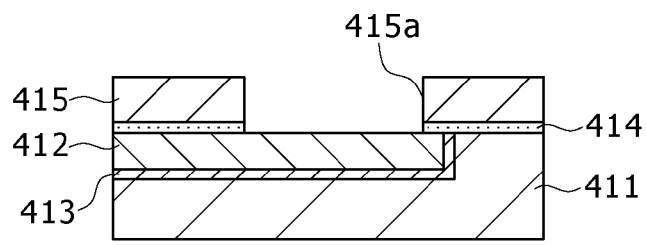

Then, for example, a known etching apparatus of the magnetron type is used to carry out a dry etching process for the surface of the semiconductor member, on which the resist film 450 is formed, on the opening 450a side. Consequently, the region of the first interlayer insulating film 415 exposed to the opening 450a of the resist film 450 is etched. By this etching process, the first interlayer insulating film 415 and the first Cu diffusion preventing film 414 in the region of the opening 450a of the resist film 450 are removed to expose the first Cu wiring line portion 412 to an opening 415a of the first interlayer insulating film 415 as shown in FIG. 16C. It is to be noted that, in the present working example, the opening diameter of the opening 415a of the first interlayer insulating film 415 is, for example, approximately 4 to 100 µm.

Thereafter, for example, an asking process in which oxygen (O2) plasma is used and a washing process in which solution of organic amine-based drug is used are carried out for the face for which the etching process has been carried out. By the processes, the resist film 450 remaining on the first interlayer insulating film 415 and the residual deposits generated in the etching process are removed.

Figure 16D:
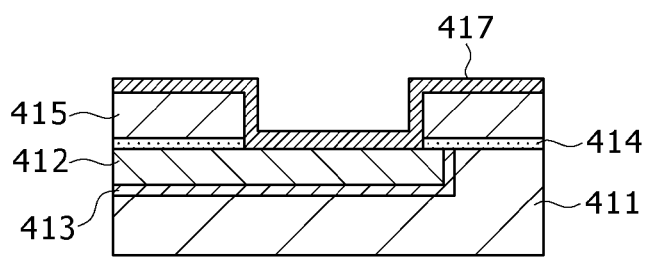

Then as seen in FIG. 16D, a first Cu barrier layer 417 made of Ti, Ta, Ru or any of nitrides of them is formed on the first interlayer insulating film 415 and the first Cu wiring line portion 412 exposed to the opening 415a of the first interlayer insulating film 415. In particular, such a technique as, for example, an RF (Radio Frequency) sputtering method is used to form the first Cu barrier layer 417 of a thickness of approximately 5 to 50 nm on the first interlayer insulating film 415 and the first Cu wiring line portion 412 in an Ar/N2 atmosphere.

Figure 16E:
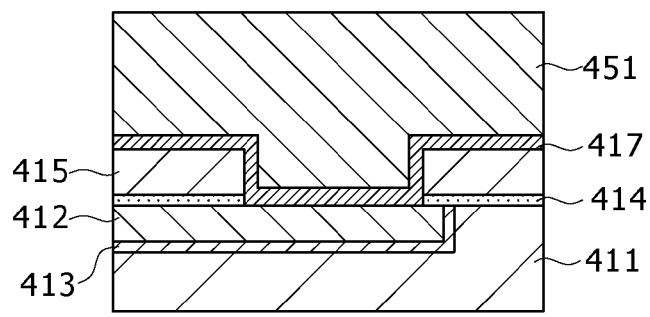

Then, as shown in FIG. 16E, a Cu film 451 is formed on the first Cu barrier layer 417 using a technique such as a sputtering method or an electrolytic plating method. By this process, the Cu film 451 is embedded in a region of the opening 415a of the first interlayer insulating film 415.

Thereafter, the semiconductor member on which the Cu film 451 is formed is heated to approximately 100 to 400° C. for approximately one to 60 minutes in a nitrogen atmosphere or in vacuum using a heating apparatus such as a hot plate or a sinter annealing apparatus. By this heating process, the Cu film 451 is stiffened to form a Cu film 451 of fine film quality.

Figure 16F:
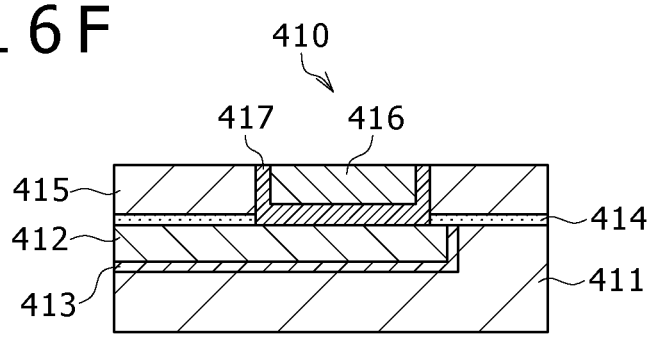

Thereafter, unnecessary part of the Cu film 451 and the first Cu barrier layer 417 is removed by a chemical mechanical polishing (CMP) method as shown in FIG. 16F. In particular, the surface of the Cu film 451 is polished by a CMP method until the first interlayer insulating film 415 is exposed to the surface.

In the present working example, the steps described hereinabove with reference to FIGS. 16A to 16F are carried out to produce a first semiconductor member 410. Now, a fabrication technique of the second semiconductor member 420 is described with reference to FIGS. 16G to 16L.

First, a second Cu barrier film 423 and a second Cu wiring line portion 422 are formed in this order in a predetermined region of one of faces of a second SiO2 layer 421 similarly as in fabrication of the first semiconductor member 410 (step of FIG. 16A). Then, a second Cu diffusion preventing film 424 is formed on the surface of the semiconductor member, which is formed from the second SiO2 layer 421, second Cu wiring line portion 422 and second Cu barrier film 423, on the second Cu wiring line portion 422 side.

Then, a second interlayer insulating film 425 is formed on the second Cu diffusion preventing film 424. In particular, for example, on the second Cu diffusion preventing film 424, a SiO2 film or a SiOC film of a thickness of approximately 50 to 500 nm is formed as a second interlayer insulating film 425. It is to be noted that such a second interlayer insulating film 425 as just described can be formed, for example, by a CVD method or a spin coating method. Then, on the second interlayer insulating film 425, an interface Cu barrier film 428 of a thickness of approximately 5 to 100 nm is formed using a technique such as a CVD method or a spin coating method. Thereafter, a SiO2 film or a SiOC film of a thickness of approximately 50 to 200 nm is formed on the interface Cu barrier film 428 using a technique such as a CVD method or a spin coating method thereby forming an insulating film 452.

Figure 16G:
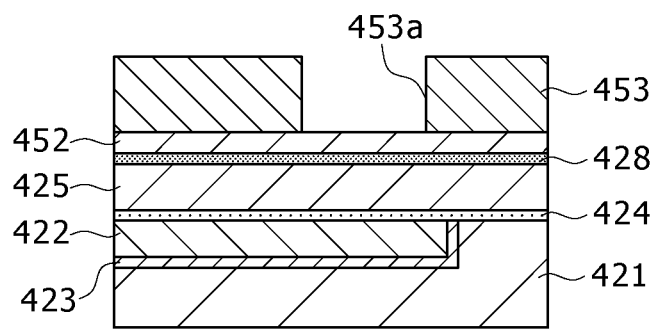

Then, a resist film 453 is formed on the insulating film 452 as shown in FIG. 16G. Then, using a photolithography technique, a patterning process is carried out for the resist film 453 to remove the resist film 153 in a formation region for the second Cu joining portion 426 to form an opening 453a. It is to be noted that the opening diameter of the opening 453a is set smaller than that of the opening 450a of the resist film 450 formed at the step described hereinabove with reference to FIG. 16B.

Figure 16H:
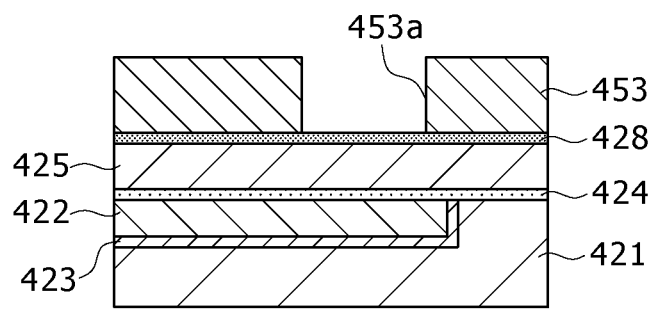

However, the production step of the semiconductor member wherein the opening 453a is formed in the resist film 453 described hereinabove is not limited to the example illustrated in FIG. 16G, and for example, the resist film 453 may be provided directly on the interface Cu barrier film 428 and have the opening 453a formed therein. FIG. 16H shows a schematic cross section of the semiconductor member when the opening 453a is formed by the technique just described.

However, if the technique illustrated in FIG. 16H is adopted, then a Cu film is directly formed on the interface Cu barrier film 428 through a second Cu barrier layer 427, and then the Cu film is polished by a CMP process to form a second Cu joining portion 426. However, since usually the interface Cu barrier film 428 is a film difficult to polish by a CMP method, where the technique illustrated in FIG. 16H is adopted, upon CMP processing, a portion of the Cu film which remains without being removed may appear on the interface Cu barrier film 428.

In contrast, in the formation method of the opening 453a illustrated in FIG. 16G, since the insulating film 452 is formed on the interface Cu barrier film 428, the portion of the Cu film which remains without being removed can be eliminated with a higher degree of certainty by polishing also the insulating film 452 upon CMP processing of the Cu film. In other words, from a point of view of prevention of appearance of an unremoved portion of the Cu film when the second Cu joining portion 426 is formed, the formation technique of the opening 453a illustrated in FIG. 16G is more preferable than the formation technique of the opening 453a illustrated in FIG. 16H.

Figure 16I:
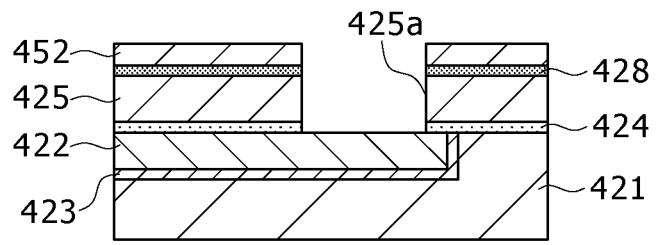

Then, a dry etching process is carried out for the surface of the semiconductor member, on which the resist film 453 is formed, on the opening 453a side using a known etching apparatus of the magnetron type. Consequently, a region of the insulating film 452 exposed to the opening 453a of the resist film 453 is etched. By this etching process, the insulating film 452, interface Cu barrier film 428, second interlayer insulating film 425 and second Cu diffusion preventing film 424 in the region of the opening 453a are removed as shown in FIG. 16I to expose the second Cu wiring line portion 422 to an opening 425a of the second interlayer insulating film 425. It is to be noted that the opening diameter of the opening 425a of the second interlayer insulating film 425 is, for example, approximately 1 to 95 μm.

Thereafter, for example, an asking process in which oxygen (O2) plasma is used and a washing process in which solution of organic amine-based drug is used are carried out for the face for which the etching has been carried out. By the processes, the resist film 453 remaining on the insulating film 452 and the residual deposits generated in the etching process are removed.

Figure 16J:
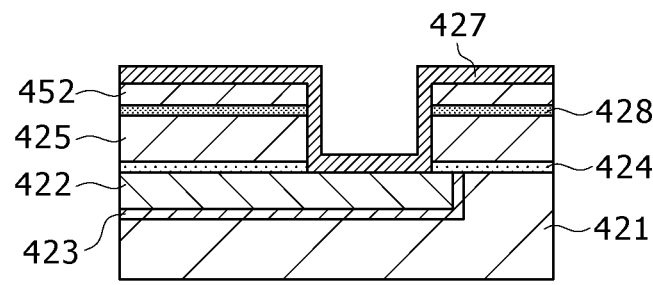

Then as seen in FIG. 16J, a second Cu barrier layer 427 made of Ti, Ta, Ru or any of nitrides of them is formed on the insulating film 452 and the second Cu wiring line portion 422 exposed to the opening 425a of the second interlayer insulating film 425. In particular, such a technique as, for example, an RF sputtering method is used to form a second Cu barrier layer 427 of a thickness of approximately 5 to 50 nm on the insulating film 452 and the second Cu wiring line portion 422 in an Ar/N2 atmosphere.

Figure 16K:
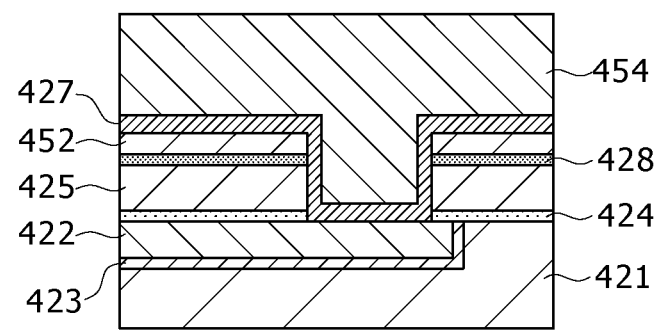

Then, as shown in FIG. 16K, a Cu film 454 is formed on the second Cu barrier layer 427 using a technique such as a sputtering method or an electrolytic plating method. By this process, the Cu film 454 is embedded in a region of the opening 425a of the second interlayer insulating film 425.

Thereafter, the semiconductor member on which the Cu film 454 is formed is heated to approximately 100 to 400° C. for approximately one to 60 minutes in a nitrogen atmosphere or in vacuum using a heating apparatus such as a hot plate or a sinter annealing apparatus. By this heating process, the Cu film 454 is stiffened to form a Cu film 454 of fine film quality.

Figure 16L:
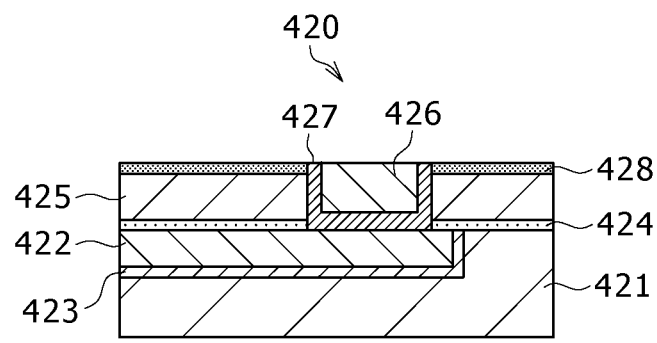
Figure 16M:
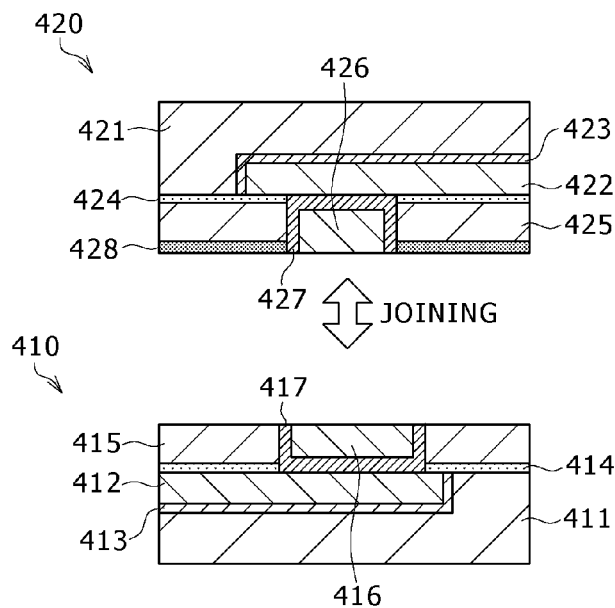

Thereafter, unnecessary part of the Cu film 454, second Cu barrier layer 427 and the insulating film 452 is removed by a chemical mechanical polishing (CMP) method as shown in FIG. 16L. In particular, the surface on the Cu film 454 side is polished by a CMP method until the interface Cu barrier film 428 is exposed to the surface. In the present working example, the various steps described hereinabove with reference to FIGS. 16G to 16L are carried out to produce the second semiconductor member 420.

Thereafter, the first semiconductor member 410 shown in FIG. 16F and the second semiconductor member 420 shown in FIG. 16L produced by the procedures described above are bonded to each other. The particular processing substance of the bonding step, that is, a joining step, is such as described below.

First, a reduction process is carried out for the surface of the first semiconductor member 410 on the first Cu joining portion 416 side and the surface of the second semiconductor member 420 on the second Cu joining portion 426 side to remove an oxide film, that is, to remove oxides, on the surface of the Cu joining portions. By such removal, clean Cu is exposed to the surface of the Cu joining portions. It is to be noted that, as the reduction process in this instance, a wet etching process in which solution of drug such as formic acid is used or a dry etching process in which plasma of, for example, Ar, NH3 or H2 is used is used.

Then, the surface of the first semiconductor member 410 on the first Cu joining portion 416 side and the surface of the second semiconductor member 420 on the second Cu joining portion 426 side are contacted with each other or bonded to each other as shown in FIG. 16M. Thereupon, the first Cu joining portion 416 and the corresponding second Cu joining portion 426 are bonded to each other after they are positioned so as to oppose to each other.

Then, in the state in which the first semiconductor member 410 and the second semiconductor member 420 are bonded to each other, a heating apparatus such as a hot plate or a RTA (Rapid Thermal Annealing) apparatus is used to anneal the bonded members to join the first Cu joining portion 416 and the second Cu joining portion 426 to each other. In particular, the bonded members are heated to approximately 100 to 400° C. for approximately five minutes to two hours, for example, in an N2 atmosphere of the atmospheric pressure or in vacuum.

Further, by this joining process, an interface Cu barrier film 428 is disposed in region, from within the face region of the first Cu joining portion 416 on the joining interface Sj side, including the face region which is not joined to the second Cu joining portion 426. More particularly, as shown in FIG. 14, an interface Cu barrier film 428 is disposed in the region including the region of the joining interface Sj in which the first Cu joining portion 416 and the second interlayer insulating film 425 are opposed to each other.

In the present working example, a Cu—Cu joining process is carried out in this manner. It is to be noted that the fabrication technique for the semiconductor device 401 other than the joining step described above may be similar to a fabrication technique for a semiconductor device such as a solid-state image pickup device (refer to, for example, Japanese Patent Laid-Open No. 2007-234725).

As described above, in the semiconductor device 401 of the present working example, the interface Cu barrier film 428 is provided in the region including the joining interface region in which the first Cu joining portion 416 of the first semiconductor member 410 and the second interlayer insulating film 425 of the second semiconductor member 420 are opposed to each other. Therefore, in the present working example, even if joining misalignment occurs upon joining of semiconductor members, a contact region between the Cu joining portion and the interlayer insulating film does not appear on the joining interface Sj, and the failure in electric characteristic on the joining interface Sj described hereinabove can be eliminated.

Further, in the present working example, the surface area of the first Cu joining portion 416 on the joining side is made sufficiently greater than that of the second Cu joining portion 426 as described hereinabove. Therefore, in the present working example, even if misalignment occurs upon joining of the first semiconductor member 410 and the second semiconductor member 420 to each other, the contact area and hence the contact resistance between the Cu joining portions do not vary, and deterioration of the electric characteristic or performance of the semiconductor device 401 can be suppressed. In particular, since, in the present working example, increase of the contact resistance of the joining interface Sj can be suppressed, increase of the power consumption of the semiconductor device 401 and drop of the processing speed can be suppressed.

Further, in the present working example, since the interface Cu barrier film 428 is provided between the first Cu joining portion 416 and the second interlayer insulating film 425, the close contacting force between them can be enhanced. Consequently, in the present working example, the joining strength between the first semiconductor member 410 and the second semiconductor member 420 can be increased.

From the foregoing, according to the present working example, the semiconductor device 401 can be provided wherein degradation of an electric characteristic on the joining interface can be suppressed further and which has a joining interface Sj of a higher degree of reliability.

<<2. Second Working Example>>

[Configuration of the Semiconductor Device]

Figure 17:
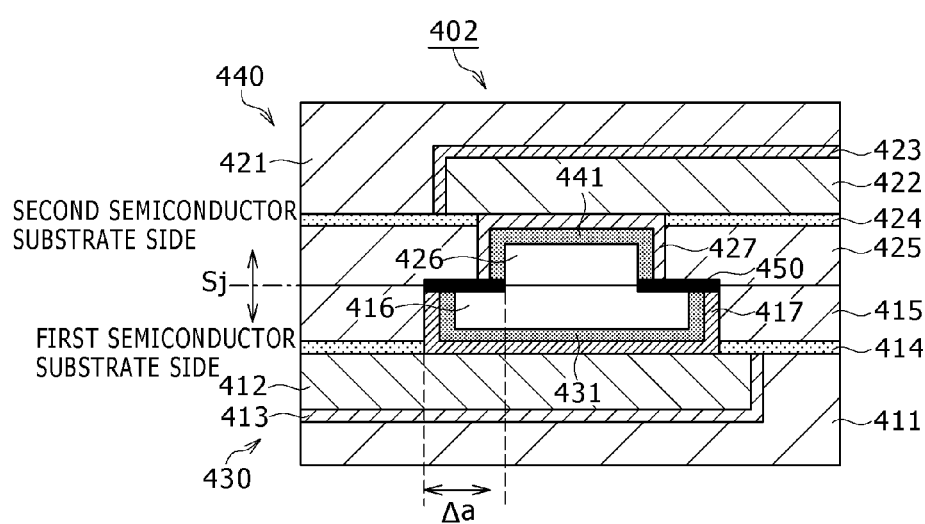
FIG. 17 is a schematic sectional view in the proximity of a joining interface of a semiconductor device according to a second working example of the third embodiment of the disclosed technology.
Figure 18:
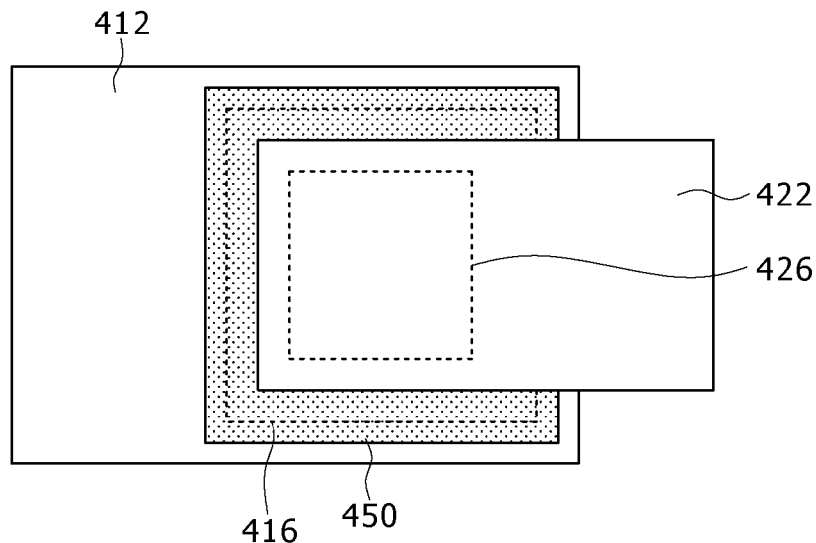
FIG. 18 is a schematic top plan view in the proximity of a joining interface of the semiconductor device of FIG. 17.

FIGS. 17 and 18 show a general configuration of a semiconductor device according to a second working example of the third embodiment. In particular, FIG. 17 shows a schematic cross section of the semiconductor device according to the second working example in the proximity of a joining interface, and FIG. 18 shows a schematic top plan in the proximity of the joining interface and illustrates an arrangement relationship of Cu joining portions and an interface Cu barrier film. It is to be noted that, in FIGS. 17 and 18, only a configuration in the proximity of a joining interface is shown for simplified description. Further, in the semiconductor device 402 of the present working example shown in FIGS. 17 and 18, like elements to those of the semiconductor device 401 of the first working example shown in FIGS. 14 and 15 are denoted by like reference characters.

Referring first to FIG. 17, the semiconductor device 402 includes a first semiconductor member 430 which is a first semiconductor section, a second semiconductor member 440 which is a second semiconductor section, and an interface Cu barrier film 450 which is an interface barrier film or interface barrier section.

The first semiconductor member 430 includes a first semiconductor substrate not shown, a first SiO2 layer 411, a first Cu wiring line portion 412, a first Cu barrier film 413, a first Cu diffusion preventing film 414, a first interlayer insulating film 415, a first Cu joining portion 416, a first Cu barrier layer 417 and a first Cu seed layer 431.

As can be recognized from comparison between FIGS. 17 and 14, the first semiconductor member 430 in the present working example is configured such that the first Cu seed layer 431 is provided between the first Cu joining portion 416 and the first Cu barrier layer 417 in the first semiconductor member 410 of the first working example. The configuration of the other part of the first semiconductor member 430 is similar to that of the first semiconductor member 410 of the first working example described hereinabove. Therefore, description is given below only of the configuration of the first Cu seed layer 431.

The first Cu seed layer 431 which is a seed layer is provided between the first Cu joining portion 416 and the first Cu barrier layer 417 as described above and is provided so as to cover the first Cu joining portion 416.

The first Cu seed layer 431 is formed from a Cu layer or a Cu alloy layer containing a metal material which is likely to react with oxygen. As the metal material contained in the first Cu seed layer 431, for example, a metal material which is more likely to react with oxygen than hydrogen can be used. In particular, metal materials of Fe, Mn, V, Cr, Mg, Si, Ce, Ti, Al and so forth can be used. It is to be noted that, among the metal materials mentioned, Mn, Mg, Ti or Al is a material suitable for the semiconductor device. Further, from a point of view of reduction of the wiring line resistance of the joining interface Sj, it is particularly preferable to use Mn or Ti as the metal material to be contained in the first Cu seed layer 431.

The second semiconductor member 440 includes a second semiconductor substrate not shown, a second SiO2 layer 421, a second Cu wiring line portion 422, a second Cu barrier film 423, a second Cu diffusion preventing film 424, a second interlayer insulating film 425, a second Cu joining portion 426, a second Cu barrier layer 427 and a second Cu seed layer 441.

As apparently recognized from FIGS. 17 and 14, the second semiconductor member 440 in the present working example is configured such that the second semiconductor member 420 of the first working example does not include the interface Cu barrier film 428 but includes the second Cu seed layer 441 provided between the second Cu joining portion 426 and the second Cu barrier layer 427. The configuration of the other part of the second semiconductor member 440 is similar to that of the second semiconductor member 420 of the first working example described hereinabove. Therefore, the configuration only of the second Cu seed layer 441 is described below.

The second Cu seed layer 441 is provided between the second Cu joining portion 426 and the second Cu barrier layer 427 as described hereinabove and is formed so as to cover the second Cu joining portion 426. The second Cu seed layer 441 is formed from a Cu layer or a CU alloy layer containing a metal material which is likely to react with oxygen similarly to the first Cu seed layer 431. Further, the metal material contained in the second Cu seed layer 441 can be suitably selected from among the metal materials described in regard to the first Cu seed layer 431. It is to be noted that, in the present working example, the metal material contained in the second Cu seed layer 441 is same as that contained in the first Cu seed layer 431.

The interface Cu barrier film 450 is a film produced by heat treatment, that is, by an annealing process, when the first semiconductor member 430 and the second semiconductor member 440 are joined together, by reaction of metal materials contained in the Cu seed layers and oxygen in the pertaining interlayer insulating films, principally in the second interlayer insulating film 425. In other words, the interface Cu barrier film 450 is a self-forming film. Therefore, the interface Cu barrier film 450 is formed in a region of the joining interface Sj across which the first Cu joining portion 416 of the first semiconductor member 430 and the second interlayer insulating film 425 of the second semiconductor member 440 oppose to each other, and is configured from an oxide film of, for example, MnOx, MgOx, TiOx or AlOx.

It is to be noted that, in FIG. 17, in order to clearly indicate the formation position of the interface Cu barrier film 450, it is shown that the interface Cu barrier film 450 is formed so as to extend from a side face of the second Cu joining portion 426 to a side face of the first Cu barrier layer 417 along the joining interface Sj. However, the formation region of the interface Cu barrier film 450 is not limited to this.

The interface Cu barrier film 450 is a film for preventing diffusion of Cu from a Cu joining portion into an interlayer insulating film through the opposing region between the first Cu joining portion 416 and the second interlayer insulating film 425. Therefore, the interface Cu barrier film 450 may be formed at least in the opposing region between the first Cu joining portion 416 and the second interlayer insulating film 425 along the joining interface Sj. It is to be noted that the formation region of the interface Cu barrier film 450 can be set suitably, for example, by adjusting annealing conditions upon a joining process between the first semiconductor member 430 and the second semiconductor member 440, the content of a metal material in each Cu seed layer and so forth.

[Fabrication Technique of the Semiconductor Device]

Now, a fabrication technique of the semiconductor device 402 of the present working example is described with reference to FIGS. 19A to 19E. It is to be noted that FIGS. 19A to 19D show schematic cross sections in the proximity of a Cu joining portion of semiconductor members produced at the individual steps, and FIG. 19E illustrates a manner of a joining process between the first semiconductor member 430 and the second semiconductor member 440. It is to be noted that, in the following description, description of steps similar to those of the fabrication technique for a semiconductor device according to the first working example is given suitably referring to the figures illustrating the steps in the first working example, that is, FIGS. 16A to 16M.

First, in the present working example, a first Cu barrier film 413, a first Cu wiring line portion 412 and a first Cu diffusion preventing film 414 are formed in this order on a first SiO2 layer 411 similarly as in the fabrication process of the first semiconductor member 410 in the first working example described hereinabove with reference to FIG. 16A. Then, a first interlayer insulating film 415 which is a first oxide film and an opening 415a of the first interlayer insulating film 415 are formed on the first Cu diffusion preventing film 414 similarly as in the fabrication process of the first semiconductor member 410 in the first working example described hereinabove with reference to FIGS. 16B and 16C. It is to be noted that, also in the present working example, the opening diameter of the opening 415a of the first interlayer insulating film 415 is, for example, approximately 4 to 100 μm. Further, a first Cu barrier layer 417 is formed on the first interlayer insulating film 415 and the first Cu wiring line portion 412 exposed to the opening 415a of the first interlayer insulating film 415 similarly as in the fabrication process of the first semiconductor member 410 in the first working example described hereinabove with reference to FIG. 16D.

Figure 19A:
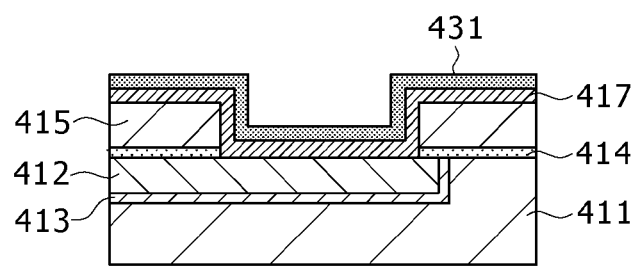
FIGS. 19A to 19E are schematic sectional views illustrating different steps of a production procedure of the semiconductor device of FIG. 17.

Then, as shown in FIG. 19A, a first Cu seed layer 431 of a thickness of approximately 5 to 50 nm is formed on the first Cu barrier layer 417 in an Ar/N2 atmosphere using a technique of, for example, an RF sputtering method. The first Cu seed layer 431 may be, for example, a CuMn layer, a CuAl layer, a CuMg layer or a CuTi layer.

Figure 19B:
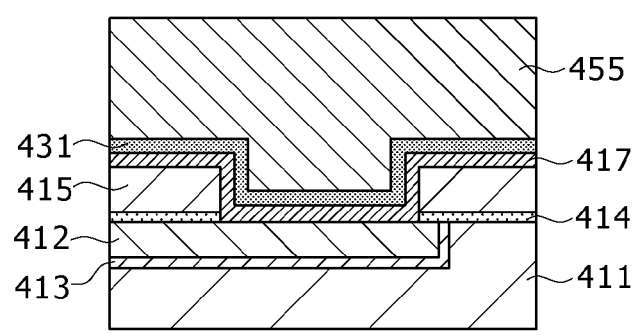

Then, as shown in FIG. 19B, a Cu film 455 is formed on the first Cu seed layer 431 using a technique such as a sputtering method or an electrolytic plating method. By this process, the Cu film 455 is embedded in the region of the opening 415a of the first interlayer insulating film 415.

Thereafter, the semiconductor member on which the Cu film 455 is formed is heated at approximately 100 to 400° C. for approximately one to 60 minutes in a nitrogen atmosphere or in vacuum using a heating apparatus such as a hot plate or a sinter annealing apparatus. By this heating process, the Cu film 455 is stiffened to form a Cu film 455 of fine film quality.

Figure 19C:
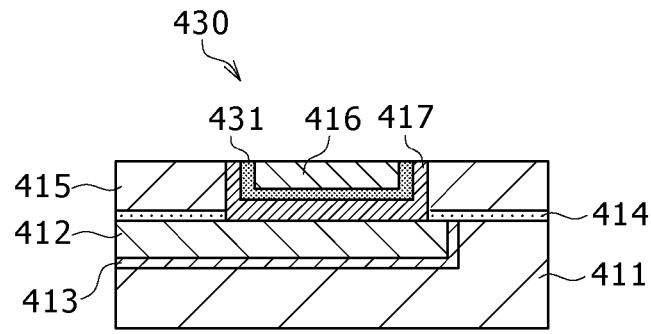

Then, as shown in FIG. 19C, unnecessary part of the Cu film 455, first Cu seed layer 431 and first Cu barrier layer 417 is removed by a CMP method. In particular, the surface of the Cu film 455 side is polished by a CMP method until the first interlayer insulating film 415 is exposed to the surface.

In the present working example, the first semiconductor member 430 is produced in such a manner as described above. Further, in the present working example, the second semiconductor member 440 is produced similarly to the first semiconductor member 430 described above.

Figure 19D:
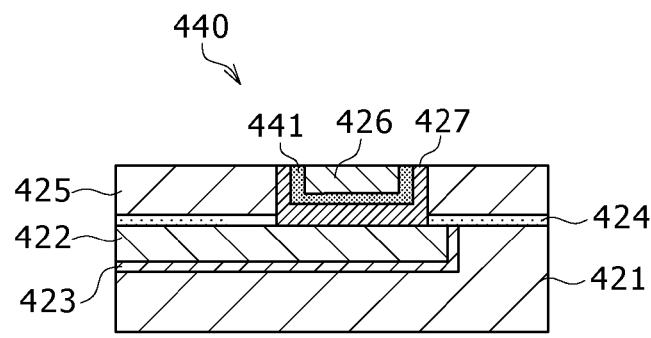
Figure 19E:
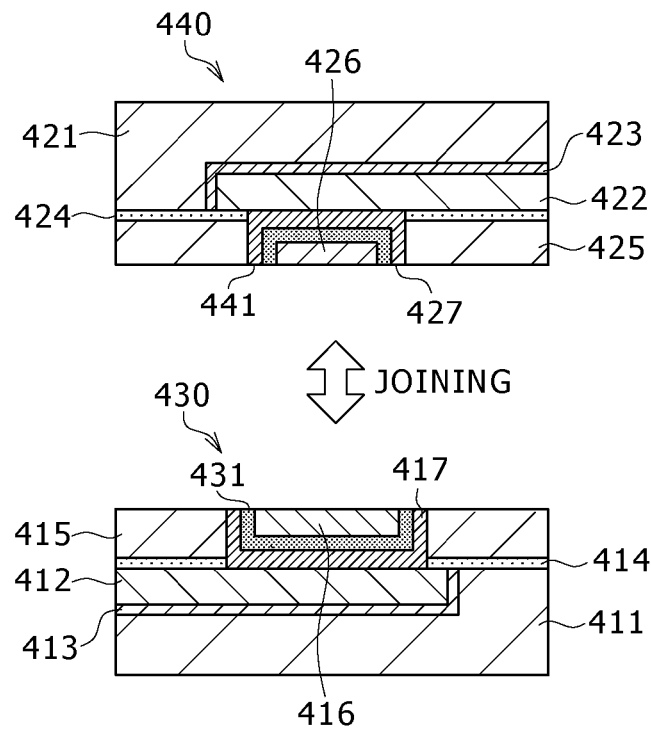

FIG. 19D shows a schematic cross section of the second semiconductor member 440 produced in accordance with the present working example. However, in the present working example, when an opening is formed in the second interlayer insulating film 425 which is a second oxide film halfway of production of the second semiconductor member 440, the opening diameter of the opening is made smaller than the opening diameter in the first interlayer insulating film 415 described hereinabove with reference to FIG. 16C, that is, smaller than approximately 4 to 100 μm. More particularly, the opening diameter of the opening in the second interlayer insulating film 425 is set to approximately 1 to 95 μm.

Thereafter, the first semiconductor member 430 shown in FIG. 19C and the second semiconductor member 440 shown in FIG. 19D, both produced in such a manner as described above, are bonded to each other similarly as in the first working example.

In particular, a reduction process is carried out for the surface of the first semiconductor member 430 on the first Cu joining portion 416 side and the surface of the second semiconductor member 440 on the second Cu joining portion 426 side to remove an oxide film or oxides on the surface of each Cu joining portion to expose clean Cu to the surface of each Cu joining portion. It is to be noted that, as the reduction process in this instance, a wet etching process in which solution of drug such as formic acid is used or a dry etching process in which plasma of, for example, Ar, NH3 or H2 is used is used.

Then, the surface of the first semiconductor member 430 on the first Cu joining portion 416 side and the surface of the second semiconductor member 440 on the second Cu joining portion 426 side are contacted with or bonded to each other as seen in FIG. 19E. Then, in the state in which the first semiconductor member 430 and the second semiconductor member 440 are bonded to each other, the bonded member is annealed using a heating apparatus such as a hot plate or a RTA apparatus to join the first Cu joining portion 416 and the second Cu joining portion 426 to each other. In particular, the bonded member is heated, for example, at approximately 100 to 400° C. for approximately five minutes to two hours in an N2 atmosphere of the atmospheric pressure or in vacuum.

Further, upon the joining process described above, metal materials in the Cu seed layers such as Mn, Mg, Ti or Al selectively react with oxygen in the interlayer insulating films, principally in the second interlayer insulating film 425. Consequently, an interface Cu barrier film 450 is formed in a region of the joining interface Sj in which the first Cu joining portion 416 of the first semiconductor member 430 and the second interlayer insulating film 425 of the second semiconductor member 440 oppose to each other. In particular, by the joining process described above, the interface Cu barrier film 450 is provided in a region including, from within the face region of the first Cu joining portion 416 on the joining interface Sj side, the face region in which the first Cu joining portion 416 is not joined to the second Cu joining portion 426.

In the present working example, a Cu—Cu joining process is carried out in such a manner as described above. It is to be noted that the fabrication process of the semiconductor device 402 except the joining step described above may be similar to that in an existing fabrication technique of a semiconductor device such as a solid-state image pickup device, and for example, similar to the fabrication technique disclosed in Japanese Patent Laid-Open No. 2007-234725.

As described above, also in the semiconductor device 402 of the present working example, the interface Cu barrier film 450 is provided in the region of the joining interface Sj in which the first Cu joining portion 416 of the first semiconductor member 430 and the second interlayer insulating film 425 of the second semiconductor member 440 oppose to each other similarly as in the first working example described hereinabove. Therefore, also in the present working example, effects similar to those achieved by the first working example are achieved.

Further, in the case where a Cu seed layer is provided and a Cu joining section is formed on the Cu seed layer by an electrolytic plating method as in the present working example, Cu in the Cu seed layer serves as a core of a Cu plating film. Therefore, in the present working example, the close contacting force between the Cu joining portion and the associated interlayer insulating film can be enhanced.

<<3. Third Working Example>>

[Configuration of the Semiconductor Device]

Figure 20:
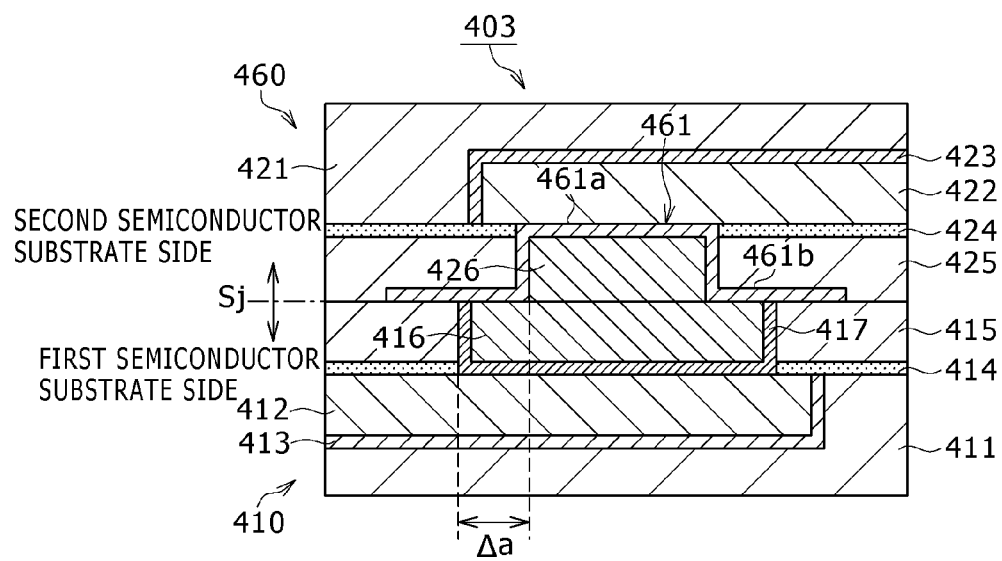
FIG. 20 is a schematic sectional view in the proximity of a joining interface of a semiconductor device according to a third working example of the third embodiment of the disclosed technology.
Figure 21:
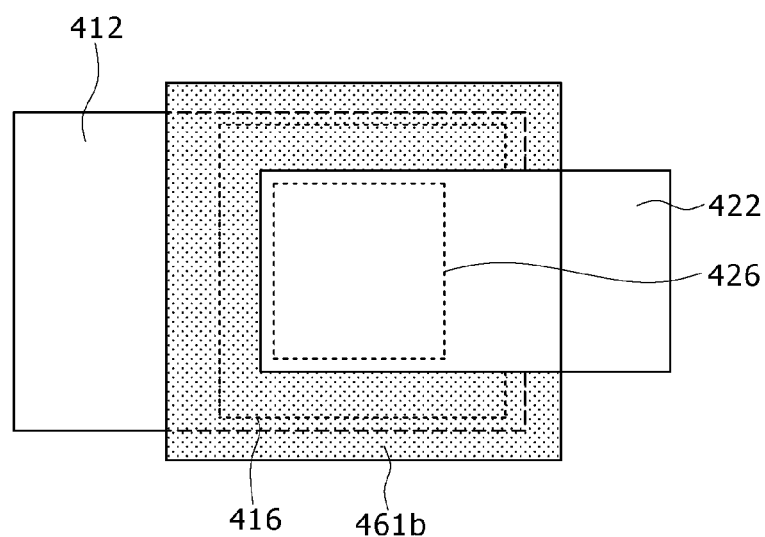
FIG. 21 is a schematic top plan view in the proximity of a joining interface of the semiconductor device of FIG. 20.

FIGS. 20 and 21 show a general configuration of a semiconductor device according to a third working example of the third embodiment of the disclosed technology. In particular, FIG. 20 shows a schematic cross section in the proximity of a joining interference of the semiconductor device according to the present working example, and FIG. 21 shows a schematic top plan in the proximity of the joining interface and illustrates an arrangement relationship between Cu joining portions and an interface layer portion of a second Cu barrier layer hereinafter described. It is to be noted that, in FIGS. 20 and 21, in order to simplify description, a configuration of only one joining interface is shown. Further, in the semiconductor device 403 of the present working example shown in FIGS. 20 and 21, like elements to those in the semiconductor device 401 of the first working example described hereinabove with reference to FIGS. 14 and 15 are denoted by like reference characters.

Referring first to FIG. 20, the semiconductor device 403 includes a first semiconductor member 410 which is a first semiconductor section, and a second semiconductor member 460 which is a second semiconductor section. It is to be noted that the first semiconductor member 410 in the semiconductor device 403 of the present working example has a configuration similar to that in the semiconductor device 401 of the first working example described hereinabove with reference to FIG. 14. Therefore, overlapping description of the first semiconductor member 410 is omitted herein to avoid redundancy.

The second semiconductor member 460 includes a second semiconductor substrate not shown, a second SiO2 layer 421, a second Cu wiring line portion 422, a second Cu barrier film 423, a second Cu diffusion preventing film 424, a second interlayer insulating film 425, a second Cu joining portion 426 and a second Cu barrier layer 461 which is a barrier metal layer.

As apparent from comparison between FIGS. 20 and 14, the second semiconductor member 460 in the present working example is configured such that the second semiconductor member 420 in the first working example does not include the interface Cu barrier layer 428 but is changed in configuration of the second Cu barrier layer 427. The configuration of the other part of the second semiconductor member 460 is similar to that of the corresponding part of the second semiconductor member 420 of the first working example described hereinabove. Therefore, only the configuration of the second Cu barrier layer 461 is described below.

Referring to FIG. 20, the second Cu barrier layer 461 includes a barrier body portion 461a provided so as to cover the second Cu joining portion 426, and an interface layer portion 461b, which is an interface barrier portion, formed so as to extend along a joining interface Sj from an end portion of the barrier body portion 461a on the joining interface Sj side.

In particular, in the present working example, the interface layer portion 461b of the second Cu barrier layer 461 is disposed in a region of the joining interface Sj in which the first Cu joining portion 416 of the first semiconductor member 410 and the second interlayer insulating film 425 of the second semiconductor member 460 oppose to each other. Further, the interface layer portion 461b of the second Cu barrier layer 461 prevents Cu from diffusing from the Cu joining portion into the interlayer insulating film through the opposing region of the first Cu joining portion 416 and the second interlayer insulating film 425. Therefore, in the present working example, the width of the interface layer portion 461b in a direction along the joining interface Sj is set such that, even if estimated maximum misalignment occurs upon joining, a contact region between the first Cu joining portion 416 and the second interlayer insulating film 425 may not appear on the joining interface Sj. It is to be noted that the second Cu barrier layer 461 is configured from, for example, Ti, Ta, Ru or a nitride of them similarly as in the first working example described hereinabove.

[Fabrication Technique of the Semiconductor Device]

Now, a fabrication technique of the semiconductor device 403 of the present working example is described with reference to FIGS. 22A to 22H. It is to be noted that FIGS. 22A to 22G show schematic cross sections in the proximity of a Cu joining portion of semiconductor members produced at individual steps, and FIG. 22H illustrates a manner of a joining process of a first semiconductor member 410 and a second semiconductor member 460. Further, in description of steps similar to those of the fabrication technique of the semiconductor device of the first working example described hereinabove, the figures at the steps in the first working example, that is, FIGS. 16A to 16M, are referred to suitably. Further, since the production technique of the first semiconductor member 410 in the present working example is similar to that in the first working example described hereinabove with reference to FIGS. 16A to 16F, description of the production technique of the first semiconductor member 410 is omitted here to avoid redundancy. Thus, a production technique of the second semiconductor member 460 and a Cu—Cu joining technique are described below.

First, in the present working example, a second Cu barrier film 423, a second Cu wiring line portion 422 and a second Cu diffusion preventing film 424 are formed in this order on a second SiO2 layer 421 in a similar manner as in the production step of the first semiconductor member 410 of the first working example described hereinabove with reference to FIG. 16A. Then, a second interlayer insulating film 425 is formed on the second Cu diffusion preventing film 424 in a similar manner as in the production step of the first semiconductor member 410 in the first working example described hereinabove with reference to FIG. 16B.

Figure 22A:
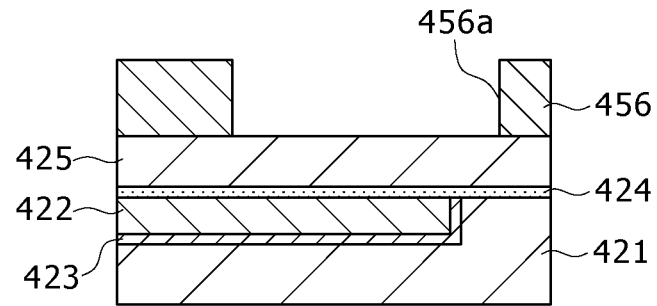
FIGS. 22A to 22H are schematic sectional views illustrating different steps of a production procedure of the semiconductor device of FIG. 20.

Then, a resist film 456 is formed on the second interlayer insulating film 425 as shown in FIG. 22A. Then, a patterning process is carried out for the resist film 456 using a photolithography technique to remove the resist film 456 in a formation region for a second Cu barrier layer 461 to form an opening 456a. Consequently, the second interlayer insulating film 425 is exposed to the opening 456a of the resist film 456.

Figure 22B:
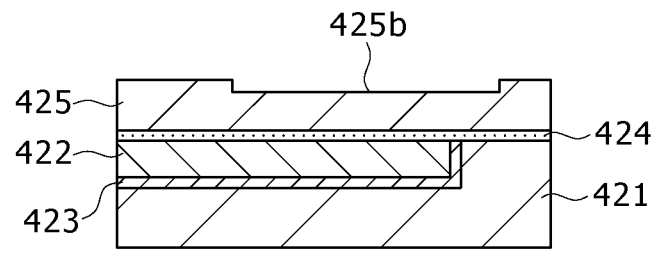

Then, a dry etching process is carried out for the surface of the semiconductor member, on which the resist film 456 is formed, on the opening 456a side using a known etching apparatus of the magnetron type. Consequently, the region of the second interlayer insulating film 425 exposed to the opening 456a of the resist film 456 is etched. Thereupon, the second interlayer insulating film 425 is removed by approximately 10 to 50 nm by the etching. As a result, a recessed portion 425b of a depth of approximately 10 to 50 nm is formed on the surface of the second interlayer insulating film 425 as shown in FIG. 22B.

Thereafter, for example, an asking process in which oxygen (O2) plasma is used and a washing process in which solution of organic amine-based drug is used are carried out for the face for which the etching has been carried out. By the processes, the resist film 456 remaining on the second interlayer insulating film 425 and the residual deposits generated in the etching process are removed.

Figure 22C:
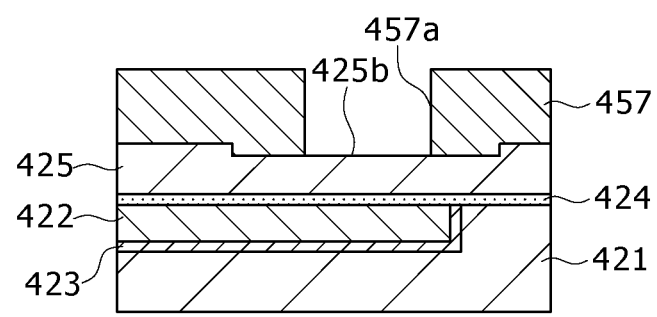

Then, a resist film 457 is formed on the second interlayer insulating film 425 as shown in FIG. 22C. Then, a patterning process is carried out for the resist film 457 using a photolithography technique to remove the resist film 457 in a formation region for a barrier body portion 461a of a second Cu barrier layer 461 to form an opening 457a. Consequently, the bottom of the recessed portion 425b of the second interlayer insulating film 425 is exposed to the opening 457a of the resist film 457.

Thereafter, a dry etching process is carried out for the surface of the semiconductor member, on which the resist film 457 is formed, on the opening 457a side using, for example, a known etching apparatus of the magnetron type. Consequently, the region of the recessed portion 425b of the second interlayer insulating film 425 exposed to the opening 457a of the resist film 457 is partly etched.

Figure 22D:
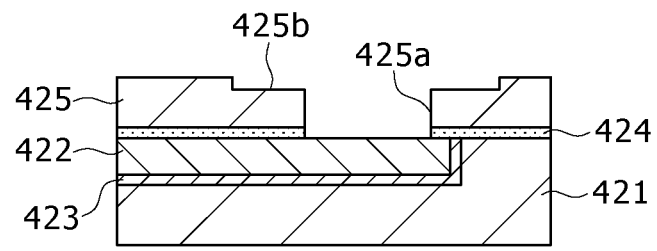

In this etching process, the second interlayer insulating film 425 and the second Cu diffusion preventing film 424 in the region of the opening 457a are removed to expose the second Cu wiring line portion 422 to an opening 425a of the second interlayer insulating film 425 as shown in FIG. 22D. Further, in the present working example, the opening diameter of the opening 425a of the second interlayer insulating film 425 is set, for example, to approximately 1 to 95 μm. It is to be noted that the region of the recessed portion 425b of the second interlayer insulating film 425 from which the second interlayer insulating film 425 is not removed in this etching process is a formation region for the interface layer portion 461b of the second Cu barrier layer 461.

Thereafter, for example, an asking process in which oxygen (O2) plasma is used and a washing process in which solution of organic amine-based drug is used are carried out for the face for which the etching process has been carried out. By the processes, the resist film 457 remaining on the second interlayer insulating film 425 and the residual deposits generated in the etching process are removed.

Figure 22E:
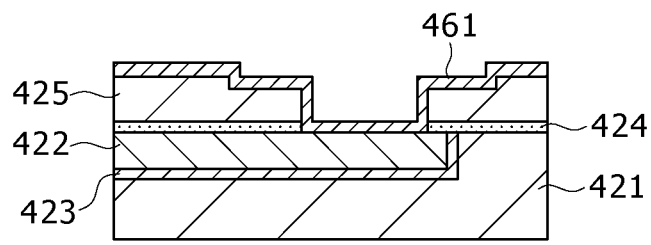

Then as seen in FIG. 22E, a second Cu barrier layer 461 made of Ti, Ta, Ru or any of nitrides of them is formed on the second interlayer insulating film 425 and the second Cu wiring line portion 422 exposed to the opening 425a of the second interlayer insulating film 425. In particular, such a technique as, for example, an RF sputtering method is used to form a second Cu barrier layer 461 of a thickness of approximately 5 to 50 nm on the second interlayer insulating film 425 and the second Cu wiring line portion 422 in an Ar/N2 atmosphere. By this process, a barrier body portion 461a is formed on the second Cu wiring line portion 422 exposed to the opening 425a of the second interlayer insulating film 425 and on a side face of the second interlayer insulating film 425. Further, by the process described above, an interface layer portion 461b is formed on the recessed portion 425b of the second interlayer insulating film 425.

Figure 22F:
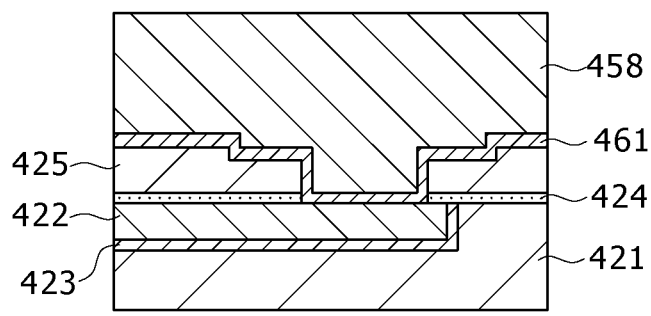

Thereafter, a Cu film 458 is formed on the second Cu barrier layer 461 as shown in FIG. 22F using, for example, a technique of a sputtering method or an electrolytic plating method. By this process, the Cu film 458 is embedded in the region of the opening 425a of the second interlayer insulating film 425.

Then, the semiconductor member on which the Cu film 458 is formed is heated at approximately 100 to 400° C. for approximately one to 60 minutes in a nitrogen atmosphere or in vacuum using a heating apparatus such as a hot plate or a sinter annealing apparatus. By the heating process, the Cu film 458 is stiffened to form a Cu film 458 of fine film quality.

Figure 22G:
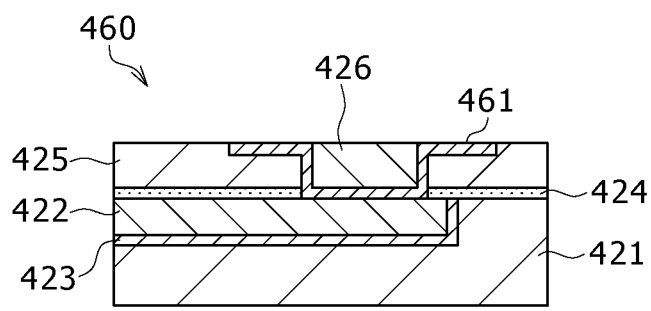
Figure 22H:
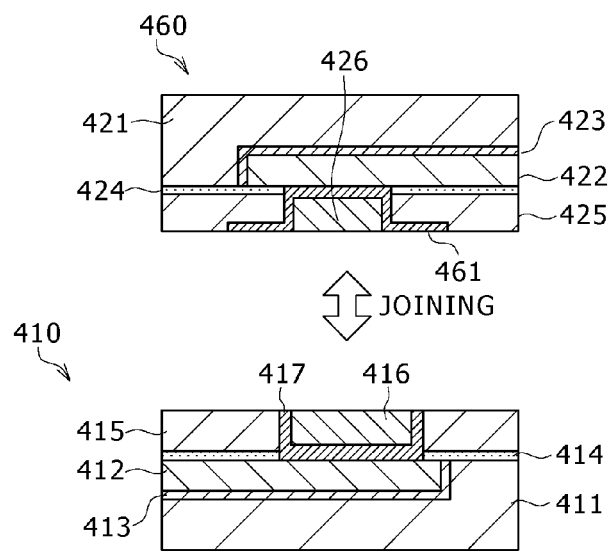

Then, unnecessary part of the Cu film 458 and the second Cu barrier layer 461 are removed by a chemical mechanical polishing (CMP) method as shown in FIG. 22G. Thereupon, processing conditions of the CMP method are adjusted such that the interface layer portion 461b may remain on the recessed portion 425b of the second interlayer insulating film 425. In particular, the surface of the Cu film 458 is polished by a CMP method until the second interlayer insulating film 425 is exposed to the surface. In the present working example, a second semiconductor member 460 is produced in such a manner as described above.

Thereafter, the second semiconductor member 460 shown in FIG. 22G produced in such a manner as described above and the first semiconductor member 410 shown in FIG. 16F produced in a similar manner as in the first working example described hereinabove are bonded to each other in a similar manner as in the first working example.

In particular, a reduction process is carried out for the surface of the first semiconductor member 410 on the first Cu joining portion 416 side and the surface of the second semiconductor member 460 on the second Cu joining portion 426 side to remove an oxide film or oxides on the surface of each Cu joining portion to expose clean Cu to the surface of each Cu joining portion. It is to be noted that, as the reduction process in this instance, a wet etching process in which solution of drug such as formic acid is used or a dry etching process in which plasma of, for example, Ar, NH3 or H2 is used is used.

Then, the surface of the first semiconductor member 410 on the first Cu joining portion 416 side and the surface of the second semiconductor member 460 on the second Cu joining portion 426 side are contacted with or bonded to each other as seen in FIG. 22H. Then, in the state in which the first semiconductor member 410 and the second semiconductor member 460 are bonded to each other, the bonded member is annealed using a heating apparatus such as a hot plate or a RTA apparatus to join the first Cu joining portion 416 and the second Cu joining portion 426 to each other. In particular, the bonded member is heated, for example, at approximately 100 to 400° C. for approximately five minutes to two hours in an N2 atmosphere of the atmospheric pressure or in vacuum.

Further, by the joining process described above, an interface layer portion 461b of the second Cu barrier layer 461 is disposed in a region which includes, from within a face region of the first Cu joining portion 416 on the joining interface Sj side, a face region which is not joined to the second Cu joining portion 426. More particularly, the interface layer portion 461b of the second Cu barrier layer 461 is disposed in the region including the region of the joining interface Sj in which the first Cu joining portion 416 and the second interlayer insulating film 425 are opposed to each other as shown in FIG. 20.

In the present working example, a Cu—Cu joining process is carried out in such a manner as described above. It is to be noted that the fabrication process of the semiconductor device 402 except the joining step described above may be similar to that in an existing fabrication technique of a semiconductor device such as a solid-state image pickup device, and for example, similar to the fabrication technique disclosed in Japanese Patent Laid-Open No. 2007-234725.

As described above, also in the present working example, the interface layer portion 461b of the second Cu barrier layer 461 is provided in the region of the joining interface Sj in which the first Cu joining portion 416 of the first semiconductor member 410 and the second interlayer insulating film 425 of the second semiconductor member 460 oppose to each other similarly as in the first working example described hereinabove. Therefore, also in the present working example, effects similar to those achieved by the first working example are achieved.

<<4. Various Modifications and Reference Examples>>

Now, various modifications to the semiconductor devices of the working examples described hereinabove are described.

[Modification 1]

While, in the semiconductor device 401 of the first working example described hereinabove with reference to FIG. 14, the second Cu diffusion preventing film 424, second interlayer insulating film 425 and interface Cu barrier layer 428 are provided on the second Cu wiring line portion 422 of the second semiconductor member 420, the present disclosure is not limited to this configuration. For example, another configuration wherein an interface Cu barrier film is provided only on the second Cu wiring line portion 422 may be used.

Figure 23:
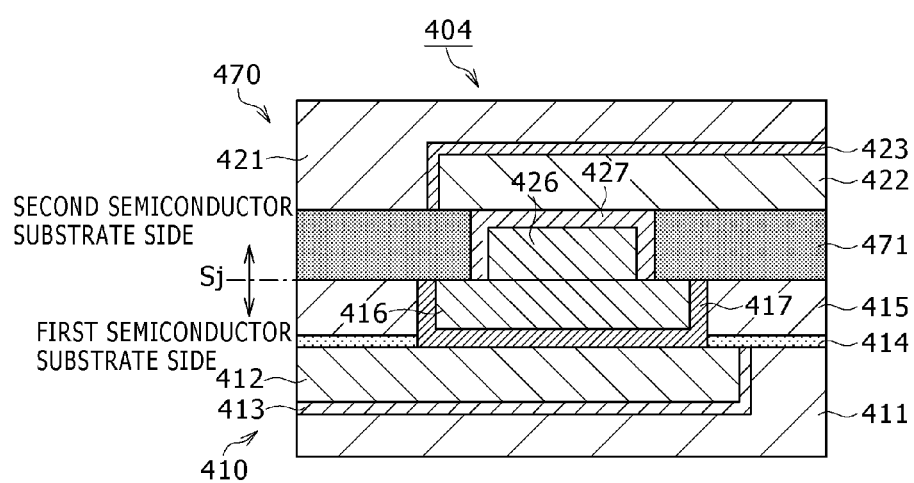
FIG. 23 is a schematic sectional view in the proximity of a joining interface of a semiconductor device according to a modification 1.

An example of the configuration, that is, a modification 1, is shown in FIG. 23. FIG. 23 particularly shows a schematic cross section of a semiconductor device 404 of the modification 1 in the proximity of the joining interface Sj. It is to be noted that, in the semiconductor device 404 of the modification 1, like elements to those in the semiconductor device 401 of the first working example described hereinabove with reference to FIG. 14 are denoted by like reference characters.

Referring to FIG. 23, the semiconductor device 404 includes a first semiconductor member 410 and a second semiconductor member 470. It is to be noted that, since the first semiconductor member 410 of the semiconductor device 404 of the present modification 1 has a configuration similar to that of the first working example described hereinabove with reference to FIG. 14, description of the first semiconductor member 410 is omitted herein to avoid redundancy.

The second semiconductor member 470 includes a second semiconductor substrate not shown, a second SiO2 layer 421, a second Cu wiring line portion 422, a second Cu barrier film 423, an interface Cu barrier film 471 which is an interface barrier film or interface barrier section, a second Cu joining portion 426, and a second Cu barrier layer 427. It is to be noted that the other part than the interference Cu barrier film 471 of the second semiconductor member 470 is similar in configuration to the corresponding part of the second semiconductor member 420 in the first working example described hereinabove.

The interface Cu barrier film 471 which is a Cu diffusion preventing film is provided on the second SiO2 layer 421, second Cu wiring line portion 422 and second Cu barrier film 423 and besides is provided in such a manner as to cover a side portion of the second Cu barrier layer 427. Therefore, in the present example, the interface Cu barrier film 471 not only prevents diffusion of Cu from the Cu joining portion into the interlayer insulating film but also plays roles similar to those of the second Cu diffusion preventing film 424 and the second interlayer insulating film 425 of the second semiconductor member 420 of the first working example described hereinabove.

It is to be noted that the interface Cu barrier film 471 may be formed from a material such as SiN, SiON, SiCN or an organic resin similarly to the interface Cu barrier film 428 in the first working example.

The second semiconductor member 470 in the present modification can be produced, for example, in the following manner. First, a second Cu barrier film 423 and a second Cu wiring line portion 422 are formed in this order on a second SiO2 layer 421 in a similar manner as at the production step of the first semiconductor member 410 of the first working example described hereinabove with reference to FIG. 16A. Then, an interface Cu barrier film 471 of a thickness of approximately 5 to 500 nm is formed on the second SiO2 layer 421, second Cu wiring line portion 422 and second Cu barrier film 423.

Figure 24:
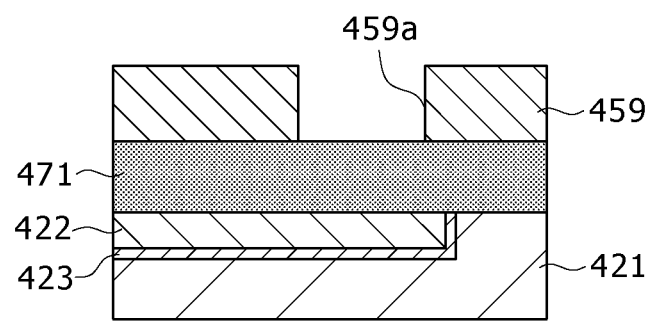
FIG. 24 is a schematic sectional view illustrating a production procedure of the semiconductor device of FIG. 23.

Then, a resist film 459 is formed on the interface Cu barrier film 471 as shown in FIG. 24. Thereafter, a photolithography technique is used to carry out a patterning process for the resist film 459 to remove the resist film 459 in a formation region for the second Cu joining portion 426 to form an opening 459a. Consequently, the interface Cu barrier film 471 is exposed to the opening 459a of the resist film 459. Thereafter, the production steps for the second semiconductor member 420 in the first working example described hereinabove with reference to FIGS. 16I to 16L are carried out to produce a second semiconductor member 470 of the present modification.

In the configuration of the present modification, a portion of the face region of the first Cu joining portion 416 on the joining interface Sj side in which the first Cu joining portion 416 is not joined to the second Cu joining portion 426 is placed in a state in which it contacts with the interface Cu barrier film 471. Therefore, also in the configuration of the present modification, Cu of the Cu joining portions does not diffuse into an external oxide film, and therefore, similar effects to those achieved by the first working example can be achieved.

[Modification 2]

While the second working example is an example wherein a Cu seed layer is provided in both of the first semiconductor member 430 and the second semiconductor member 440 as described hereinabove with reference to FIG. 17, the present disclosure is not limited to this. The Cu seed layer may be provided at least in that one of the semiconductor members which has a greater surface area on the joining side of the Cu joining portion. For example, in the semiconductor device 402 shown in FIG. 17, a Cu seed layer may be provided only between the first Cu joining portion 416 and the first Cu barrier layer 417 of the first semiconductor member 430.

Also in this case, by the annealing process upon joining, a metal material such as Mn, Mg, Ti or Al in the Cu seed layer of the first semiconductor member 430 reacts with oxygen in the second interlayer insulating film 425 of the second semiconductor member 440 which opposes to the Cu seed layer across the joining interface Sj. As a result, also in the present modification, an interface barrier film is formed in the region of the joining interface Sj across which the first Cu joining portion 416 of the first semiconductor member 430 and the second interlayer insulating film 425 of the second semiconductor member 440 oppose to each other, and similar effects to those achieved by the first working example are achieved.

[Modification 3]

While the third working example described hereinabove is configured such that the interface layer portion 461*b* of the second Cu barrier layer 461 in the second semiconductor member 460 is formed in such a manner as to be embedded in the joining side surface of the second interlayer insulating film 425, the present disclosure is not limited to this. For example, the second Cu barrier layer 461 may be configured otherwise such that the interface layer portion 461*b* is provided on the joining side surface of the second interlayer insulating film 425.

Figure 25:
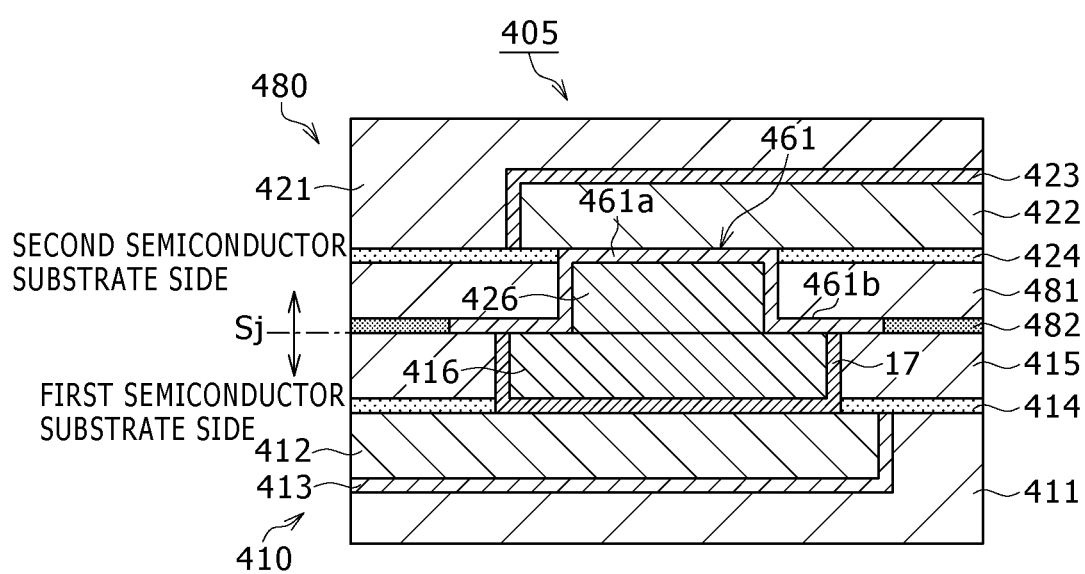
FIGS. 25 and 26 are schematic sectional views in the proximity of a joining interface of semiconductor devices according to modifications 3 and 4.

An example of the configuration, that is, a modification 3, is shown in FIG. 25. Particularly, FIG. 25 shows a schematic cross section of a semiconductor device 405 of the modification 3 in the proximity of the joining interface Sj. It is to be noted that, in the semiconductor device 405 of the modification 3 shown in FIG. 25, like elements to those in the semiconductor device 403 of the third working example described hereinabove with reference to FIG. 20 are denoted by like reference characters.

Referring to FIG. 25, the semiconductor device 405 of the present modification includes a first semiconductor member 410 and a second semiconductor member 480. It is to be noted that, since the configuration of the first semiconductor member 410 in the semiconductor device 405 of the present modification is similar to that in the third working example described hereinabove with reference to FIG. 20, overlapping description of the first semiconductor member 410 is omitted herein to avoid redundancy.

The second semiconductor member 480 includes a second semiconductor substrate not shown, a second SiO2 layer 421, a second Cu wiring line portion 422, a second Cu barrier film 423, a second Cu diffusion preventing film 424, a second interlayer insulating film 481, a second Cu joining portion 426, a second Cu barrier layer 461 and an interface Cu barrier film 482.

It is to be noted that, in the second semiconductor member 480 of the present modification, the second semiconductor substrate not shown, second SiO2 layer 421, second Cu wiring line portion 422, second Cu barrier film 423 and second Cu diffusion preventing film 424 are configured similarly to the corresponding components of the second semiconductor member 460 of the third working example described hereinabove. Further, the second Cu joining portion 426 and the second Cu barrier layer 461 in the present modification are configured similarly to the corresponding components of the second semiconductor member 460 of the third working example described hereinabove.

In the present modification, the interface layer portion 461*b* of the second Cu barrier layer 461 is provided on the joining side surface of the second interlayer insulating film 481. Therefore, the second recessed portion 425*b* provided in the third working example is not formed on the surface of the second interlayer insulating film 481.

Further, in the present modification, the interface Cu barrier film 482 is formed on the surface of the second interlayer insulating film 481 in such a manner as to cover a side portion or side face of the interface layer portion 461*b* of the second Cu barrier layer 461. Further, thereupon, the film thickness of the interface Cu barrier film 482 and the film thickness of the interface layer portion 461*b* are made substantially equal to each other so that the surface of the interface Cu barrier film 482 on the joining interface Sj side and the surface of the interface layer portion 461*b* on the joining interface Sj side may be substantially in flush with each other. It is to be noted that the interface Cu barrier film 482 can be formed from such a material as, for example, SiN, SiON, SiCN or an organic resin similarly to the interface Cu barrier film 428 in the first working example.

In the present modification, in a region of the joining interface Sj other than the joining region between the first Cu joining portion 416 and the second Cu joining portion 426, the first Cu joining portion 416 is placed in a state in which it contacts with the interface layer portion 461*b* of the second Cu barrier layer 461 and/or the interface Cu barrier film 482. Therefore, also in the configuration of the present modification, diffusion of Cu in the Cu joining portions into the interlayer insulating film can be prevented, and therefore, similar effects to those achieved by the first working example are achieved.

It is to be noted that the present modification may be further modified such that it does not include the interface Cu barrier film 482. In this instance, while an air gap is formed around a side portion of the interface layer portion 461*b* of the second Cu barrier layer 461, since diffusion of Cu of the Cu joining portions into the interlayer insulating film can be prevented by the air cap, similar effects to those achieved by the first working example can be achieved. However, from a point of view of the joining strength at the joining interface Sj, it is preferable to provide the interface Cu barrier film 482 in such a manner as to cover a side portion of the interface layer portion 461*b* as shown in FIG. 25.

[Modification 4]

While, in the working examples and the modifications described above, the electrode film of each joining portion is configured from a Cu film, the present disclosure is not limited to this. The joining portion may otherwise be configured from a metal film formed from, for example, Al, W, Ti, TiN, Ta, TaN or Ru or a laminated film of such metal films.

For example, in the first working example, Al (aluminum) can be used as the electrode material for the joining portions. In this instance, the interface Cu barrier layer 428 can be configured from such a material as, for example, SiN, SiON, SiCN or a resin similarly as in the first working example described hereinabove. Further, in this instance, the metal barrier layer which covers the Al joining portion is preferably configured from a multilayer film formed by laminating a Ti film and a TiN film in this order from the Al joining portion side, that is, from a Ti/TiN laminated film.

Further, for example, also in the configuration of the second working example described above, Al can be used as the electrode material for the joining portions. However, in this instance, since Al is a material liable to react with oxygen, there is no necessity to provide a seed layer, that is, a Cu seed layer, for producing an interface barrier film.

Figure 26:
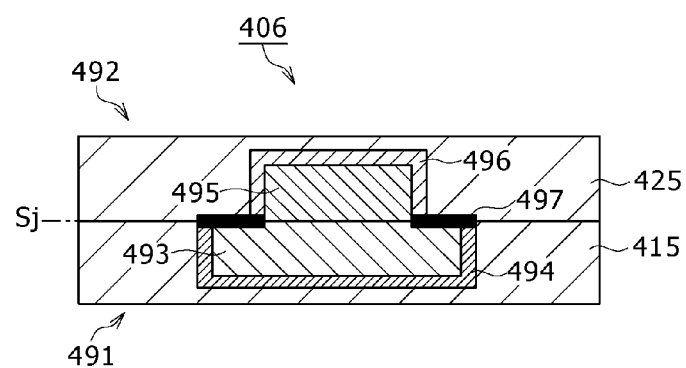

FIG. 26 shows a schematic cross section in the proximity of the joining interface Sj of a semiconductor device in the case where each joining portion is formed from Al in the configuration of the second working example described above. It is to be noted that, in FIG. 26, in order to simplify description, a configuration only in the proximity of an Al joining portion while the configuration of the wiring line section is omitted. Further, in the semiconductor device 406 shown in FIG. 26, like elements to those of the semiconductor device 402 of the second working example shown in FIG. 17 are denoted by like reference characters.

Referring to FIG. 26, the semiconductor device 406 of the present modification includes a first semiconductor member 491, a second semiconductor member 492 and an interface barrier film 497. The first semiconductor member 491 includes a first interlayer insulating film 415, a first Al joining portion 493 formed in such a manner as to be embedded in the joining side surface of the first interlayer insulating film 415, and a first barrier metal layer 494 provided between the first interlayer insulating film 415 and the first Al joining portion 493. Meanwhile, the second semiconductor member 492 includes a second interlayer insulating film 425, a second Al joining portion 495 formed in such a manner as to be embedded in the joining side surface of the second interlayer insulating film 425, and a second barrier metal layer 496 provided between the second interlayer insulating film 425 and the second Al joining portion 495.

Also in the modification shown in FIG. 26, by an annealing process carried out upon joining of the first semiconductor member 491 and the second semiconductor member 492, part of Al in the first Al joining portion 493 reacts with oxygen in the second interlayer insulating film 425 of the second semiconductor member 492 which opposes to the first Al joining portion 493 across the joining interface Sj. As a result, the interface barrier film 497 is formed in the region of the joining interface Sj in which the first Al joining portion 493 and the second interlayer insulating film 425 oppose to each other. Therefore, also in the present configuration example, the joining strength between the first semiconductor member 491 and the second semiconductor member 492 can be increased similarly as in the first working example, and the resulting semiconductor device 406 has a joining interface of a higher degree of reliability.

Further, for example, in the first working example, for example, W (tungsten) can be used as the electrode material for the joining portions. In this instance, the interface Cu barrier layer 428 can be formed from such a material as, for example, SiN, SiON, SiCN or an organic resin similarly as in the first working example. Further in this instance, the metal barrier layer for covering the W joining portion is preferably configured from a multilayer film formed by laminating a Ti film and a TiN film in this order from the W joining portion side, that is, from a Ti/TiN laminated film. It is to be noted that, however, since W is a metal material less liable to react with oxygen, that is, less liable to self-produce an interface barrier film, it is difficult to use W for the joining portions in the configuration of the second working example described hereinabove.

[Modification 5]

While, in the working examples and the modifications described above, metal films to which a signal is supplied are joined together along the joining interface Sj, the present disclosure is not limited to this. Also in the case where metal films to which no signal is supplied are joined together, the Cu—Cu joining technique described in connection with the working examples and the modifications can be applied.

For example, also in the case where dummy electrodes are joined together, the Cu—Cu joining technique described hereinabove in connection with the working examples and the modifications can be applied. Further, also in the case where, for example, in a solid-state image pickup device, metal films of a sensor section and a logic circuit section are joined together to form a light intercepting film, the Cu—Cu joining technique described in connection with the working examples and the modifications can be applied.

[Reference Example 1]

In the second working example described above, the dimension or surface area of the surface of the first Cu joining portion 416 on the joining interface Sj side and that of the second Cu joining portion 426 are different from each other. However, the Cu—Cu joining technique described hereinabove in connection with the second working example can be applied also to a semiconductor device wherein the surface shape and dimension of the first Cu joining portion on the joining interface Sj side and those of the second Cu joining portion are same as each other.

Figure 27:
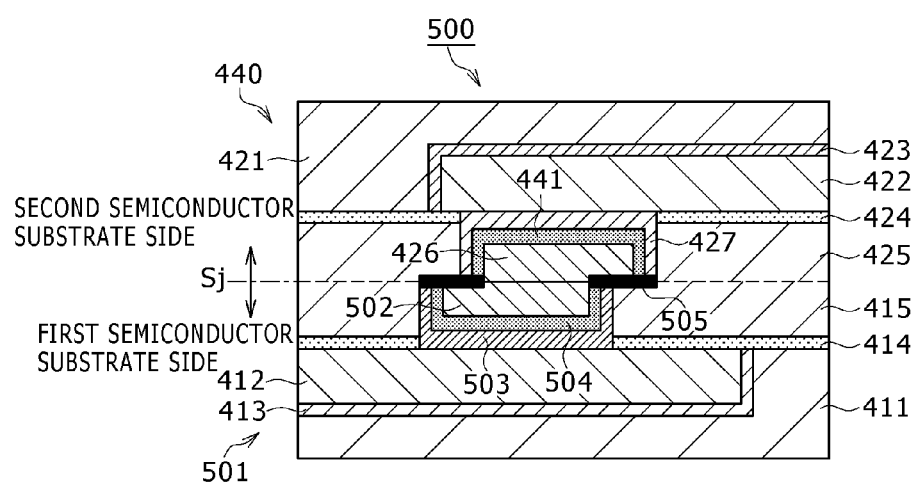
FIGS. 27 and 28 are schematic sectional views in the proximity of a joining interface of semiconductor devices according to reference examples 1 and 2.

FIG. 27 shows an example of such an application as just described, that is, a reference example 1. It is to be noted that FIG. 27 shows a schematic cross section of the semiconductor device 500 of the present reference example 1 in the proximity of a joining interface Sj. It is to be noted that, in the semiconductor device 500 of the present reference example shown in FIG. 27, like elements to those of the semiconductor device 402 of the second working example shown in FIG. 17 are denoted by like reference characters.

Referring to FIG. 27, the semiconductor device 500 of the present reference example includes a first semiconductor member 501, a second semiconductor member 440, and an interface Cu barrier film 505. It is to be noted that the second semiconductor member 440 in the semiconductor device 500 of the present reference example has a configuration similar to that in the second working example described hereinabove with reference to FIG. 17, and therefore, overlapping description of the second semiconductor member 440 is omitted herein to avoid redundancy.

The first semiconductor member 501 includes a first semiconductor member not shown, a first SiO2 film 411, a first Cu wiring line portion 412, a first Cu barrier film 413, a first Cu diffusion preventing film 414, a first interlayer insulating film 415, a first Cu joining portion 502, a first Cu barrier layer 503 and a first Cu seed layer 504.

It is to be noted that, in the present example, the surface shape and the dimension of the first Cu joining portion 502 on the joining interface Sj side are made same as those of the second Cu joining portion 426. The configuration of the other part of the first semiconductor member 501 is similar to that of the corresponding part of the first semiconductor member 430 in the second working example.

Also in the present example, the surface of the first semiconductor member 501 on the first Cu joining portion 502 side and the surface of the second semiconductor member 440 on the second Cu joining portion 426 side are joined to each other to produce the semiconductor device 500 similarly as in the second working example. Thereupon, if joining misalignment occurs between the two Cu joining portions, then a metal material such as Mn, Mg, Ti or Al in each Cu seed layer selectively reacts with oxygen of the interlayer insulating film to which the Cu seed layer opposes across the joining interface Sj in an annealing process upon joining. As a result, an interface Cu barrier film 505 is formed in a region of the joining interface Sj across which the first Cu joining portion 502 and the second interlayer insulating film 425 oppose to each other and a region of the joining interface Sj across which the second Cu joining portion 426 and the first interlayer insulating film 415 oppose to each other as shown in FIG. 27.

As described above, also in the semiconductor device 500 of the present example, the interface Cu barrier film 505 is provided in the region of the joining interface Sj across which the Cu joining portion of one of the semiconductor member and the interlayer insulating film of the other semiconductor member. Therefore, also with the present example, effects similar to those achieved by the second working example are achieved.

[Reference Example 2]

In the reference example 1, the Cu—Cu joining technique described hereinabove in connection with the second working example is applied to a semiconductor device wherein the surface shape and the dimension of the first Cu joining portion on the joining interface Sj side and those of the second Cu joining portion are same as each other. Here, another configuration example wherein the Cu—Cu joining technique described hereinabove in connection with the first working example is further combined with the semiconductor device 500 of the reference example 1 is described.

Figure 28:
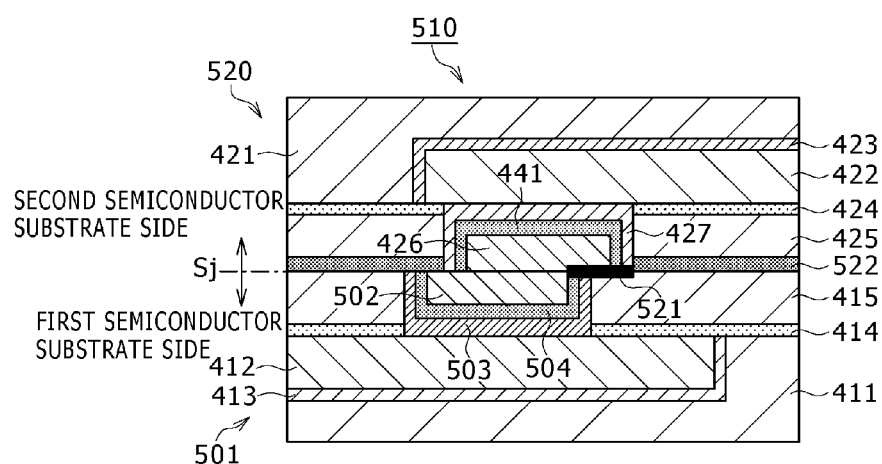

FIG. 28 shows an example of such an application as just described, that is, a reference example 2. It is to be noted that FIG. 28 shows a schematic cross section of the semiconductor device 510 of the present reference example 2 in the proximity of a joining interface Sj. It is to be noted that, in the semiconductor device 510 of the present reference example shown in FIG. 28, like elements to those of the semiconductor device 500 of the reference example 1 shown in FIG. 27 are denoted by like reference characters.

Referring to FIG. 28, the semiconductor device 510 of the present example includes a first semiconductor member 501, a second semiconductor member 520, and a first interface Cu barrier film 521. It is to be noted that the first semiconductor member 501 in the semiconductor device 510 of the present reference example has a configuration similar to that in the reference example 1 described hereinabove with reference to FIG. 27, and therefore, overlapping description of the first semiconductor member 501 is omitted herein to avoid redundancy.

The second semiconductor member 520 includes a second semiconductor substrate not shown, a second SiO2 layer 421, a second Cu wiring line portion 422, a second Cu barrier film 423, a second Cu diffusion preventing film 424, a second interlayer insulating film 425, a second Cu joining portion 426, a second Cu barrier layer 427, and a second Cu seed layer 441. Further, the second semiconductor member 520 includes a second interface Cu barrier film 522.

As can be recognized from comparison between FIGS. 28 and 27, the second semiconductor member 520 in the present reference example is configured such that the second interface Cu barrier film 522 is provided on the second interlayer insulating film 525 in the second semiconductor member 440 of the reference example 1. Further, in the present example, the second interface Cu barrier film 522 is formed such that the surface of the second Cu joining portion 426 on the joining interface Sj side and the surface of the second interface Cu barrier film 522 may be substantially in flush with each other. It is to be noted that the configuration of the other part of the second semiconductor member 520 than the second interface Cu barrier film 522 is similar to that of the corresponding part of the second semiconductor member 440 of the reference example 1 described hereinabove.

Further, the second interface Cu barrier film 522 can be formed from such a material as, for example, SiN, SiON, SiCN or an organic resin similarly to the interface Cu barrier layer 428 in the first working example. However, from a point of view of the close contactness with the Cu film, it is preferable to form the second interface Cu barrier film 522 from SiN.

Also in the present example, similarly as in the second working example, the semiconductor device 510 is produced by joining the surface of the first semiconductor member 501 on the first Cu joining portion 502 side and the surface of the second semiconductor member 520 on the second Cu joining portion 426 side to each other. Thereupon, if misalignment occurs between the two Cu joining portions, then by an annealing process upon joining, a metal material such as Mn, Mg, Ti or Al in the Cu seed layers selectively reacts with oxygen of the interlayer insulating film which opposes to the Cu seed layers across the joining interface Sj. As a result, a first interface Cu barrier film 521 is formed in a region of the joining interface Sj across which the Cu joining portion of one of the semiconductor members and the interlayer insulating film of the other semiconductor member oppose to each other.

However, in the present example, the second interface Cu barrier film 522 is provided on the surface of the second semiconductor member 520 on the joining interface Sj side as described hereinabove. Therefore, in the present example, the first interface Cu barrier film 521 is formed in one of the region of the joining interface Sj across which the first Cu joining portion 502 and the second interlayer insulating film 425 oppose to each other and the region of the joining interface Sj across which the second Cu joining portion 426 and the first interlayer insulating film 415 oppose to each other. Further, the second interface Cu barrier film 522 is disposed in the other of the region of the joining interface Sj across which the first Cu joining portion 502 and the second interlayer insulating film 425 oppose to each other and the region of the joining interface Sj across which the second Cu joining portion 426 and the first interlayer insulating film 415 oppose to each other. In the example shown in FIG. 28, the second interface Cu barrier film 522 is provided in the region of the former joining interface Sj, and the first interface Cu barrier film 521 is provided in the region of the latter joining interface Sj.

As described above, also in the semiconductor device 510 of the present example, the first interface Cu barrier film 521 or the second interface Cu barrier film 522 is provided in the region of the joining interface Sj across which the Cu joining portion of one of the semiconductor members and the interlayer insulating film of the other semiconductor member oppose to each other. Therefore, also with the present example, similar effects to those achieved by the first and second working examples can be achieved.

<<5. Forth Working Example>>

Figure 29:
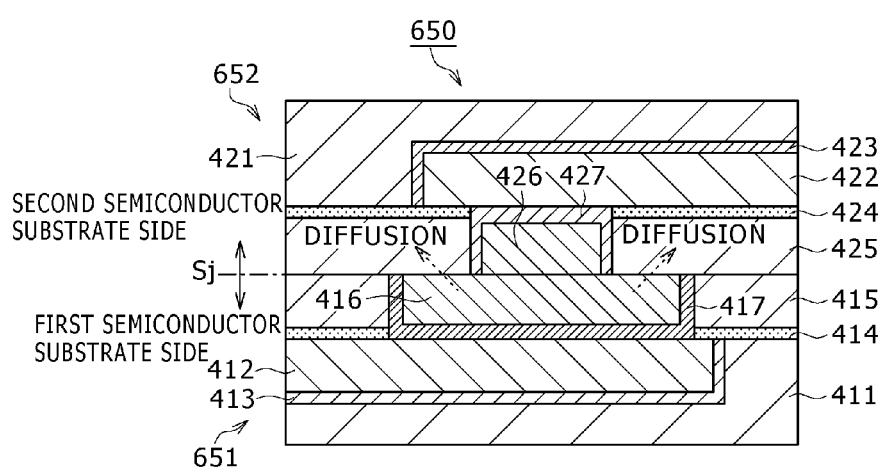
FIGS. 29 and 30 are schematic views illustrating problems which may occur in an existing Cu—Cu joining technique.

Usually, when a first semiconductor member and a second semiconductor member having Cu joining portions which have different areas from each other are bonded to each other to carry out Cu—Cu joining, the Cu joining portion of one of the semiconductor member and an interlayer insulating film of the other semiconductor member contact with each other. FIG. 29 shows a schematic cross section in the proximity of a joining interface in an example of the joining just described. It is to be noted that, in the semiconductor device 650 shown in FIG. 29, like elements to those in the semiconductor device 401 of the first working example described hereinabove with reference to FIG. 14 are denoted by like reference characters.

Referring to FIG. 29, Cu diffuses from a first Cu joining portion 416 having an area greater than that of a second Cu joining portion 426 into a second interlayer insulating film 425 as indicated by dotted line arrow marks in FIG. 29 and thereby deteriorates an electric characteristic at the joining interface Sj and degrades the reliability of the Cu joining portions and the semiconductor device 650. In contrast, in the working examples described above, an interface barrier film is formed along the joining interface between the first Cu joining portion 416 and the second interlayer insulating film 425 and can thereby prevent diffusion of Cu from the first Cu joining portion 416 into the second interlayer insulating film 425. Consequently, the problem described above can be solved.

Further, as another technique for preventing diffusion of Cu through the joining interface described above, a technique may be applicable wherein a first semiconductor member and a second semiconductor member are bonded to each other in a state in which the surface of an interlayer insulating film on the joining interface side of at least one of the first and second semiconductor members is retracted from the joining side face of the Cu joining portion. In other words, also a technique may be applicable wherein the first and second semiconductor members are bonded to each other in a state in which the Cu joining portion of at least one of the first and second semiconductor members is projected toward the joining interface side.

Figure 30:
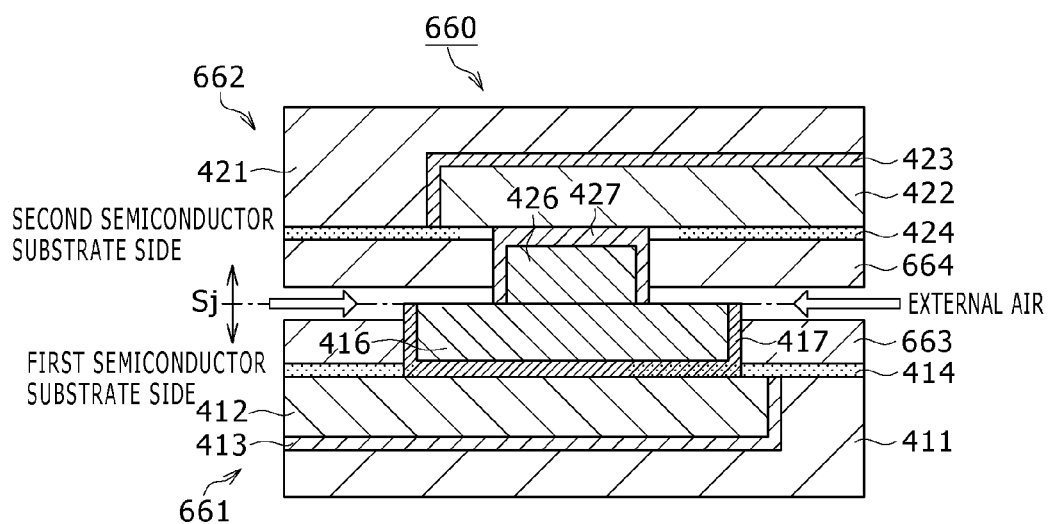

FIG. 30 shows a schematic cross section in the proximity of a joining interface in the case where a first semiconductor member and a second semiconductor member are bonded to each other in a state in which Cu joining portions of both the first and second semiconductor members are projected toward the joining interface side. It is to be noted that, in the semiconductor device 660 shown in FIG. 30, like elements to those of the semiconductor device 401 of the first working example shown in FIG. 14 are denoted by like reference characters.

In this instance, a gap is formed along the joining interface Sj between the first semiconductor member 661 and the second semiconductor member 662, particularly between a first interlayer insulating film 663 and a second interlayer insulating film 664. Consequently, an air gap is formed between the second interlayer insulating film 664 and the first Cu joining portion 416, and diffusion of Cu from the first Cu joining portion 416 into the second interlayer insulating film 664 is prevented. However, in this instance, external air enters the gap along the joining interface Sj as indicated by outline arrow marks and contaminates the surface of the first Cu joining portion 416. Consequently, an electric characteristic at the joining interface Sj is deteriorated and the reliability of the Cu joining portions and the semiconductor device is degraded.

Therefore, in the fourth working example, a semiconductor device wherein an air gap is formed between a second interlayer insulating film and a first Cu joining portion is configured such that it can prevent such an influence of external air as described above.

[Configuration of the Semiconductor Device]

Figure 31:
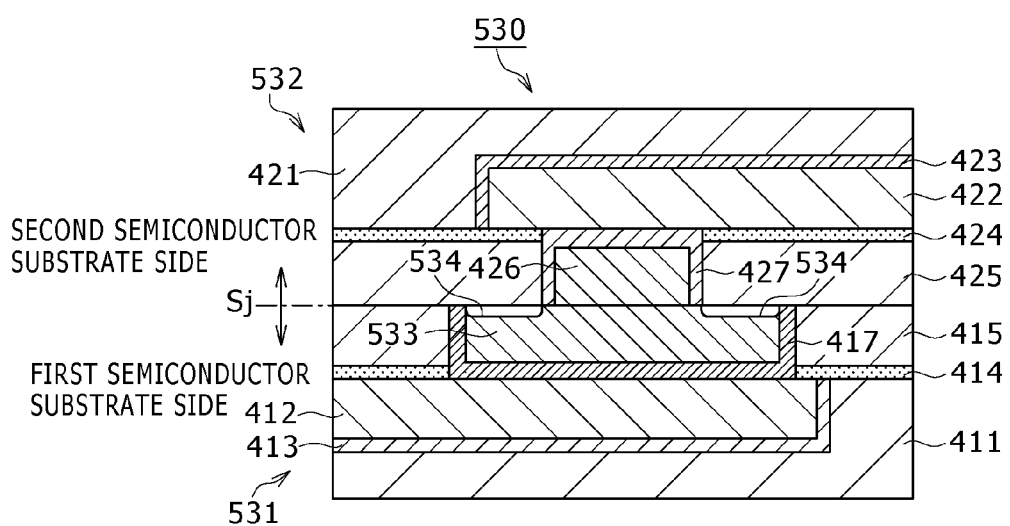
FIG. 31 is a schematic sectional view in the proximity of a joining interface of a semiconductor device according to a fourth working example of the third embodiment of the disclosed technology.
Figure 32:
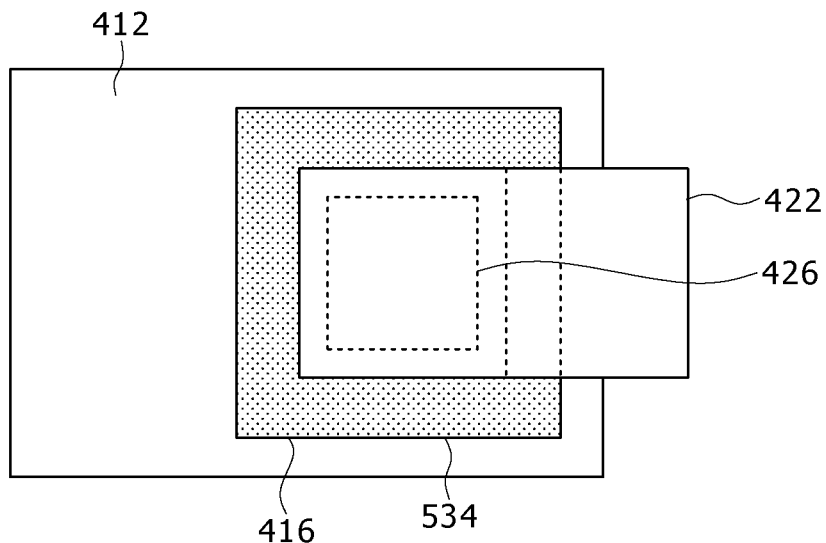
FIG. 32 is a schematic top plan view in the proximity of a joining interface of the semiconductor device of FIG. 31.

FIGS. 31 and 32 show a general configuration of a semiconductor device according to a fourth working example. Particularly, FIG. 31 shows a schematic cross section of the semiconductor device according to the fourth working example in the proximity of a joining interface, and FIG. 32 shows a schematic top plan in the proximity of the joining interface and illustrates an arrangement relationship of Cu joining portions and an air gap defined along the joining interface. It is to be noted that, in FIGS. 31 and 32, in order to simplify description, a configuration only in the proximity of one joining interface is shown. Further, in the semiconductor device 530 of the present working example shown in FIG. 31, like elements to those of the semiconductor device 401 of the first working example shown in FIG. 14 are denoted by like reference characters.

Referring first to FIG. 31, the semiconductor device 530 includes a first semiconductor member 531 which is a first semiconductor section and a second semiconductor member 532 which is a second semiconductor section.

The first semiconductor member 531 includes a first semiconductor substrate not shown, a first SiO2 layer 411, a first Cu wiring line portion 412, a first Cu barrier film 413, a first Cu diffusion preventing film 414, a first interlayer insulating film 415, a first Cu joining portion 533 and a first Cu barrier layer 417.

As apparent from comparison between FIGS. 31 and 14, the first semiconductor member 531 in the present working example is configured such that, on the surface area of the first semiconductor member 410 of the first example on the joining interface Sj side, a recessed portion is provided in the surface region of the first Cu joining portion 416 opposing to the second interlayer insulating film 425. The configuration of the other part of the first semiconductor member 531 than the configuration just described is similar to that of the corresponding part of the first semiconductor member 410 of the first working example described hereinabove.

The second semiconductor member 532 includes a second semiconductor substrate not shown, a second SiO2 layer 421, a second Cu wiring line portion 422, a second Cu barrier film 423, a second Cu diffusion preventing film 424, a second interlayer insulating film 425 and a second Cu joining portion 426.

As apparent from comparison between FIGS. 31 and 14, the second semiconductor member 532 in the present working example is configured such that the second semiconductor member 420 in the first working example does not include the interface Cu barrier film 428. The configuration of the other part of the second semiconductor member 532 than this is similar to that of the corresponding part of the second semiconductor member 420 in the first working example.

In the semiconductor device 530 in the present working example, in the surface region of the first semiconductor member 531 on the joining interface Sj side, a recessed portion 534 is provided in the surface region of the first Cu joining portion 533 opposing to the second interlayer insulating film 425 of the second semiconductor member 532 as seen in FIG. 31. Consequently, a structure can be formed wherein an air gap is formed in a region along the joining interface Sj across which the first Cu joining portion 533 of the first semiconductor member 531 and the second interlayer insulating film 425 of the second semiconductor member 532 oppose to each other and the first Cu joining portion 533 does not contact directly with the second interlayer insulating film 425.

In particular, in the semiconductor device 530 in the present working example, an interface barrier portion is configured from the recessed portion 534 of the first Cu joining portion 533 and the surface region portion, that is, the face region portion, on the joining interface Sj side of the second semiconductor member 532 opposing to the recessed portion 534. Further, in the present working example, the air gap defined by the recessed portion 534 of the first Cu joining portion 533 and the surface of the second interlayer insulating film 425 on the joining interface Sj side is placed in a state in which it is sealed by various films therearound as seen in FIG. 31.

[Fabrication Technique of the Semiconductor Device]

Now, a fabrication technique of the semiconductor device 530 in the present embodiment is described with reference to FIGS. 33A to 33D. It is to be noted that FIGS. 33A and 33B show cross sections in the proximity of a Cu joining portion of semiconductor members produced at different steps, and FIGS. 33C and 33D illustrate a manner of a joining process of the first semiconductor member 531 and the second semiconductor member 532.

Figure 33A:
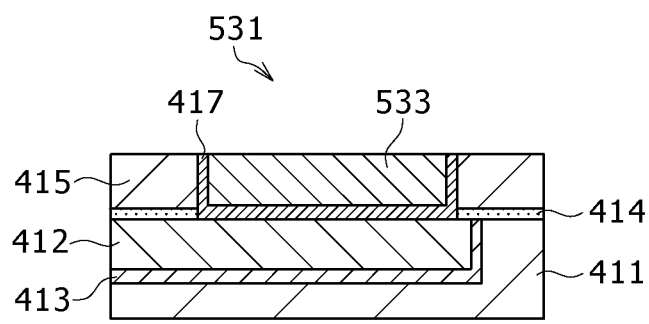
FIGS. 33A to 33D are schematic sectional views illustrating different steps of a production procedure of the semiconductor device of FIG. 31.

First, in the present working example, a first semiconductor member 531 is produced as seen in FIG. 33A in a similar manner as at the production step of the first semiconductor member 410 in the first working example described hereinabove with reference to FIGS. 16A to 16F.

Figure 33B:
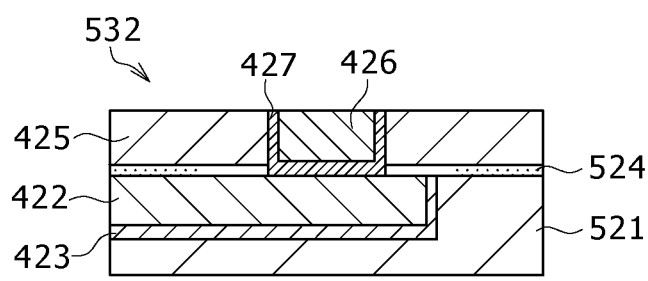
Figure 33C:
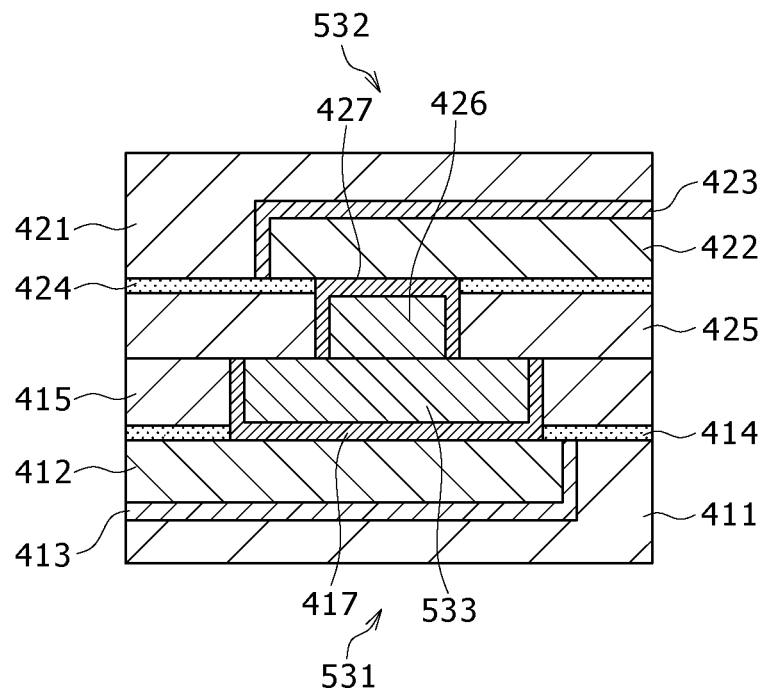
Figure 33D:
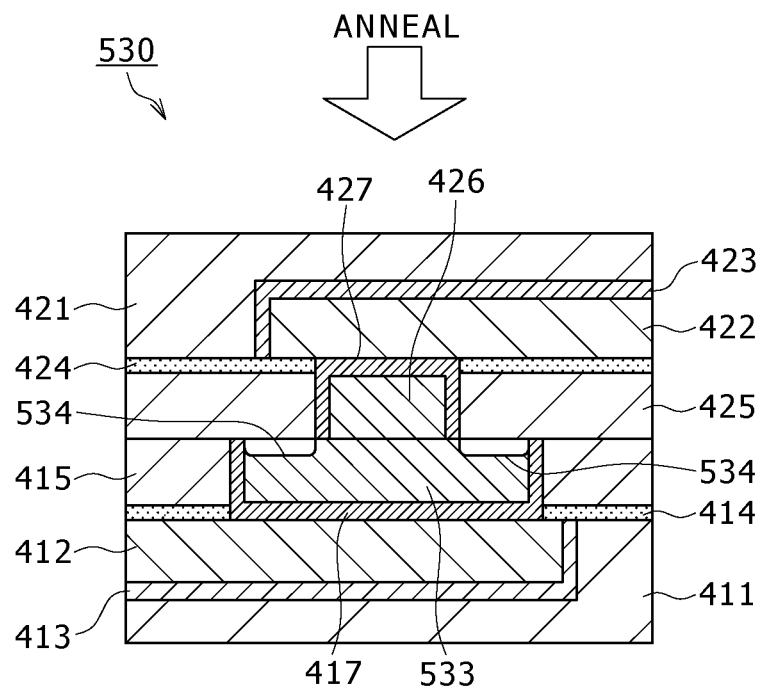

Further, in the present working example, a second semiconductor member 532 is produced as seen in FIG. 33B in a similar manner as at the production step of the first semiconductor member 410 in the first working example described hereinabove with reference to FIGS. 16A to 16F. It is to be noted, however, that, in this instance, at the step of forming an opening corresponding to a formation region of the second Cu joining portion 426 and the second Cu barrier layer 427 in the second interlayer insulating film 425 corresponding to the step of FIG. 16C, the opening diameter of the opening is set to approximately 1 to 95 μm.

Then, a reduction process is carried out for the surface of the first semiconductor member 531 on the first Cu joining portion 533 side and the surface of the second semiconductor member 532 on the second Cu joining portion 426 side to remove an oxide film or oxides on the surface of the Cu joining portions to expose clean Cu to the surface of the Cu joining portions. It is to be noted that, as the reduction process in this instance, a wet etching process in which solution of drug such as, for example, formic acid is used or a dry etching process in which plasma of, for example, Ar, NH3 or H2 is used is used.

Thereafter, the surface of the first semiconductor member 531 on the first Cu joining portion 533 side and the surface of the second semiconductor member 532 on the second Cu joining portion 426 side are contacted with each other or bonded to each other as seen in FIG. 33C.

Then, in the state in which the first semiconductor member 531 and the second semiconductor member 532 are bonded to each other, the bonded member is annealed using a heating apparatus or annealing apparatus such as, for example, a hot plate or a RTA apparatus to join the first Cu joining portion 533 and the second Cu joining portion 426 to each other as seen in FIG. 33D. In particular, the bonded member is heated at approximately 100 to 400° C. for approximately five minutes to two hours, for example, in an N2 atmosphere of the atmospheric pressure or in vacuum.

In the present working example, the Cu film of the first Cu joining portion 533 is further stiffened by the annealing process illustrated in FIG. 33D. It is to be noted that, on the joining interface Sj, the contact region between the first Cu joining portion 533 and the second interlayer insulating film 425 is lower in close contacting force than the other region. Therefore, by the annealing process illustrated in FIG. 33D, the first Cu joining portion 533 in the contact region contracts and the surface of the first Cu joining portion 533 retreats in a direction in which it is spaced away from the joining interface Sj. As a result, in the surface region of the first semiconductor member 531 on the joining interface Sj, a recessed portion 534 is formed in the surface region of the first Cu joining portion 533 opposing to the second interlayer insulating film 425 as seen in FIG. 33D.

In particular, by the annealing process illustrated in FIG. 33D, a structure is formed wherein an air gap is formed along the joining interface Sj between the first Cu joining portion 533 and the second interlayer insulating film 425 and is sealed in the semiconductor device 530 by various films therearound. It is to be noted that, in order to form the recessed portion 534 by the annealing process illustrated in FIG. 33D, preferably the annealing is carried out, for example, at a temperature higher than the annealing temperature of the annealing process carried out to form the Cu joining portions of fine film quality upon production of the semiconductor members.

In the present working example, a Cu—Cu joining process is carried out in such a manner as described above. It is to be noted that the other part of the fabrication process of the semiconductor device 530 other than the joining step described above may be similar to that of the fabrication technique of a currently available semiconductor device such as, for example, a solid-state image pickup device (refer to, for example, Japanese Patent Laid-Open No. 2007-234725).

As described above, the semiconductor device 530 in the present working example is structured such that an air gap is formed along the joining interface Sj between the first Cu joining portion 533 and the second interlayer insulating film 425 such that they do not contact directly with each other. Therefore, also in the present working example, diffusion of Cu from the first Cu joining portion 533 into the second interlayer insulating film 425 can be prevented similarly as in the first working example. It is to be noted that, since the region of the air gap formed along the joining interface Sj is sufficiently small in comparison with the overall region of the joining interface Sj, the close contact performance of the joining interface Sj in the configuration of the present working example is similar to that in the working examples described hereinabove.

Further, in the semiconductor device 530 of the present working example, the air gap formed along the joining interface Sj between the first Cu joining portion 533 and the second interlayer insulating film 425 is placed in a state in which it is sealed by various films therearound. Therefore, in the present working example, invasion of external air to the Cu joining portions can be prevented, and the reliability of the semiconductor device 530 can be assured.

<<6. Fifth Working Example>>

Another configuration example of a semiconductor device wherein an air gap is provided along a joining interface between a first Cu joining portion of a first semiconductor member and a second interlayer insulating film of a second semiconductor member is described as a fifth working example.

[Configuration of the Semiconductor Device]

Figure 34:
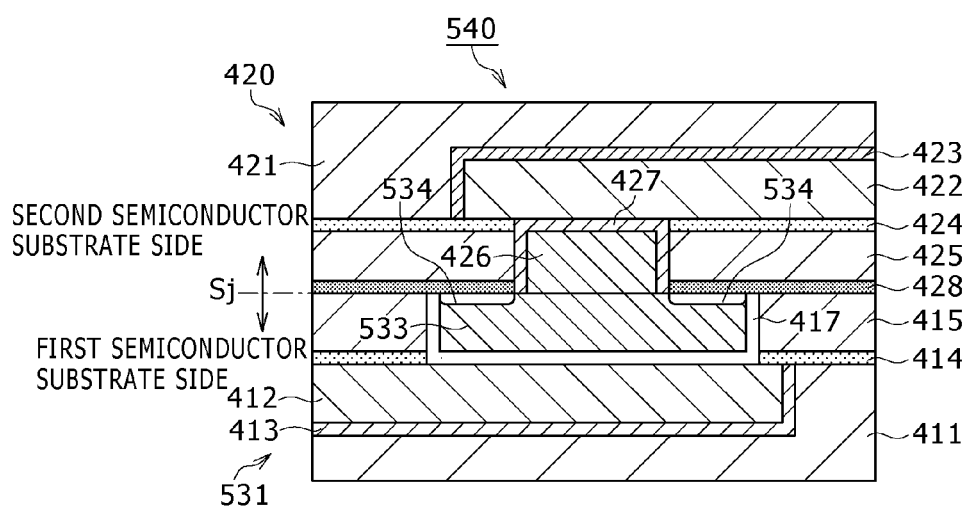
FIG. 34 is a schematic sectional view in the proximity of a joining interface of a semiconductor device according to a fifth working example of the third embodiment of the disclosed technology.
Figure 35:
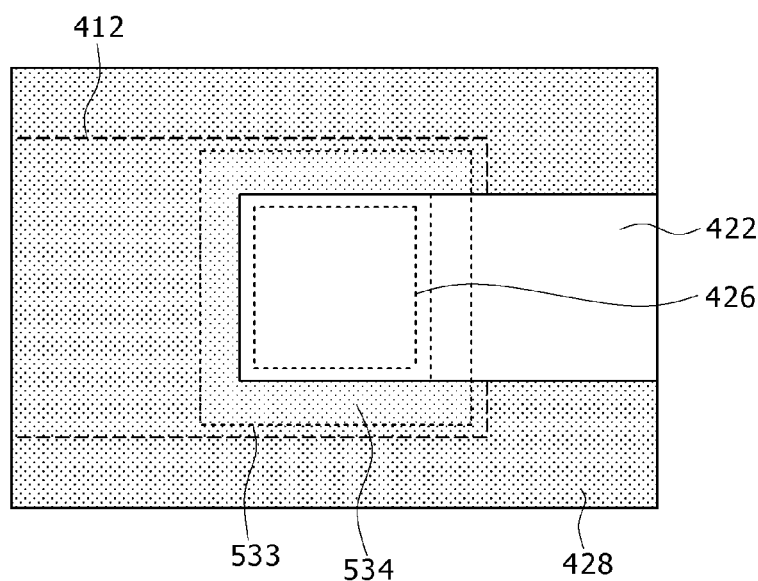
FIG. 35 is a schematic top plan view in the proximity of a joining interface of the semiconductor device of FIG. 34.

FIGS. 34 and 35 show a general configuration of a semiconductor device according to a fifth working example. Particularly, FIG. 34 shows a schematic cross section of the semiconductor device according to the fifth working example in the proximity of a joining interface, and FIG. 35 shows a schematic top plan in the proximity of the joining interface and illustrates an arrangement relationship of Cu joining portions and interface Cu barrier film to an air gap defined along the joining interface. It is to be noted that, in FIGS. 34 and 35, in order to simplify description, a configuration only in the proximity of one joining interface is shown. Further, in the semiconductor device 540 of the present working example shown in FIG. 34, like elements to those of the semiconductor device 530 of the fourth working example shown in FIG. 31 are denoted by like reference characters.

Referring first to FIG. 34, the semiconductor device 540 includes a first semiconductor member 531 which is a first semiconductor section and a second semiconductor member 420 which is a second semiconductor section.

The first semiconductor member 531 is similar in configuration to that in the fourth working example described hereinabove with reference to FIG. 31. In particular, the first semiconductor member 531 is configured such that, in the surface region on the joining interface Sj side of the first semiconductor member 410 in the first working example described hereinabove with reference to FIG. 14, a recessed portion 534 is provided in the surface region of the first Cu joining portion 533 opposing to the second interlayer insulating film 425 of the second semiconductor member 420.

Meanwhile, the second semiconductor member 420 has a configuration similar to that in the first working example described hereinabove with reference to FIG. 14 in that the interface Cu barrier film 428 is provided on the surface of the second interlayer insulating film 425 on the joining interface Sj side.

In the semiconductor device 540 in the present working example, in the surface region of the first semiconductor member 531 on the joining interface Sj, the recessed portion 534 is provided in the surface region of the first Cu joining portion 533 opposing to the interface Cu barrier film 428 of the second semiconductor member 420 as described above. Consequently, an air gap is formed along the joining interface Sj across which the first Cu joining portion 533 of the first semiconductor member 531 and the interface Cu barrier film 428 of the second semiconductor member 420 oppose to each other. Further, in the present working example, the air gap defined by the recessed portion 534 of the first Cu joining portion 533 and the surface of the interface Cu barrier film 428 on the joining interface Sj side is placed in a state in which it is sealed by various films therearound as seen in FIG. 34.

In particular, also in the present working example, an interface barrier portion is configured from the recessed portion 534 of the first Cu joining portion 533 and the surface region portion or face region portion on the joining interface Sj side of the second semiconductor member 420 opposing to the recessed portion 534. Further, in the present working example, diffusion of Cu from the first Cu joining portion 533 into the second interlayer insulating film 425 is prevented by the air gap formed in the surface barrier portion and also by the interface Cu barrier film 428.

[Fabrication Technique of the Semiconductor Device]

Now, a fabrication technique of the semiconductor device 540 in the present working example is described with reference to FIGS. 36A to 36D. It is to be noted that FIGS. 36A and 36B show schematic cross sections in the proximity of a Cu joining portion of semiconductor members produced at different steps, and FIGS. 36C and 36D illustrate a manner of a joining process between the first semiconductor member 531 and the second semiconductor member 420.

Figure 36A:
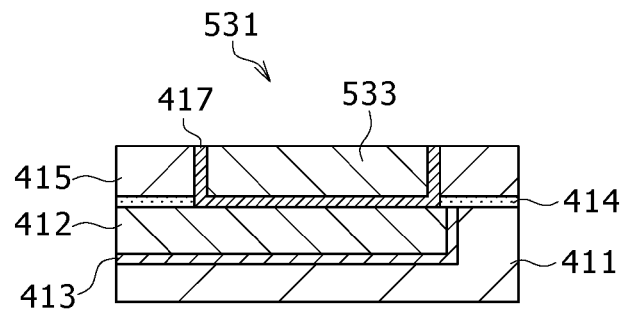
FIGS. 36A to 36D are schematic sectional views illustrating different steps of a production procedure of the semiconductor device of FIG. 34.

First, in the present working example, a first semiconductor member 531 is produced as seen in FIG. 36A in a similar manner as at the production step of the first semiconductor member 410 in the first working example described hereinabove with reference to FIGS. 16A to 16F.

Figure 36B:
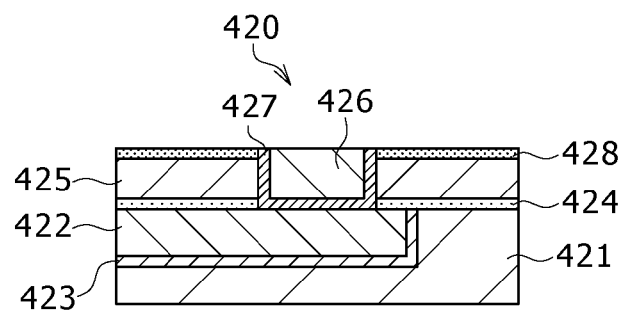
Figure 36C:
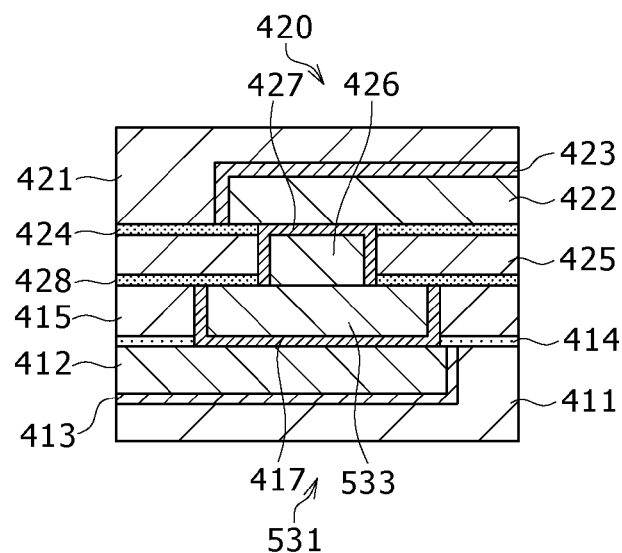
Figure 36D:
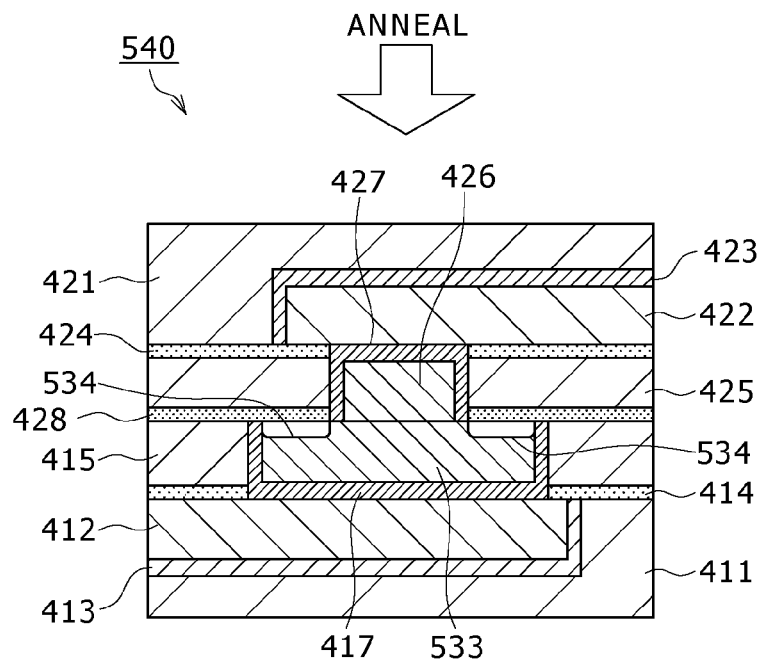

Further, in the present working example, a second semiconductor member 420 is produced as seen in FIG. 36B in a similar manner as at the production step of the second semiconductor member 420 in the first working example described hereinabove with reference to FIGS. 16G to 16L. However, in the present working example, the film thickness of the interface Cu barrier film 428 which may be, for example, a SiN film or a SiCN film is approximately 10 to 100 nm, and an interface Cu barrier film 428 is formed by a CVD method or a spin coating method. Further, in the present working example, at the step of forming an opening corresponding to a formation region for the second Cu joining portion 426 and the second Cu barrier layer 427 in the second interlayer insulating film 425 corresponding to the step of FIG. 16I, the opening diameter of the opening is set to approximately 4 to 100 μm.

Then, a reduction process is carried out for the surface of the first semiconductor member 531 on the first Cu joining portion 533 side and the surface of the second semiconductor member 420 on the second Cu joining portion 426 side to remove an oxide film or oxides on the surface of the Cu joining portions to expose clean Cu to the surface of the Cu joining portions. It is to be noted that, as the reduction process in this instance, a wet etching process in which solution of drug such as, for example, formic acid is used or a dry etching process in which plasma of, for example, Ar, NH3 or H2 is used is used.

Thereafter, the surface of the first semiconductor member 531 on the first Cu joining portion 533 side and the surface of the second semiconductor member 420 on the second Cu joining portion 426 side are contacted with each other or bonded to each other as seen in FIG. 36C.

Then, in the state in which the first semiconductor member 531 and the second semiconductor member 420 are bonded to each other, the bonded member is annealed using a heating apparatus or annealing apparatus such as, for example, a hot plate or a RTA apparatus to join the first Cu joining portion 533 and the second Cu joining portion 426 to each other as seen in FIG. 36D. In particular, the bonded member is heated at approximately 100 to 400° C. for approximately five minutes to two hours, for example, in an N2 atmosphere of the atmospheric pressure or in vacuum.

In the present working example, the Cu film of the first Cu joining portion 533 is further stiffened by the annealing process illustrated in FIG. 36D similarly as in the fourth working example described hereinabove. Thereupon, in the contact region between the first Cu joining portion 533 and the interface Cu barrier film 428 on the joining interface Sj, the first Cu joining portion 533 contracts and the surface of the first Cu joining portion 533 retreats in a direction in which it is spaced away from the joining interface Sj. As a result, in the surface region of the first semiconductor member 531 on the joining interface Sj, a recessed portion 534 is formed in the surface region of the first Cu joining portion 533 opposing to the interface Cu barrier film 428 as seen in FIG. 36D.

In particular, by the annealing process illustrated in FIG. 36D, a structure is formed wherein an air gap is formed along the joining interface Sj between the first Cu joining portion 533 and the interface Cu barrier film 428 and is sealed in the semiconductor device 540 by various films therearound. It is to be noted that, in order to form the recessed portion 534 by the annealing process illustrated in FIG. 36D, preferably the annealing is carried out, for example, at a temperature higher than the annealing temperature of the annealing process carried out to form the Cu joining portions of fine film quality upon production of the semiconductor members.

In the present working example, a Cu—Cu joining process is carried out in such a manner as described above. It is to be noted that the other part of the fabrication process of the semiconductor device 540 other than the joining step described above may be similar to that of the fabrication technique of a currently available semiconductor device such as, for example, a solid-state image pickup device (refer to, for example, Japanese Patent Laid-Open No. 2007-234725).

As described above, the semiconductor device 540 in the present working example is structured such that an air gap is formed in a region along the joining interface Sj between the first Cu joining portion 533 and the interface Cu barrier film 428 such that they do not contact directly with each other. Further, in the present working example, the interface Cu barrier film 428 is formed in the region opposing to the recessed portion 534 of the first Cu joining portion 533. Therefore, in the present working example, diffusion of Cu from the first Cu joining portion 533 into the second interlayer insulating film 425 can be prevented with a higher degree of certainty.

Further, in the semiconductor device 540 of the present working example, the air gap formed along the joining interface Sj between the first Cu joining portion 533 and the interface Cu barrier film 428 is placed in a state in which it is sealed by various films therearound. Therefore, in the present working example, invasion of external air to the Cu joining portions can be prevented similarly as in the fourth working example described above, and the reliability of the semiconductor device 540 can be assured.

It is to be noted that, while, in the present working example, the formation technique of an interface barrier portion described hereinabove in connection with the fourth working example is applied to the semiconductor device 401 of the first working example described hereinabove with reference to FIG. 14, the present disclosure is not limited to this. For example, the formation technique of an interface barrier portion described hereinabove in connection with the fourth working example may be applied also to the semiconductor device 402 of the second working example described hereinabove with reference to FIG. 17 or the semiconductor device 403 of the third working example described hereinabove with reference to FIG. 20. Further, the formation technique of an interface barrier portion described hereinabove in connection with the fourth working example may be applied, for example, also to the various semiconductor devices of the modifications described hereinabove with reference to FIGS. 23 to 26 and so forth.

Further, the formation technique of an interface barrier portion described hereinabove in connection with the fourth working example may be applied also to the semiconductor device of the various reference examples described hereinabove with reference to FIGS. 27 and 34. However, in this instance, a recessed portion is formed not only on the surface region of the first Cu joining portion opposing to the second interlayer insulation film but also in the surface region of the second Cu joining portion opposing to the first interlayer insulating film along the joining interface Sj.

<<7. Applications>>

The semiconductor devices and the fabrication techniques for the semiconductor device, that is, the Cu—Cu joining techniques, described hereinabove in connection with the various working examples and modifications can be applied to various electronic apparatus which require bonding of two substrates to carry out a Cu—Cu joining process upon fabrication. Particularly, the Cu—Cu joining techniques of the working examples and the modifications described hereinabove can be applied suitably to fabrication of, for example, a solid-state image pickup device.

[Application 1]

Figure 37:
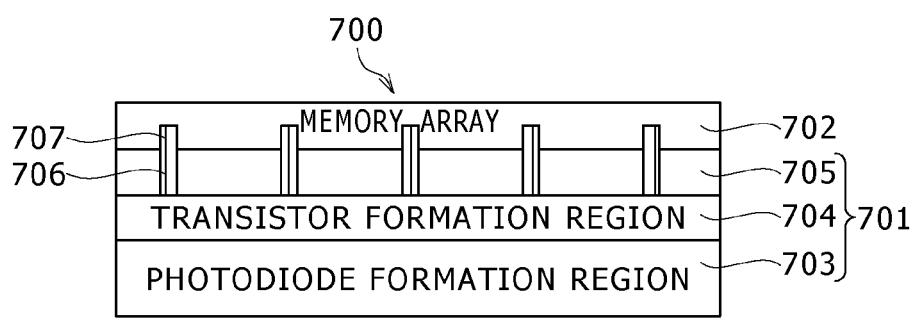
FIG. 37 is a schematic sectional view showing an example of a configuration of a semiconductor device of an application example 1 to which the Cu—Cu joining technique of the disclosed technology can be applied.

FIG. 37 shows an example of a configuration of a semiconductor image sensor module to which the semiconductor devices and the fabrication techniques for the semiconductor device described hereinabove in connection with the various working examples and modifications can be applied. Referring to FIG. 37, the semiconductor image sensor module 700 is configured from a first semiconductor chip 701 and a second semiconductor chip 702 joined together.

The first semiconductor chip 701 has a photodiode formation region 703, a transistor formation region 704 and an analog/digital converter array 705 built therein. The transistor formation region 704 and the analog/digital converter array 705 are laminated in order on the photodiode formation region 703.

Penetrating contact portions 706 are formed in the analog/digital converter array 705. Each of the penetrating contact portions 706 is formed such that it is exposed at one end portion thereof to the surface of the analog/digital converter array 705 on the second semiconductor chip 702 side.

Meanwhile, the second semiconductor chip 702 is configured from a memory array and has contact portions 707 formed in the inside thereof. Each of the contact portions 707 is formed such that it is exposed at one end portion thereof to the surface of the second semiconductor chip 702 on the first semiconductor chip 701 side.

Then, the penetrating contact portions 706 and the contact portions 707 are heated and contact bonded to each other in a state in which they are abutted with each other to join the first semiconductor chip 701 and the second semiconductor chip 702 to each other thereby to produce the semiconductor image sensor module 700. With the semiconductor image sensor module 700 having such a configuration as described above, the number of pixels per unit area can be increased and the thickness can be reduced.

In the semiconductor image sensor module 700 of the present application, the Cu—Cu joining techniques of the working examples and the modifications described hereinabove can be applied, for example, to the joining step between the first semiconductor chip 701 and the second semiconductor chip 702. In this instance, the reliability of the joining interface between the first semiconductor chip 701 and the second semiconductor chip 702 can be improved further.

[Application 2]

Figure 38:
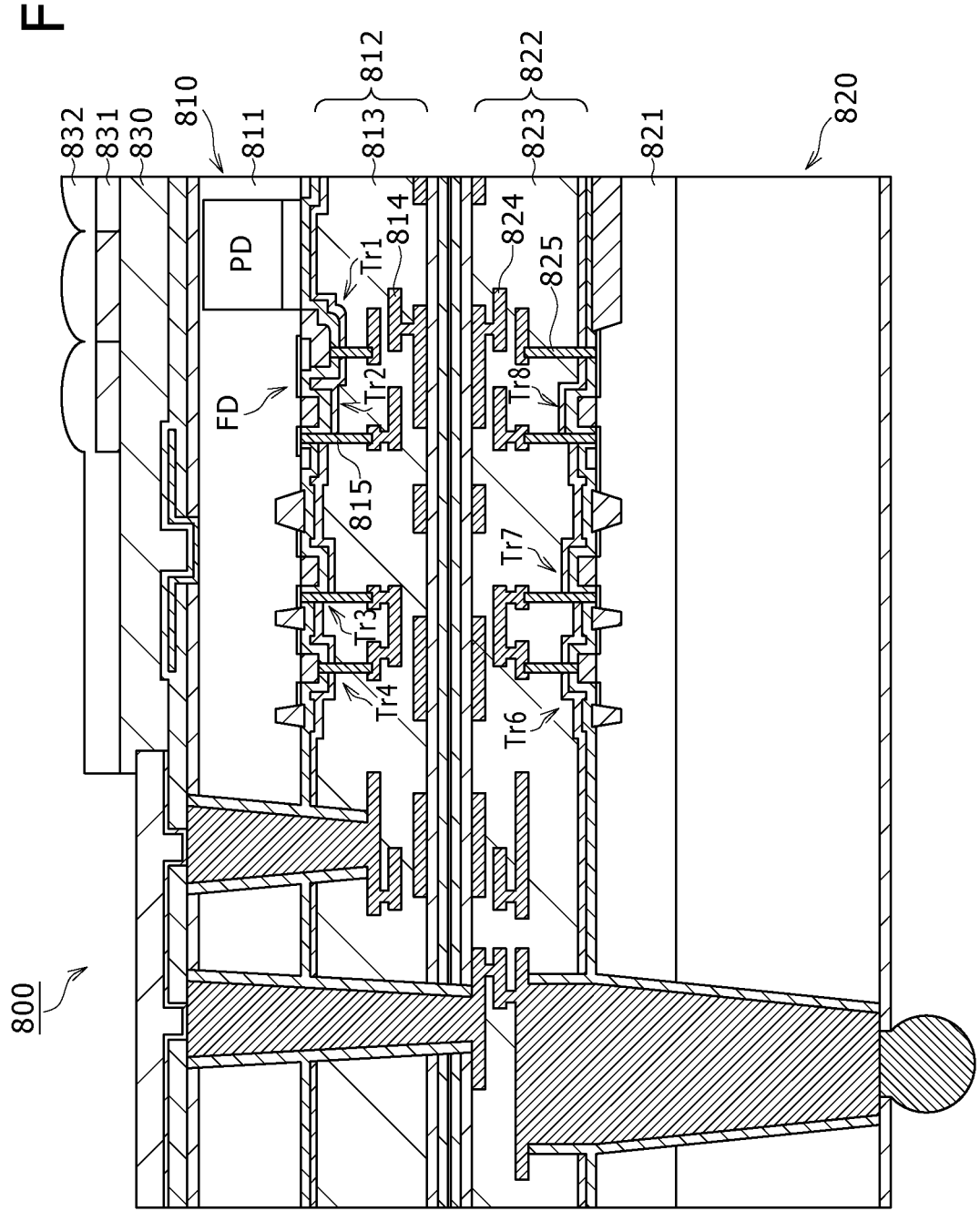
FIG. 38 is a schematic sectional view showing an example of a configuration of a semiconductor device of an application example 2 to which the Cu—Cu joining technique of the disclosed technology can be applied.

FIG. 38 shows a schematic cross section of part of a solid-state image pickup device of the backside illumination type to which the semiconductor devices and the fabrication techniques for the semiconductor device, that is, the Cu—Cu joining techniques, described hereinabove in connection with the various working examples and modifications can be applied.

Referring to FIG. 38, the solid-state image pickup device 800 shown is configured by joining a first semiconductor substrate 810 in the form of a partially fabricated item including a pixel array and a second semiconductor substrate 820 in the form of a partially fabricated item including a logic circuit to each other. It is to be noted that, in the solid-state image pickup device 800 shown in FIG. 38, a flattening film 830, an on-chip color filter 831 and an on-chip microlens array 832 are laminated in this order on a face of the first semiconductor substrate 810 opposite to the second semiconductor substrate 820.

The first semiconductor substrate 810 includes a semiconductor well region 811 of the P type and a multilayer wiring line layer 812. The semiconductor well region 811 is disposed on the first semiconductor substrate 810 on the flattening film 830 side. In the semiconductor well region 811, for example, a photodiode (PD), a floating diffusion (FD), MOS transistors (Tr1 and Tr2) which configure a pixel and MOS transistors (Tr3 and Tr4) which configure a control circuit are formed. Meanwhile, in the multilayer wiring line layer 812, a plurality of metal wiring lines 814 are formed with an interlayer insulating film 813 interposed therebetween and connecting conductors 815 are formed in the interlayer insulating film 813 in order to connect the metal wiring lines 814 and corresponding MOS transistors to each other.

Meanwhile, the second semiconductor substrate 820 includes a semiconductor well region 821 formed, for example, in the surface of a silicon substrate and a multilayer wiring line layer 822 formed in the semiconductor well region 821 on the first semiconductor substrate 810 side. In the semiconductor well region 821, MOS transistors (Tr6, Tr7 and Tr8) which configure a logic circuit are formed. Meanwhile, in the multilayer wiring line layer 822, a plurality of metal wiring lines 824 are formed with an interlayer insulating film 823 interposed therebetween and connecting conductors 825 are formed in the interlayer insulating film 823 in order to connect the metal wiring lines 824 to corresponding MOS transistors.

The Cu—Cu joining techniques of the working examples and the modifications according to the present disclosure described hereinabove can be applied also to the solid-state image pickup device 800 of the backside illumination type of the configuration described above.

Fourth Embodiment

<<1. Outline of the Semiconductor Device>>

An outline of a configuration of a joining electrode of a semiconductor device is described.

Figure 39:
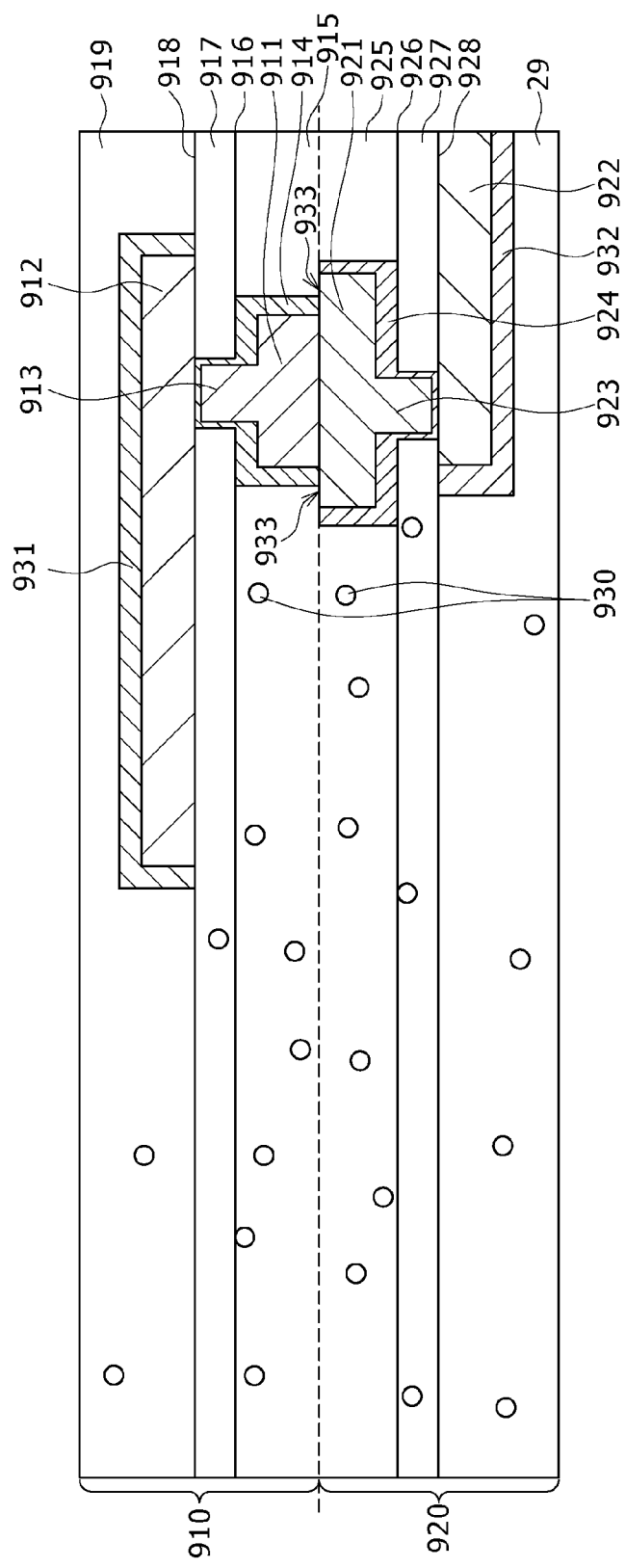
FIG. 39 is a schematic sectional view showing a general configuration of a joining electrode of a semiconductor device according to a fourth embodiment of the disclosed technology.

FIG. 39 shows a general configuration of a joining electrode and particularly shows a cross sectional configuration of a joining portion including a joining electrode.

A first joining portion 910 is formed on a semiconductor substrate not shown. The first joining portion 910 includes a first wiring line layer 912, and a first joining electrode 911 connected to the first wiring line layer 912 through a via 913.

The first wiring line layer 912 is formed in a interlayer insulating layer 919. An interlayer insulating layer 17 is formed on the interlayer insulating layer 919 with an intermediate layer 918 interposed therebetween. Another interlayer insulating layer 915 is provided on the interlayer insulating layer 17 with an intermediate layer 916 interposed therebetween.

The first joining electrode 911 is formed in the interlayer insulating layer 915, and the surface of the first joining electrode 911 is exposed to the surface of the interlayer insulating layer 915. This exposed face is formed in flush with the surface of the interlayer insulating layer 915.

The first wiring line layer 912 and the first joining electrode 911 are electrically connected to each other through the via 913 which extends through the intermediate layer 916, interlayer insulating layer 917 and intermediate layer 918.

A barrier metal layer 914 for preventing diffusion of an electrode material into an insulating layer is provided between the first joining electrode 911 and via 913 and the interlayer insulating layers 915 and 917 and intermediate layer 916. Further, another barrier metal layer 931 is provided between the first wiring line layer 912 and the interlayer insulating layer 919.

A second joining portion 920 is formed on a semiconductor substrate not shown similarly to the first joining portion 910 described hereinabove. The second joining portion 920 includes a second wiring line layer 922 and a second joining electrode 921 connected to the second wiring line layer 922 through a via 923.

The second wiring line layer 922 is formed in a interlayer insulating layer 929. Another interlayer insulating layer 927 is formed on the interlayer insulating layer 929 with an intermediate layer 928 interposed therebetween. A further interlayer insulating layer 925 is provided on the interlayer insulating layer 927 with an intermediate layer 926 interposed therebetween.

The second joining electrode 921 is formed in the interlayer insulating layer 925 such that the surface thereof is exposed from the surface of the interlayer insulating layer 925. This exposed face is formed in flush with the surface of the interlayer insulating layer 925.

The second wiring line layer 922 and the second joining electrode 921 are electrically connected to each other through the via 923 extending through the intermediate layer 926, interlayer insulating layer 927 and intermediate layer 928.

A barrier metal layer 924 for preventing diffusion of an electrode material into an insulating layer is provided between the second joining electrode 921 and via 923 and the interlayer insulating layers 925 and 927 and intermediate layer 926. Another barrier metal layer 932 is provided between the second wiring line layer 922 and the interlayer insulating layer 929.

As described above, the first joining portion 910 and the second joining portion 920 are bonded to each other in the state in which the first joining electrode 911 and the second joining electrode 921 are joined together.

Further, the first joining electrode 911 and the second joining electrode 921 are designed such that the area of one of them is greater than that of the other of them such that, even if the joining position between them is displaced, no difference occurs with the joining area between them in order to assure high joining reliability. With the configuration shown in FIG. 39, since the second joining electrode 921 has the greater area, connection reliability against the positional displacement is assured.

In the configuration shown in FIG. 39, since the first joining electrode 911 and the second joining electrode 921 have an area difference therebetween as described hereinabove, the second joining electrode 921 having a greater area has, on the surface thereof, a contacting portion 933 which contacts directly with the interlayer insulating layer 915 of the first joining portion 910.

This contacting portion 933 contacts at a metal layer of Cu or the like thereof directly with the interlayer insulating layer 915.

Further, since SiO2 which configures the interlayer insulating layer 915 and so forth generally has a nature that it is liable to absorb moisture, water (H2O) is liable to be included in the layers. Further, a low-k (k <2.4) material used for high performance devices in recent years has a further high moisture absorbing property.

Therefore, on the contacting portion 933 on which the second joining electrode 921 and the interlayer insulating layer 915 contact directly with each other, water 930 included in the interlayer insulating layer 915 and so forth and the second joining electrode 921 contact with each other. In this instance, there is the possibility that the metal such as Cu which configures the second joining electrode 921 may corrode.

As described above, in a semiconductor device of the configuration wherein semiconductor substrates contact at joining electrodes of metal thereof with each other, corrosion of the joining electrodes by water included in the interlayer insulating layers occurs. If the joining electrodes are corroded by water, then this gives rise to increase in resistance, failure in connection and so forth, which make a cause of obstruction to a normal function of the semiconductor devices.

Therefore, for the semiconductor devices joined together at the joining electrodes, a configuration for preventing corrosion of the joining electrodes by water included in the interlayer insulating layers is demanded.

<<2. Embodiment of the Semiconductor Device>>

In the following, a semiconductor device according to the present embodiment having a joining electrode is described.

Figure 40A:
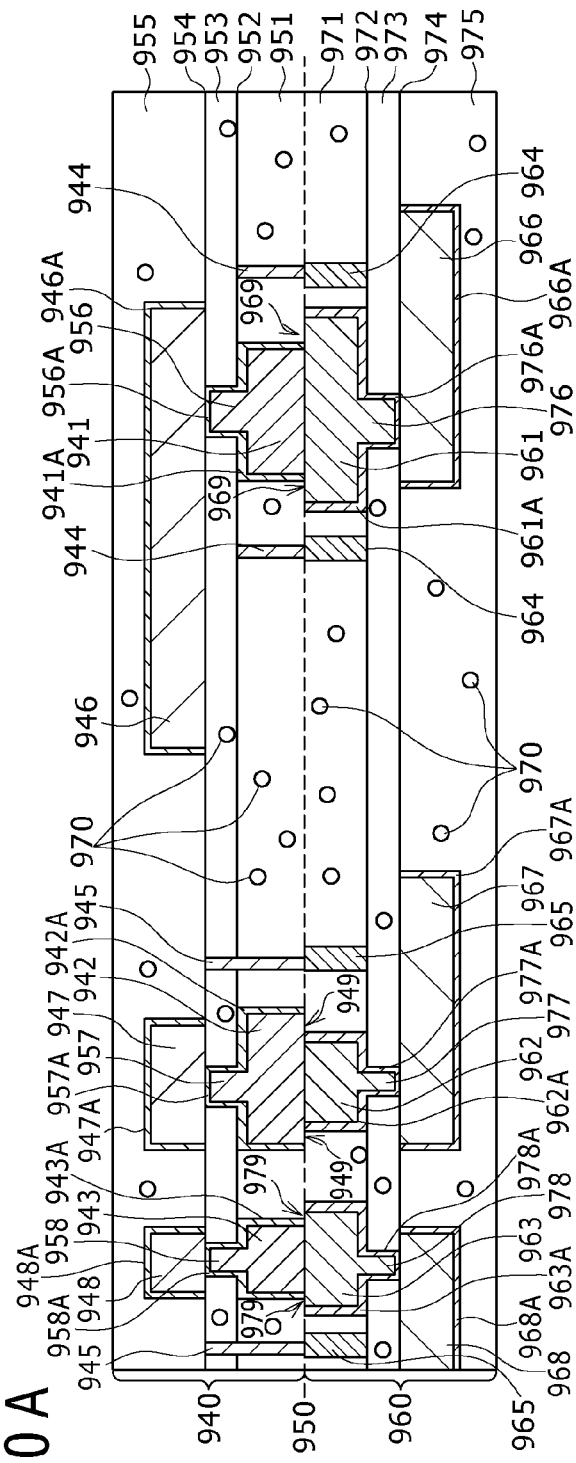
FIG. 40A is a schematic sectional view showing a general configuration of the semiconductor device including the joining electrode of FIG. 39
Figure 40B:
FIG. 40B is a plan view of a joining face of a first joining portion shown in FIG. 40A.

FIGS. 40A and 40B show a general configuration of a semiconductor device which includes a joining electrode according to the present embodiment. In particular, FIG. 40A shows a general configuration of the semiconductor device in the proximity of a joining electrode region of the semiconductor device of the present embodiment and FIG. 40B shows a top plan of a joining face 950 of a first joining portion 940 shown in FIG. 40A. It is to be noted that FIGS. 40A and 40B only show a general configuration in the proximity of a formation region of a joining electrode while components provided around the semiconductor substrates on which the joining electrodes are formed and the joining electrodes are omitted.

Referring first to FIG. 40A, a semiconductor device is formed wherein a first joining portion 940 and a second joining portion 960 are joined together with electrode formation faces thereof opposed to each other.

The first joining portion 940 includes a first joining electrode 941, a second joining electrode 942 and a third joining electrode 943 on a joining face 950. Meanwhile, the second joining portion 960 includes a fourth joining electrode 961, a fifth joining electrode 962 and a sixth joining electrode 963 on the joining face 950.

The first joining electrode 941 of the first joining portion 940 and the fourth joining electrode 961 of the second joining portion 960 are joined together. Further, the second joining electrode 942 and the fifth joining electrode 962 are joined together, and the third joining electrode 943 and the sixth joining electrode 963 are joined together.

[Insulating Layer]

Each of the first joining portion 940 and the second joining portion 960 is configured from a plurality of wiring line layers and insulating layers laminated on each other.

The insulating layers of the first joining portion 940 include a first interlayer insulating layer 951, a first intermediate layer 952, a second interlayer insulating layer 953, a second intermediate layer 954 and a third interlayer insulating layer 955 laminated in this order from the joining face 950 side. Meanwhile, the insulating layers of the second joining portion 960 include a fourth interlayer insulating layer 971, a third intermediate layer 972, a fifth interlayer insulating layer 973, a fourth intermediate layer 974 and a sixth interlayer insulating layer 975 laminated in this order from the joining face 950 side.

[Conductor Layer: First Joining Portion]

The first joining electrode 941, second joining electrode 942 and third joining electrode 943 of the first joining portion 940 are formed in the first interlayer insulating layer 951. The first joining electrode 941, second joining electrode 942 and third joining electrode 943 are exposed at the surface thereof to the joining face 950 and formed in flush with the first interlayer insulating layer 951.

A first wiring line 946, a second wiring line 947 and a third wiring line 948 are formed at positions in the third interlayer insulating layer 955 in a contacting relationship with the second intermediate layer 954.

The first joining electrode 941 and the first wiring line 946 are electrically connected to each other through a first via 956 extending through the first intermediate layer 952, second interlayer insulating layer 953 and second intermediate layer 954. Similarly, the second joining electrode 942 and the second wiring line 947 are electrically connected to each other through a second via 957. The third joining electrode 943 and the third wiring line 948 are electrically connected to each other through a third via 958.

Further, a barrier metal layer 941A for preventing diffusion of the first joining electrode 941 into the first interlayer insulating layer 951 is provided between the first joining electrode 941 and the first interlayer insulating layer 951. Meanwhile, barrier metal layers 942A and 943A are provided between the second joining electrode 942 and third joining electrode 943 and the first interlayer insulating layer 951. Further, a barrier metal layer 946A is provided between the first wiring line 946 and the third interlayer insulating layer 955; a barrier metal layer 947A is provided between the second wiring line 947 and the third interlayer insulating layer 955; and a barrier metal layer 948A is provided between the third wiring line 948 and the third interlayer insulating layer 955.

Further, barrier metal layers 956A, 957A and 958A are provided between the first, second and third vias 956, 957 and 958 and the first intermediate layer 952, second interlayer insulating layer 953 and second intermediate layer 954, respectively. The first, second and third vias 956, 957 and 958 are connected to the first, second and third wiring lines 946, 947 and 948 through the barrier metal layers 956A, 957A and 958A, respectively.

[Conductor Layer: Second Joining Portion]

The fourth joining electrode 961, fifth joining electrode 962 and sixth joining electrode 963 of the second joining portion 960 are formed in the fourth interlayer insulating layer 971. The fourth joining electrode 961, fifth joining electrode 962 and sixth joining electrode 963 are exposed at the surface thereof to the joining face 950 and formed in flush with the fourth interlayer insulating layer 971.

A fourth wiring line 966, a fifth wiring line 967 and a sixth wiring line 968 are formed at positions in the sixth interlayer insulating layer 975 in a contacting relationship with the fourth intermediate layer 974.

The fourth joining electrode 961 and the fourth wiring line 966 are electrically connected to each other through a fourth via 976 extending through the third intermediate layer 972, fifth interlayer insulating layer 973 and fourth intermediate layer 974. Similarly, the fifth joining electrode 962 and the fifth wiring line 967 are electrically connected to each other through a fifth via 977. The sixth joining electrode 963 and the sixth wiring line 968 are electrically connected to each other through a sixth via 978.

A barrier metal layer 961A for preventing diffusion of the fourth joining electrode 961 into the fourth interlayer insulating layer 971 is provided between the fourth joining electrode 961 and the fourth interlayer insulating layer 971. Further, barrier metal layers 962A and 963A are provided between the fifth and sixth joining electrodes 962 and 963 and the fourth interlayer insulating layer 971, respectively. Further, a barrier metal layer 966A is provided between the fourth wiring line 966 and the sixth interlayer insulating layer 975; a barrier metal layer 967A is provided between the fifth wiring line 967 and the sixth interlayer insulating layer 975; and a barrier metal layer 968A is provided between the sixth wiring line 968 and the sixth interlayer insulating layer 975.

Also between the fourth, fifth and sixth vias 976, 977 and 978 and the third intermediate layer 972, fifth interlayer insulating layer 973 and fourth intermediate layer 974, barrier metal layers 976A, 977A and 978A are provided respectively. The fourth, fifth and sixth vias 976, 977 and 978 are connected to the fourth, fifth and sixth wiring lines 966, 967 and 968 through the barrier metal layers 976A, 977A and 978A, respectively.

[Material]

The first, second, third, fourth, fifth and sixth wiring lines 946, 947, 948, 966, 967 and 968 are formed from a material used popularly for wiring lines of a semiconductor device such as, for example, Al or Cu.

Meanwhile, the first, second, third, fourth, fifth and sixth joining electrodes 941, 942, 943, 961, 962 and 963 are formed from a dielectric material which allows joining of a semiconductor substrate thereto such as, for example, Cu.

The barrier metal layers are formed from a material which is used popularly for barrier metal layers in a semiconductor device such as, for example, Ta, Ti, Ru, TaN or TiN.

The first, second, third, fourth, fifth and sixth interlayer insulating layers 951, 953, 955, 971, 973 and 975 are configured, for example, from SiO2, organic silicon-based polymer represented by fluorine-containing silicon oxide (FSG) or polyallyl ether (PAE), an inorganic material represented by hydrosilsesquioxane (HSQ) or methylsilsesquioxane (MSQ), and particularly from a low-dielectric constant (Low-k) material having a relative dielectric constant of approximately 2.7 or less.

As seen in FIG. 40A, the first to sixth interlayer insulating layers 951, 953, 955, 971, 973 and 975 are liable to include water (H2O) 970 by moisture absorption of the insulating layers.

The first, second, third and fourth intermediate layers 952, 954, 972 and 974 are configured from a material used popularly for a diffusion preventing layer for a metal material which configures wiring lines and so forth in a semiconductor device. Further, the intermediate layers are high density insulating layers which are less likely to allow water 970 included in the interlayer insulating layers to penetrate therethrough. Further, such high density insulating layers serving as diffusion preventing layers as just described are configured from P—SiN of a relative dielectric constant of 4 to 7 formed, for example, by a spin coating method or a CVD method or SiCN or the like of a relative dielectric constant equal to or lower than 4 in which C is contained.

[Joining Portion]

As described above, a semiconductor device is configured wherein semiconductor substrates are joined together in the state in which the first, second and third joining electrodes 941, 942 and 943 and the fourth, fifth and sixth joining electrodes 961, 962 and 963 are joined together.

Further, as seen in FIG. 40A, the joining electrode of the first joining portion 940 and the joining electrode of the second joining portion 960 are configured such that the area of one of them is greater in order to assure joining reliability. By this configuration, also when the joining position is displaced, the joining area between the electrodes does not vary.

In the configuration shown in FIG. 40A, the second joining electrode 942, fourth joining electrode 961 and sixth joining electrode 963 are formed with a greater area than the respective opposing joining electrodes. Therefore, on the second joining electrode 942, a contacting portion 949 which contacts directly with the fourth interlayer insulating layer 971 is formed. Further, on the surface of the fourth joining electrode 961 and the sixth joining electrode 963, contacting portions 969 and 979 which contact directly with the first interlayer insulating layer 951 are formed, respectively.

[Protective Layer]

The first joining portion 940 includes a first protective layer 944 around the first joining electrode 941. The first joining portion 940 further includes a second protective layer 945 which surrounds the periphery of the second joining electrode 942 and the third joining electrode 943.

The first protective layer 944 and the second protective layer 945 are formed from a single layer which surrounds the periphery of the first joining electrode 941 as seen in FIG. 40B. Further, as shown in FIG. 40A, the first protective layer 944 is formed in a recessed portion of a depth with which it extends from the joining face 950 of the first joining portion 940 through the first interlayer insulating layer 951 to the first intermediate layer 952. The second protective layer 945 is formed in a recessed portion of a depth with which it extends from the joining face 950 of the first joining portion 940 through the first interlayer insulating layer 951, first intermediate layer 952 and second interlayer insulating layer 953 to the second intermediate layer 954.

Further, as shown in FIG. 40A, the second joining portion 960 has a third protective layer 964 provided thereon at a position corresponding to the first protective layer 944 described hereinabove. Further, the second joining portion 960 has a fourth protective layer 965 provided thereon at a position corresponding to the second protective layer 945.

The third protective layer 964 is formed in a recessed portion of a depth with which it surrounds the periphery of the fourth joining electrode 961 and extends from the joining face 950 of the second joining portion 960 through the fourth interlayer insulating layer 971 to the third intermediate layer 972.

The fourth protective layer 965 is formed in a recessed portion of a depth with which it surrounds the periphery of the fifth joining electrode 962 and the sixth joining electrode 963 and extends from the joining face 950 of the second joining portion 960 through the fourth interlayer insulating layer 971 to the third intermediate layer 972.

The first protective layer 944 and the third protective layer 964 are provided at positions at which they contact with each other along the joining face 950. By this configuration, the joining portions of the first joining electrode 941 and the fourth joining electrode 961 are surrounded by the first protective layer 944, third protective layer 964, first intermediate layer 952 and third intermediate layer 972.

Further, the second protective layer 945 and the fourth protective layer 965 are provided at positions at which they contact with each other along the joining face 950. Therefore, the joining portions of the second joining electrode 942 and the fifth joining electrode 962 and the joining portions of the third joining electrode 943 and the sixth joining electrode 963 are surrounded by the second protective layer 945, fourth protective layer 965, second intermediate layer 954 and third intermediate layer 972.

The first, second, third and fourth protective layers, 944, 945, 964 and 965 are formed from a material similar to that of the barrier metal layers described hereinabove, and for example, from Ta, Ti, Ru, TaN or TiN.

[Protective Layer: Action]

As described hereinabove, SiO2, a low-k material or the like applied to the first interlayer insulating layer 951, fourth interlayer insulating layer 971 or the like has a nature that it is liable to absorb moisture. Particularly if interlayer insulating layers are joined together using a plasma joining method, then water is generated on the joining faces by surface treatment and heat treatment of the insulating layers. Therefore, water (H2O) 970 is liable to be included in the first interlayer insulating layer 951, fourth interlayer insulating layer 971 or the like by moisture absorption of the insulating layer material.

In the configuration of the semiconductor device of the present embodiment, the first, second, third and fourth protective layers 944, 945, 964 and 965 are provided around the joining electrodes. If the protective layers are configured from a material similar to that of the barrier metal layers, then penetration of water 970 included in the insulating layers can be prevented. Further, the first intermediate layer 952 and the third intermediate layer 972 are configured from a high density insulating layer of P—SiN or the like which is less liable to allow water 970 to penetrate therethrough.

Therefore, the water 970 included in the first interlayer insulating layer 951 or the fourth interlayer insulating layer 971 can be intercepted by the first protective layer 944, third protective layer 964, first intermediate layer 952 and third intermediate layer 972.

Further, the water 970 included in the first interlayer insulating layer 951 or the fourth interlayer insulating layer 971 can be intercepted by the second protective layer 945, fourth protective layer 965, second intermediate layer 954 and third intermediate layer 972.

By the configuration described above, contact of water 970 with the contacting portion 969 between the fourth joining electrode 961 and the first interlayer insulating layer 951 can be suppressed by the joining portion of the first joining electrode 941 and the fourth joining electrode 961. Similarly, contact of water 970 with the contacting portion 949 between the second joining electrode 942 and the fourth interlayer insulating layer 971 can be suppressed by the joining portion between the second joining electrode 942 and the fifth joining electrode 962. Further, contact of water 970 with the contacting portion 979 between the sixth joining electrode 963 and the first interlayer insulating layer 951 can be suppressed by the joining portion between the third joining electrode 943 and the sixth joining electrode 963.

It is to be noted that, in the configuration described above, the contacting portion 969 of the fourth joining electrode 961 contacts with water 970 included in the first interlayer insulating layer 951 in a region surrounded by the first protective layer 944, third protective layer 964, first intermediate layer 952, and third intermediate layer 972. Therefore, the distance between the first joining electrode 941 and the first protective layer 944 and the distance between the fourth joining electrode 961 and the third protective layer 964 are preferably set as short as possible. For example, the distances are set to the smallest distance which is permitted in design rules for wiring so that the region in which an insulating layer can exist is minimized within a region surrounded by the first protective layer 944, third protective layer 964 and so forth. The smallest distance between a joining electrode and a protective layer can be set to approximately 50 nm in the minimum, and can be set to 2 to 4 μm in design rules for a popular semiconductor device.

Also the contacting portion 949 of the second joining electrode 942 or the contacting portion 979 of the sixth joining electrode 963 contacts with water 970 included in the first interlayer insulating layer 951 and the fourth interlayer insulating layer 971 in the region of the third protective layer 964, fourth protective layer 965 and so forth. Therefore, it is preferable to position the second protective layer 945 and the fourth protective layer 965 as near as possible to the second joining electrode 942 and the sixth joining electrode 963, respectively, in accordance with design rules for wiring.

Further, it is desirable for a protective layer which surrounds a joining electrode to be formed in such a manner as to screen at least an insulating layer made of a material which is liable to absorb moisture. Therefore, the protective layer is preferably formed to a depth from the surface of an interlayer insulating layer in which the joining electrode is provided, that is, from the joining face, to an insulating layer on the interlayer insulating layer, that is, to an intermediate layer.

Further, a protective layer may be formed to a position deeper than an interlayer insulating layer in which a joining electrode is formed. For example, a protective layer may be formed so as to extend from the joining face 950 through the first interlayer insulating layer 951, first intermediate layer 952 and second interlayer insulating layer 953 to a position at which it contacts with the second intermediate layer 954 like the second protective layer 945. According to the configuration of the second protective layer 945, since water in the second interlayer insulating layer 953 can be intercepted, water 970 which may penetrate the first intermediate layer 952 from the second interlayer insulating layer 953 can be prevented.

Further, since the width of one of the protective layers which contact with each other is set greater than that of the other protective layer along the joining face 950, even if displacement of the joining position of the semiconductor substrates occurs, connection reliability between the protective layers can be assured. In the configuration of the semiconductor device of the present embodiment shown in FIG. 40A, the width of the third protective layer 964 and the fourth protective layer 965 on the joining face is greater than that of the first protective layer 944 and the second protective layer 945.

In particular, the third protective layer 964 and the first protective layer 944 are configured such that the joining electrode side, that is, the inner side, of the third protective layer 964 is positioned nearer to the joining electrode than the first protective layer 944 and the opposite side to the joining electrode of the third protective layer 964, that is, the outer side of the third protective layer 964, is positioned farther from the joining electrode than the first protective layer 944. In this manner, by setting the width of the third protective layer 964 greater, even when displacement occurs with the joining position, the first protective layer 944 contacts with the third protective layer 964 within the width of the third protective layer 964.

Further, the fourth protective layer 965 and the second protective layer 945 are configured such that the joining electrode side, that is, the inner side, of the fourth protective layer 965 is positioned nearer to the joining electrode than the second protective layer 945 and the opposite side to the joining electrode of the fourth protective layer 965, that is, the outer side of the fourth protective layer 965, is positioned farther from the joining electrode than the second protective layer 945. In this manner, by setting the width of the fourth protective layer 965 greater, even when displacement occurs with the joining position, the second protective layer 945 contacts with the fourth protective layer 965 within the width of the fourth protective layer 965.

By the configuration described above, connection reliability of the protective layers against positional displacement can be assured.

[Protective Layer: Effect]

With the configuration of the semiconductor device of the present embodiment described above, since a protective layer surrounding a joining electrode is formed, contact between water, which makes a factor of corrosion of the joining portion, and the joining electrode can be suppressed to the minimum. Therefore, corrosion of the joining electrode can be suppressed, and a good electric characteristic and reliability can be provided to the semiconductor device.

Accordingly, the semiconductor device improved in electric characteristic and reliability can be provided. Further, since increase of the resistance value by corrosion can be suppressed, enhancement of the processing speed and reduction of power consumption of the semiconductor device can be anticipated.

Further, since the joining electrodes are surrounded by the protective layers, also external interference with an electric signal flowing through the electrode joining portion can be reduced. Accordingly, reduction in noise of the semiconductor device can be anticipated.

It is to be noted that the shape of the joining electrodes and the protective layers is not limited to that described hereinabove in connection with the present embodiment. The shape of the protective layers is not limited to the circular shape shown in FIG. 40B but may be any other shape only if they have a continuous shape surrounding a joining electrode on the joining face thereof with the joining electrodes. Also the shape of the joining electrodes is not limited to a circular shape as shown in FIG. 40B but may be any other shape.

<<3. Fabrication Method of the Semiconductor Device>>

Now, an example of a fabrication method of the semiconductor device of the present embodiment is described. It is to be noted that, in the following description of the fabrication method, only a fabrication method of the semiconductor device relating to the joining portion between the first joining electrode 941 and the fourth joining electrode 961 described hereinabove with reference to FIGS. 40A and 40B is described while description of a fabrication method of the configuration of the other part of the semiconductor device is omitted. The joining portion between the second joining electrode 942 and the fifth joining electrode 962, the joining portion between the third joining electrode 943 and the sixth joining electrode 963, and so forth can be fabricated similarly as in the fabrication method of the semiconductor device relating to the joining portion between the first joining electrode 941 and the fourth joining electrode 961. Further, description of a production method of the semiconductor substrates, wiring line layers, other various transistors and various elements is omitted because they can be produced by known methods.

Further, like elements to those of the semiconductor device of the present embodiment described hereinabove with reference to FIGS. 40A and 40B are denoted by like reference symbols, and overlapping detailed description of them is omitted herein to avoid redundancy.

Figure 41A:
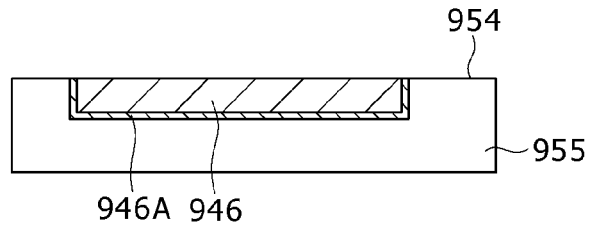
FIGS. 41A to 41K are schematic views illustrating different steps of fabrication of the semiconductor device of FIG. 40A.

First, a third interlayer insulating layer 955 connected to a ground device and including a barrier metal layer 946A and a first wiring line 946 is formed as shown in FIG. 41A. The third interlayer insulating layer 955 including the first wiring line 946 can be formed using a damascene process (refer to, for example, Japanese Patent Laid-Open No. 2004-63859) which is applied to a popular fabrication method for a semiconductor device or a like technique. Then, a second intermediate layer 954 of 10 to 100 nm thick is formed on the first wiring line 946 and the third interlayer insulating layer 955.

Figure 41B:
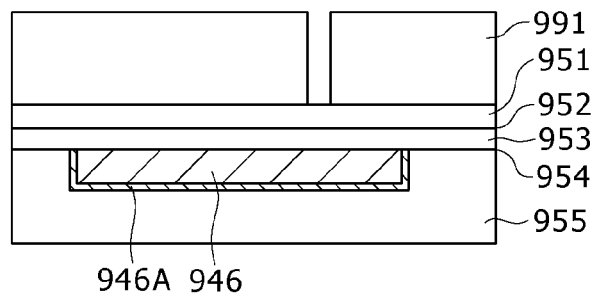

Then, a second interlayer insulating layer 953 in the form of a SiO2 layer, a SiOC layer or the like of 20 to 200 nm thick is formed on the second intermediate layer 954 as seen in FIG. 41B. Then, a first intermediate layer 952 in the form of a SiN layer, a SiCN layer or the like of 10 to 100 nm thick is formed on the second interlayer insulating layer 953. A first interlayer insulating layer 951 in the form of a SiO2 layer or a SiOC layer of 20 to 200 nm thick is formed on the first intermediate layer 952.

The first interlayer insulating layer 951, first intermediate layer 952, second interlayer insulating layer 953, second intermediate layer 954 and third interlayer insulating layer 955 described above can be formed using, for example, a CVD method or a spin coating method.

Further, a resist layer 991 is formed on the first interlayer insulating layer 951 as shown in FIG. 41B. The resist layer 991 is formed in a pattern in which it is open at a formation position thereof for a first via 956 and so forth for connection of a lower layer wiring line structure such as the first wiring line 946.

Figure 41C:
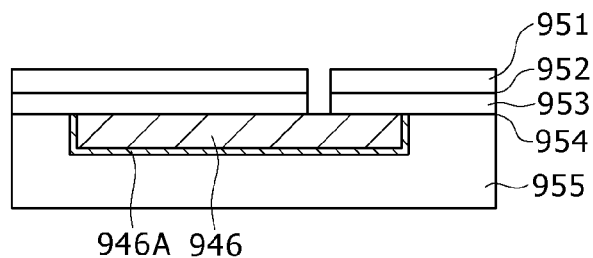

Then, the first interlayer insulating layer 951, first intermediate layer 952 and second interlayer insulating layer 953 are etched from above the resist layer 991 as seen in FIG. 41C by a dry etching method using a popular etching apparatus of the magnetron type.

After the first interlayer insulating layer 951, first intermediate layer 952 and second interlayer insulating layer 953 are etched, for example, an asking process based on oxygen (O2) plasma and a process by solution of organic amine-based drug are carried out. By the processes, the resist layer 991 and residual deposits generated in the etching process are removed fully.

Figure 41D:
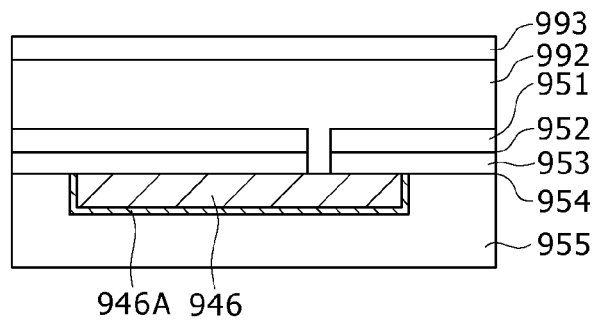

Then, an organic resin of 50 nm to 1 μm thick is applied by a spin coating method as shown in FIG. 41D and is calcined at 30 to 200° C. by a heater provided in an application apparatus to form an organic material layer 992. Then, a SiO2 layer of 20 to 200 nm thick is formed on the organic material layer 992 by a CVD method or a spin coating method to form an oxide layer 993.

Figure 41E:
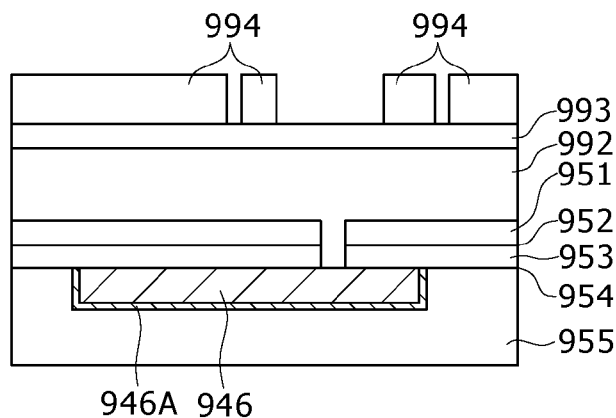
Figure 41F:
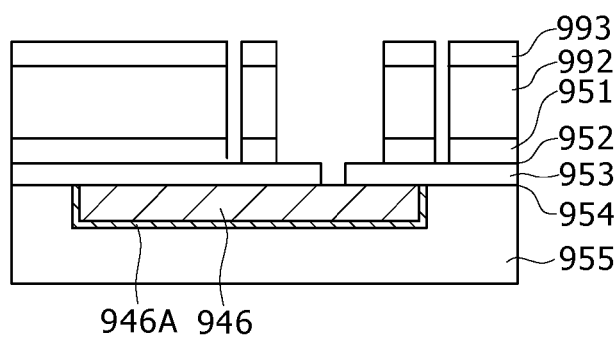

Thereafter, a resist layer 994 is formed on the oxide layer 993 as shown in FIG. 41E. The resist layer 994 is formed in a pattern in which it is open at a position at which the first joining electrode 941 of the joining portion and the first protective layer 944 are to be formed.

Then, the oxide layer 993 is etched from above the resist layer 994 by a dry etching method using a popular etching apparatus of the magnetron type. Then, the etched oxide layer 993 is used to etch the organic material layer 992 and the first interlayer insulating layer 951 by a dry etching method using a popular etching apparatus of the magnetron type.

Figure 41G:
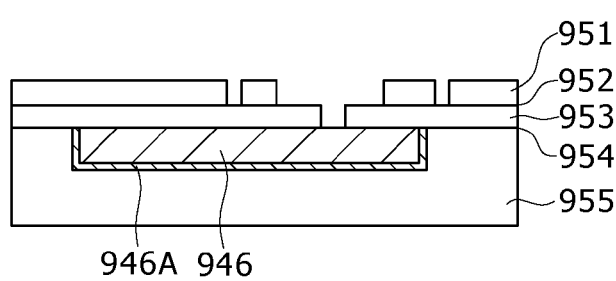

Thereafter, an asking process based on oxygen (O2) plasma and a process by solution of organic amine-based drug are carried out to fully remove the oxide layer 993, organic material layer 992 and residual deposits generated in the etching process. Further, by this process, the second intermediate layer 954 on the first wiring line 946 is etched simultaneously to expose the first wiring line 946 to obtain such a shape as shown in FIG. 41G.

Figure 41H:
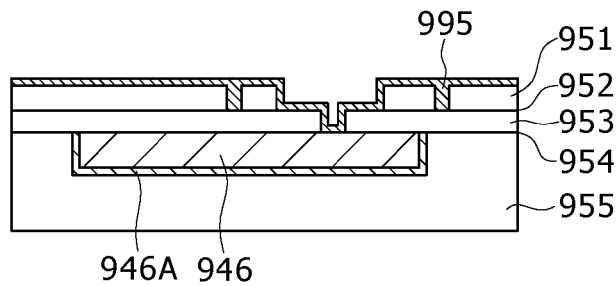

Then, a barrier material layer 995 for forming a barrier metal layer 956A and the first protective layer 944 is formed as shown in FIG. 41H. The barrier material layer 995 is formed with a thickness of 5 to 50 nm from Ti, Ta, Ru or any of nitrides of them in an Ar/N2 atmosphere by an RF sputtering process.

Figure 41I:
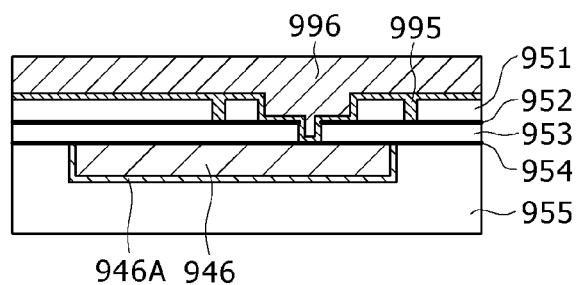

Then, an electrode material layer 996 made of Cu or the like is formed on the barrier material layer 995 as shown in FIG. 41I using an electrolytic plating method or a sputtering method. The electrode material layer 996 is formed so as to fill up the openings formed in the first interlayer insulating layer 951, first intermediate layer 952, second interlayer insulating layer 953 and second intermediate layer 954. After the formation of the electrode material layer 996, a hot plate or a sinter annealing apparatus is used to carry out heat treatment at 100 to 400° C. for approximately one to 60 minutes.

Figure 41J:
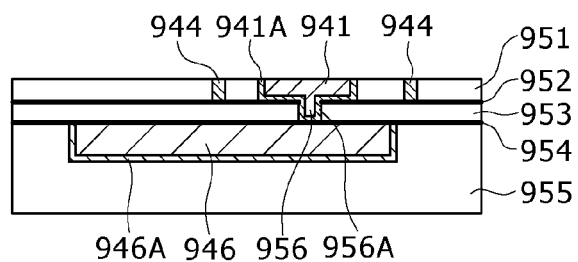

Then, part of the deposited barrier material layer 995 and electrode material layer 996 which is unnecessary for wiring patterns is removed by a chemical mechanical polishing (CMP) method as shown in FIG. 41J. By this step, a first joining electrode 941 connecting to the first wiring line 946 through the first via 956 is formed. Simultaneously, a barrier metal layer 941A and a barrier metal layer 956A are formed.

Further, a first protective layer 944 is formed from the barrier material layer 995 remaining in the opening of the first interlayer insulating layer 951.

A first joining portion 940 is formed by the steps described above.

Further, steps similar to those of the method described hereinabove with reference to FIGS. 41A to 41J are repeated to prepare a semiconductor device having a second joining portion 960.

Then, for example, a Wet process using formic acid or a Dry process using plasma of Ar, NH3, H2 or the like is carried out for the surface of the two semiconductor substrates formed by the process described above, that is, for the surface of the first joining portion 940 and the second joining portion 960. By the process, an oxide film on the surface of the first joining electrode 941 and the fourth joining electrode 961 is removed to expose clean metal faces.

Figure 41K:
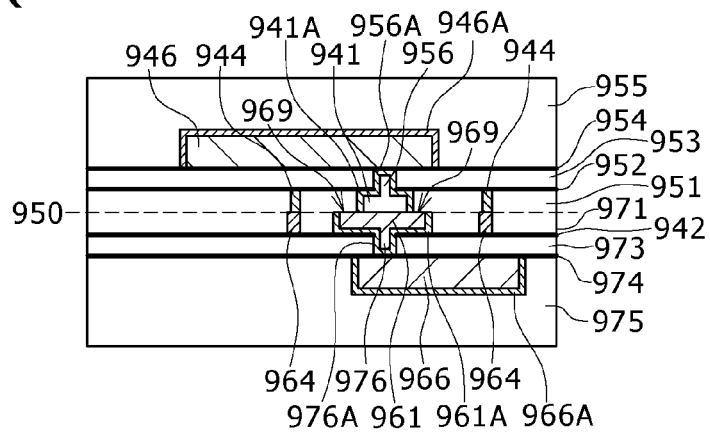

Then, after the surfaces of the two semiconductor substrates are opposed to each other, they are brought into contact with each other to join the first joining portion 940 and the second joining portion 960 to each other as seen in FIG. 41K.

Thereupon, heat treatment is carried out at 100 to 400° C. for approximately five minutes to two hours, for example, in an N2 atmosphere of the atmospheric pressure or in vacuum by an annealing apparatus such as a hot plate or a RTA.

Further, upon the joining of the first joining portion 940 and the second joining portion 960 described above, a plasma joining method may be used to join the first interlayer insulating layer 951 and the fourth interlayer insulating layer 971 to each other. For example, oxygen plasma is irradiated upon the surface of the first interlayer insulating layer 951 and the fourth interlayer insulating layer 971 to modify the surface of them. After the modification, the surfaces of the first interlayer insulating layer 951 and the fourth interlayer insulating layer 971 are washed for 30 seconds with pure water to form silanol groups (Si—OH groups) on the surface. Then, the faces on which silanol groups are formed are opposed to each other and partly pressed against each other so as to be joined together by Van der Waals force. Thereafter, in order to further increase the close contacting force at the joining interface, heat treatment of, for example, 400° C./60 min is applied to cause a dehydration condensation reaction of the silanol groups.

By the steps described above, a semiconductor device of the present embodiment shown in FIG. 41K can be fabricated.

By the fabrication method described above, the barrier metal layer 956A and the first protective layer 944 can be formed at the same time. Further, the recessed portion of the first interlayer insulating layer 951 for forming the first protective layer 944 can be formed simultaneously with the recessed portion for forming the first joining electrode 941. Therefore, the semiconductor device of the present embodiment can be fabricated by a popular fabrication method for a semiconductor device without adding a step for forming a protective layer.

An example of a size of the components of the semiconductor device shown in FIG. 41K is given below.

The opening diameter of the first via 956 and the fourth via 976 connecting to the first wiring line 946 and the fourth wiring line 966, respectively, is 50 to 200 nm. The opening diameter of the first joining electrode 941 and the fourth joining electrode 961 is 200 nm to 20 μm. The opening width of the first protective layer 944 and the third protective layer 964 formed around the first joining electrode 941 and the fourth joining electrode 961 and surrounding the joining portions, respectively, is 10 nm to 20 μm.

<<4. Modification 1 to the Semiconductor Device>>

Now, a modification 1 to the semiconductor device of the present embodiment is described. FIGS. 42A and 42B show a configuration of the semiconductor device of the modification 1. It is to be noted that, in the semiconductor device shown in FIGS. 42A and 42B, like elements to those of the semiconductor device of the embodiment described hereinabove are denoted by like reference characters, and overlapping detailed description of them is omitted herein to avoid redundancy. Further, the semiconductor device of the modification 1 shown in FIGS. 42A and 42B is similar in configuration to the semiconductor device of the embodiment described above except the configuration of the other part than protective layers. Therefore, description of the configuration of the components other than the protective layers is omitted herein to avoid redundancy.

[Protective Layer]

Referring first to FIG. 42A, the first joining portion 940 includes a first protective layer 981 around the first joining electrode 941. The first joining portion 940 further includes a second protective layer 982 surrounding the second joining electrode 942 and the third joining electrode 943.

Referring to FIG. 42B, the first protective layer 981 is formed from a single continuous layer surrounding the first joining electrode 941. The second protective layer 982 is formed from a single continuous layer surrounding the second joining electrode 942 and third joining electrode 943.

Referring back to FIG. 42A, the first protective layer 981 includes a barrier metal layer 981B which covers the inner face of a recessed portion formed in the first interlayer insulating layer 951, and a conductor layer 981A formed so as to fill up the barrier metal layer 981B.

The first protective layer 981 is formed with such a depth that it extends from the joining face 950 of the first joining portion 940 through the first interlayer insulating layer 951 to the first intermediate layer 952.

Meanwhile, the second protective layer 982 includes a barrier metal layer 982B which covers the inner face of a recessed portion formed in the first interlayer insulating layer 951, first intermediate layer 952 and second interlayer insulating layer 953, and a conductor layer 982A formed so as to fill up the barrier metal layer 982B. The second protective layer 982 is formed with such a depth that it extends from the joining face 950 of the first joining portion 940 through the first interlayer insulating layer 951, first intermediate layer 952 and second interlayer insulating layer 953 to the second intermediate layer 954.

Further, as seen in FIG. 42A, a third protective layer 964 is provided at a position on the second joining portion 960 corresponding to the first protective layer 981 described hereinabove. Further, a fourth protective layer 965 is provided at a position of the second joining portion 960 corresponding to the second protective layer 982. The third and fourth protective layers 964 and 965 have a configuration similar to that in the embodiment described hereinabove with reference to FIGS. 40A and 40B.

On the joining face 950, the first protective layer 981 and the third protective layer 964 are provided at positions at which they contact with each other. Further, on the joining face 950, the second protective layer 982 and the fourth protective layer 965 are provided at positions at which they contact with each other.

By the configuration just described, a joining portion between the first joining electrode 941 and the fourth joining electrode 961 is formed in a region surrounded by the first protective layer 981, third protective layer 964, first intermediate layer 952 and third intermediate layer 972. Meanwhile, a joining portion between the second joining electrode 942 and the fifth joining electrode 962 and a joining portion between the third joining electrode 943 and the sixth joining electrode 963 are formed in a region surrounded by the second protective layer 982, fourth protective layer 965, second intermediate layer 954 and third intermediate layer 972.

The barrier metal layers 981B and 982B of the first and second protective layers 981 and 982 are formed from a material similar to that of the barrier metal layers described hereinabove, such as Ta, Ti, Ru, TaN or TiN. Further, the conductor layers 981A and 982A of the first and second protective layers 981 and 982 are formed from a material similar to that of the joining electrodes described hereinabove such as, for example, Cu.

[Protective Layer: Effect]

With the configuration of the semiconductor device of the modification 1 shown in FIG. 42A, the width of the joining face between the first protective layer 981 and the second protective layer 982 is set greater than the width of the third protective layer 964 and the fourth protective layer 965 to assure connection reliability against positional displacement.

The configuration of the first protective layer 981 and the second protective layer 982 is suitable, for example, where the width of one of the protective layers to be joined to each other is made greater than that of the other protective layer in order to assure connection reliability of the protective layers. For example, in the case where the opening diameter or width of the first protective layer 981 is approximately 30 nm to 20 μm, it is difficult to fill up the opening formed in the insulating layers only by filling with the barrier metal layers 981B and 982B. Therefore, by filling up the barrier metal layers 981B and 982B with the conductor layers 981A and 982A after the inner face of the opening is covered with the barrier metal layers 981B and 982B, the first protective layer 981 and the second protective layer 982 having a large width of the joining face therebetween can be configured.

<<5. Fabrication Method for the Modification 1 to the Semiconductor Device>>

Now, a fabrication method for the semiconductor device of the modification 1 described above is described. In the following description of the fabrication method, only a fabrication method of the semiconductor device relating to the joining portion between the first joining electrode 941 and the fourth joining electrode 961 described hereinabove with reference to FIGS. 42A and 42B is described while a fabrication method of the configuration of the other part of the semiconductor device is omitted.

First, steps similar to those at the steps described hereinabove with reference to FIGS. 41A to 41D are carried out to form a second intermediate layer 954, a second interlayer insulating layer 953, a first intermediate layer 952, a first interlayer insulating layer 951, an organic material layer 992 and an oxide layer 993 on a third interlayer insulating layer 955 on which a first wiring line 946 is formed. The second interlayer insulating layer 953, first intermediate layer 952 and first interlayer insulating layer 951 have an opening for forming a first via 956 therein.

Figure 43A:
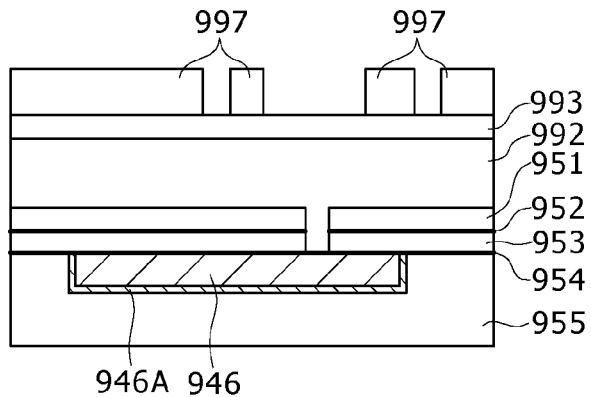
FIGS. 43A to 43G are schematic sectional views illustrating different steps of fabrication of the semiconductor device of FIG. 42A.

Then, a resist layer 997 is formed on the oxide layer 993 as shown in FIG. 43A. The resist layer 997 is formed in a pattern which is open at positions at which a first joining electrode 941 and a first protective layer 981 of a joining portion are to be formed.

Figure 43B:
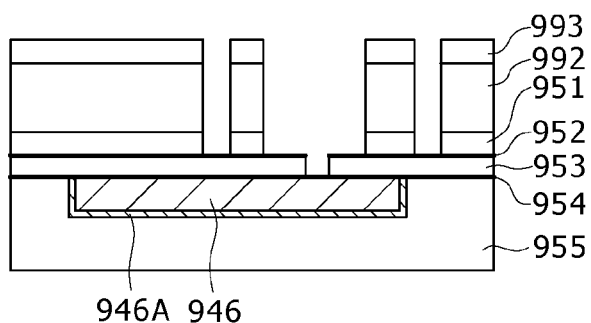

Then, the oxide layer 993 is etched from above the resist layer 997 as seen in FIG. 43B by a dry etching method in which a popular etching apparatus of the magnetron type is used. Then, the etched oxide layer 993 is used as a mask to etch the organic material layer 992 and the first interlayer insulating layer 951 by a dry etching method in which a popular etching apparatus of the magnetron type is used.

Figure 43C:
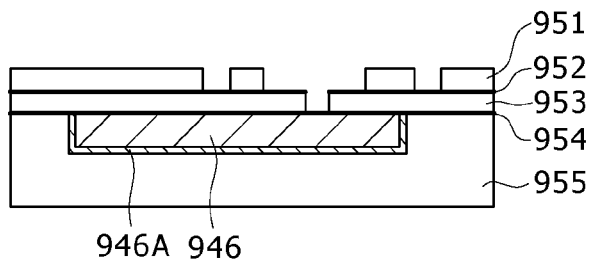

Thereafter, for example, an asking process based on oxygen (O2) plasma and a process by solution of organic amine-based drug are carried out to fully remove the oxide layer 993, organic material layer 992 and residual deposits generated in the etching process. Further, by this process, the second intermediate layer 954 on the first wiring line 946 is etched simultaneously to expose the first wiring line 946 thereby to obtain such a shape as shown in FIG. 43C.

Figure 43D:
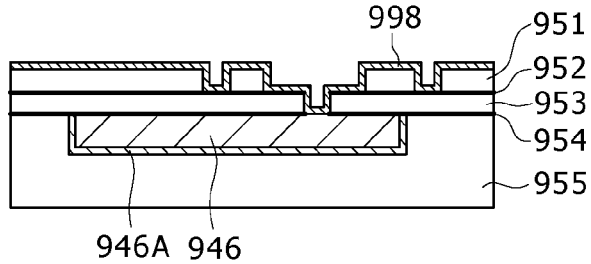

Then, a barrier material layer 998 for forming the barrier metal layer 956A and the barrier metal layer 981B of the first protective layer 981 is formed as shown in FIG. 43D. The barrier material layer 998 is formed with a thickness of 5 to 50 nm from Ti, Ta, Ru or any of nitrides of them in an Ar/N2 atmosphere by an RF sputtering process.

Figure 43E:
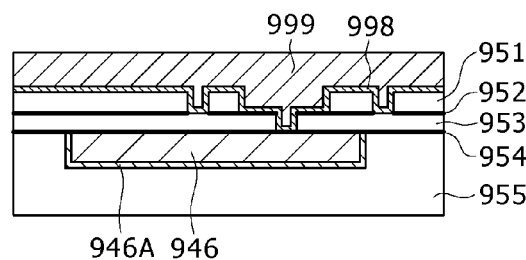

Then, an electrode material layer 999 made of Cu or the like is formed on the barrier material layer 998 as seen in FIG. 43E using an electrolytic plating method or a sputtering method. The electrode material layer 999 is formed by filling up an opening in which the first joining electrode 941 is to be formed and an opening in which the first protective layer 981 is to be formed. After the formation of the electrode material layer 999, a hot plate or a sinter annealing apparatus is used to carry out heat treatment at 100 to 400° C. for approximately one to 60 minutes.

Figure 43F:
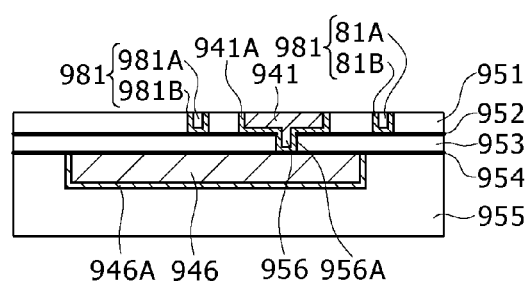

Then, part of the barrier material layer 998 and the electrode material layer 999 which is unnecessary for wiring line patterns is removed as seen in FIG. 43F by a chemical mechanical polishing (CMP) method. By this process, a first joining electrode 941 which connects to the first wiring line 946 through the first via 956 is formed. Simultaneously, a barrier metal layer 941A and a barrier metal layer 956A are formed.

Further, a first protective layer 981 is formed from the barrier material layer 998 and the electrode material layer 999 remaining in the opening of the first interlayer insulating layer 951.

By the steps described above, a first joining portion 940 is formed.

Steps similar to those of the method described hereinabove with reference to FIGS. 41A to 41J are repeated to prepare a semiconductor device having a second joining portion 960.

Then, for example, a wet etching process using forming acid or a dry etching process using plasma of Ar, NH3, H2 or the like is carried out for the surface of the two semiconductor members formed by the process described above, that is, for the surface of the first joining portion 940 and the second joining portion 960. By the process, an oxide film on the surface of the first joining electrode 941 and the fourth joining electrode 961 is removed to expose clean metal faces.

Figure 43G:
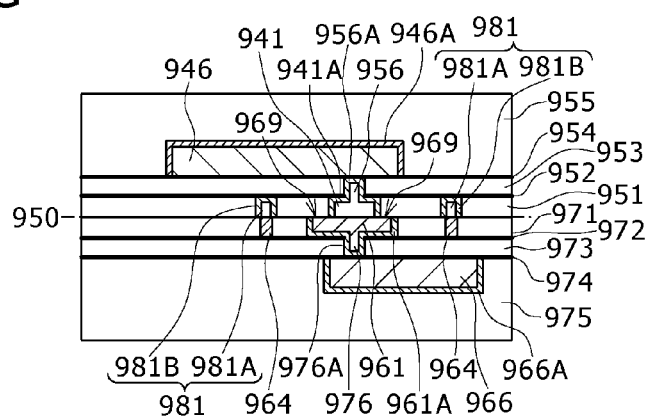

Then, after the surfaces of the two semiconductor members are opposed to each other, they are brought into contact with each other to join the first joining portion 940 and the second joining portion 960 to each other as seen in FIG. 43G.

Thereupon, heat treatment is carried out at 100 to 400° C. for approximately five minutes to two hours, for example, in an N2 atmosphere of the atmospheric pressure or in vacuum by an annealing apparatus such as a hot plate or a RTA.

By the steps described above, a semiconductor device of the present modification shown in FIG. 43G can be fabricated.

<<6. Modification 2 to the Semiconductor Device>>

Figure 44:
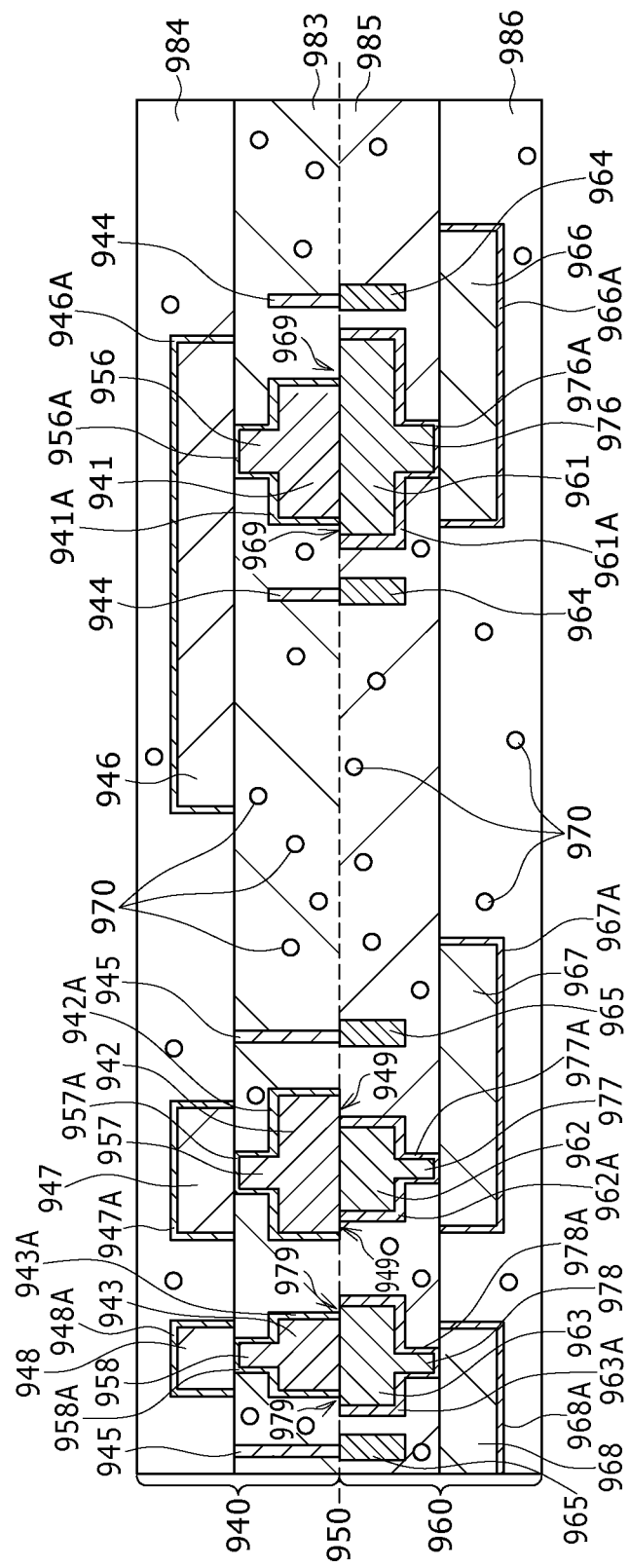
FIG. 44 is a schematic sectional view showing a general configuration of a semiconductor device including a joining electrode of a modification 2 to that of FIG. 39.

Now, a modification 2 to the semiconductor device of the present embodiment is described. FIG. 44 shows a configuration of the semiconductor device of the modification 2. It is to be noted that, in the semiconductor device shown in FIG. 44, like elements to those of the semiconductor device of the embodiment described hereinabove are denoted by like reference characters, and overlapping detailed description of them is omitted herein to avoid redundancy. Further, the semiconductor device of the modification 2 shown in FIG. 44 is similar in configuration to the semiconductor device of the embodiment described above except the configuration of the other part than interlayer insulating layers. Therefore, description of the configuration of the components other than the interlayer insulating layers is omitted herein to avoid redundancy.

[Insulating Layer]

The first joining portion 940 and the second joining portion 960 are formed by lamination of a plurality of wiring line layers and insulating layers.

The insulating layers of the first joining portion 940 include a first interlayer insulating layer 983 and a second interlayer insulating layer 984 in order from the joining face 950 side. Meanwhile, the insulating layers of the second joining portion 960 include a third interlayer insulating layer 985 and a fourth interlayer insulating layer 986 in order from the joining face 950.

In the first joining portion 940, a first wiring line 946, a second wiring line 947 and a third wiring line 948 are formed in the second interlayer insulating layer 984. In the first interlayer insulating layer 983, a first joining electrode 941, a second joining electrode 942 and a third joining electrode 943 of the first joining portion 940 are formed. The surface of the first, second and third joining electrodes 941, 942 and 943 is exposed to the joining face 950 and lies in flush with the first interlayer insulating layer 983.

Further, a first via 956, a second via 957 and a third via 958 are formed in the first interlayer insulating layer 983.

Furthermore, a first protective layer 944 which surrounds the first joining electrode 941 and a second protective layer 945 which surrounds the second joining electrode 942 and the third joining electrode 943 are provided in the first interlayer insulating layer 983.

In the second joining portion 960, a fourth wiring line 966, a fifth wiring line 967 and a sixth wiring line 968 are formed in the fourth interlayer insulating layer 986. A fourth joining electrode 961, a fifth joining electrode 962 and a sixth joining electrode 963 are formed in the third interlayer insulating layer 985. The surface of the fourth joining electrode 961, fifth joining electrode 962 and sixth joining electrode 963 is exposed to the joining face 950 and lies in flush with the third interlayer insulating layer 985.

Further, a fourth via 976, a fifth via 977 and a sixth via 978 are formed in the third interlayer insulating layer 985.

Furthermore, a third protective layer 964 which surrounds the fourth joining electrode 961 and a fourth protective layer 965 which surrounds the fifth joining electrode 962 and the sixth joining electrode 963 are provided in the third interlayer insulating layer 985.

The first interlayer insulating layer 983 and the third interlayer insulating layer 985 are configured from a material same as that of the intermediate layers of the semiconductor device of the embodiment described hereinabove. For example, the first interlayer insulating layer 983 and the third interlayer insulating layer 985 are configured from a material used for a diffusion preventing layer of a metal material which popularly configures wiring lines and so forth in a semiconductor device. Further, the first interlayer insulating layer 983 and the third interlayer insulating layer 985 are high density insulating layers which are less likely to allow water 970 included in the interlayer insulating layers to penetrate therethrough. Further, such high density insulating layers serving as diffusion preventing layers as just described are configured from P—SiN of a relative dielectric constant of 4 to 7 formed, for example, by a spin coating method or a CVD method or from SiCN or the like of a relative dielectric constant lower than 4 in which C is contained.

Further, the second interlayer insulating layer 984 and the fourth interlayer insulating layer 986 are configured from a material same as that of the interlayer insulating layers of the semiconductor device of the embodiment described above. For example, the second interlayer insulating layer 984 and the fourth interlayer insulating layer 986 are configured, for example, from SiO2, organic silicon-based polymer represented by fluorine-containing silicon oxide (FSG) or poly-allyl ether (PAE), an inorganic material represented by hydrogensilsesquioxane (HSQ) or methylsilsesquioxane (MSQ), and particularly from a low-dielectric constant (low-k) material having a relative dielectric constant of approximately 2.7 or lower.

In the configuration of the semiconductor device of the modification 2 described above, the first interlayer insulating layer 983 and the third interlayer insulating layer 985 which form the joining face 950 are less likely to allow water to penetrate therethrough. Therefore, at the joining portion between the first joining electrode 941 and the fourth joining electrode 961, contact of water 970 into the contacting portion 969 between the fourth joining electrode 961 and the first interlayer insulating layer 983 can be suppressed. Similarly, at the joining portion between the second joining electrode 942 and the fifth joining electrode 962, contact of water 970 with the contacting portion 949 between the second joining electrode 942 and the third interlayer insulating layer 985 can be suppressed.

Further, since the first, second, third and fourth protective layers 944, 945, 964 and 965 are provided, migration of water appearing on the joining face upon plasma joining or water included in the interlayer insulating layers to the electrode joining portions can be suppressed. Therefore, corrosion of the joining electrode can be suppressed, and a good electric characteristic and reliability can be provided to the semiconductor device.

[Fabrication Method]

The semiconductor device of the modification 2 described hereinabove with reference to FIG. 44 can be fabricated by changing the material of the interlayer insulating layers to be laminated and the etching conditions of the interlayer insulating layers in the fabrication method of the semiconductor device of the embodiment described hereinabove. For example, an interlayer insulating layer in the form of a single layer is formed at the steps of forming an interlayer insulating layer and an intermediate layer illustrated in FIGS. 41A and 41B. Then, at the etching step, the etching time is controlled to form a recessed portion to a desired depth of the interlayer insulating layer. By changing the fabrication process in this manner, the semiconductor device of the modification 2 can be fabricated by a method similar to that for the semiconductor device of the embodiment described hereinabove.

<<7. Embodiment of the Electronic Apparatus>>

The semiconductor device of the embodiment described above can be applied to an arbitrary electronic apparatus wherein two semiconductor members are bonded to each other to carry out wiring line joining such as, for example, a solid-state image pickup device, a semiconductor memory or a semiconductor logic device such as an IC.

Fifth Embodiment

<<Example of an Electronic Apparatus which Uses any of the Semiconductor Devices of the Embodiments>>

Any of the semiconductor devices such as a solid-state image pickup device according to the present technology described hereinabove in connection with the embodiments can be applied to various electronic apparatus such as, for example, a camera system such as a digital camera or a video camera, a portable telephone set having an image pickup function or any other apparatus having an image pickup function.

Figure 45:
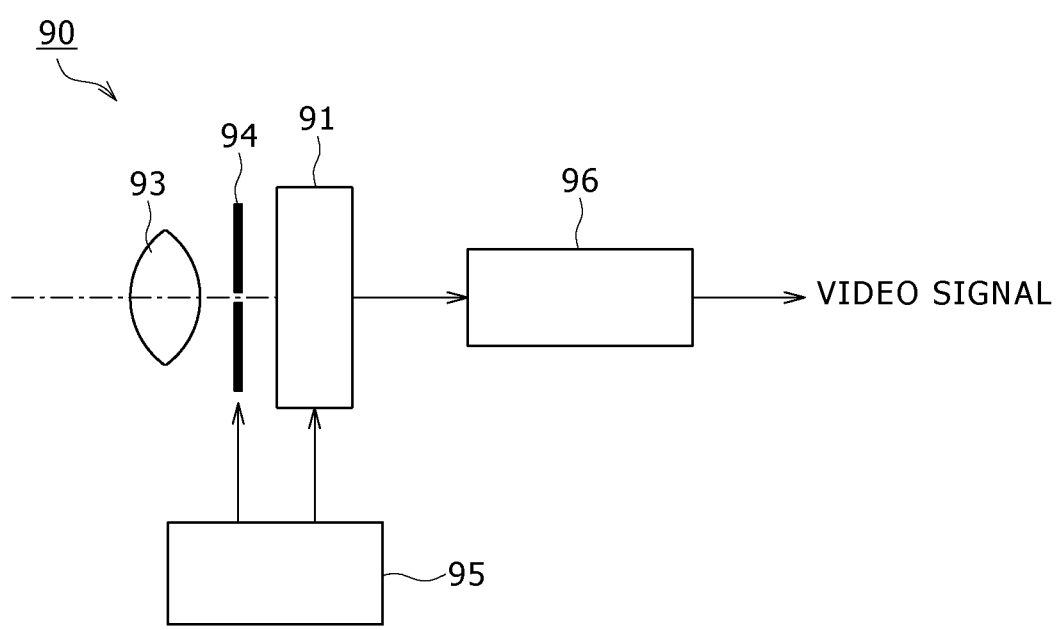
FIG. 45 is a block diagram showing an electronic apparatus which includes a semiconductor device obtained by applying the present technology.

FIG. 45 shows a configuration of a camera, in which a solid-state image pickup device is used, as an example of the electronic apparatus according to the present technology. The camera according to the present embodiment is applied as a video camera which can pick up a still image or a dynamic image. Referring to FIG. 45, the camera 90 includes a solid-state image pickup device 91, an optical system 93 for introducing incident light thereto to a reception light sensor of the solid-state image pickup device 91, a shutter apparatus 94, a driving circuit 95 for driving the solid-state image pickup device 91, and a signal processing circuit 96 for processing an output signal of the solid-state image pickup device 91.

The solid-state image pickup device 91 is configured by applying any of the semiconductor devices described hereinabove in connection with the embodiments and modifications of the disclosed technology. The optical system 93 including an optical lens introduces image light, that is, incident light, from an image pickup object so as to form an image on an image pickup plane of the solid-state image pickup device 91. Consequently, signal charge is accumulated for a fixed period of time into the solid-state image pickup device 91. Such an optical system 93 as described above may be an optical lens system configured from a plurality of optical lenses. The shutter apparatus 94 controls the light irradiation time period and the light interception time period to the solid-state image pickup device 91. The driving circuit 95 supplies a driving signal to the solid-state image pickup device 91 and the shutter apparatus 94 so that control of a signal outputting operation of the solid-state image pickup device 91 to the signal processing circuit 96 and a shutter operation of the shutter apparatus 94 is carried out in accordance with the supplied driving signals or timing signals. In particular, the driving circuit 95 supplies a driving signal or timing signal to carry out a signal transfer operation from the solid-state image pickup device 91 to the signal processing circuit 96. The signal processing circuit 96 carries out various signal processes for the signal supplied thereto from the solid-state image pickup device 91. A video signal obtained by the signal processes is stored into a storage medium such as a memory or outputted to a monitor.

It should be understood by those skilled in the art that various modifications, combinations, sub-combinations and alternations may occur depending on design requirements and other factors insofar as they are within the scope of the appended claims or the equivalent thereof.

What is claimed is:

1. A semiconductor device, comprising:
a first semiconductor portion having a first metal film formed on the surface thereof on a joining interface side;
a second semiconductor portion having a second metal film joined to said first metal film on the joining interface and having a surface area on the joining interface side smaller than a surface area of said first metal film on the joining interface side and provided in a state in which said second semiconductor portion is bonded to said first semiconductor portion on the joining interface; and
an interface barrier portion provided in a portion of a face region of said first metal film on the joining interface side which includes a face region in which said first metal film is not joined to said second metal film.

2. The semiconductor device according to claim 1, wherein said second semiconductor portion has an interface barrier film provided in the portion of the face region of said first metal film on the joining interface side which includes the face region in which said first metal film is not joined to said second metal film.

3. The semiconductor device according to claim 2, wherein said second semiconductor portion includes an insulating film provided so as to cover a side portion of said second metal film, and
said interface barrier film is formed on the surface of said insulating film on the joining interface side.

4. The semiconductor device according to claim 2, wherein said interface barrier film is formed from one of SiN, SiON, SiCN and an organic resin material.

5. The semiconductor device according to claim 2, wherein said first semiconductor portion includes
a first oxide film provided so as to cover a side portion of said first metal film, and
a seed layer provided between said first oxide film and said first metal film and containing a predetermined metal material;
said second semiconductor portion includes
a second oxide film provided so as to cover a side portion of said second metal film; and
said interface barrier film is configured from an oxide film of the predetermined metal material.

6. The semiconductor device according to claim 5, wherein the predetermined metal material is one of Mn, Mg, Ti and Al.

7. The semiconductor device according to claim 2, wherein said second semiconductor portion includes:
a barrier metal layer having
a barrier body portion provided so as to cover a side portion of said second metal film and a surface of said second metal film on the opposite side to the joining interface, and
an interface layer portion formed so as to extend from an end portion of said barrier body portion on the joining interface side along the joining interface; and
said interface barrier portion is configured from the interface layer portion of said barrier metal layer.

8. The semiconductor device according to claim 7, wherein said barrier metal layer is formed from one of Ti, Ta, Ru, TiN, TaN and RuN.

9. The semiconductor device according to claim 1, wherein a recessed portion is provided at a portion of the face region of said first conductor portion on the joining interface side in which said first metal film is not joined to said second metal film; and said interface barrier portion is configured from
the recessed portion of said first metal film, and
a face region portion of said second semiconductor portion, which opposes to the recessed portion, on the joining interface side, and
said interface barrier portion has a sealed air gap defined by the recessed portion and the face region portion therein.

10. The semiconductor device according to claim 9, wherein said second semiconductor portion has
an insulating film provided so as to cover a side portion of said second metal film; and
a face region portion of said second semiconductor portion, which opposes to the recessed portion, on the joining interface side is configured from said insulating film.

11. The semiconductor device according to claim 9, wherein said second semiconductor portion has
an interface barrier film provided at a portion of the face region of said first metal film on the joining interface side which includes a face region in which said first metal film is not joined to said second metal film; and
the face region portion of said second semiconductor portion, which opposes to the recessed portion, on the joining interface side is configured from said interface barrier film.

12. The semiconductor device according to claim 1, wherein each of said first metal film and said second metal film is a Cu film.

13. An electronic apparatus, comprising:
a semiconductor device including
a first semiconductor portion having a first metal film formed on the surface thereof on a joining interface side,
a second semiconductor portion having a second metal film joined to said first metal film on the joining interface and having a surface area on the joining interface side smaller than a surface area of said first metal film on the joining interface side and provided in a state in which said second semiconductor portion is bonded to said first conductor portion on the joining interface, and
an interface barrier portion provided in a portion of a face region of said first metal film on the joining interface side which includes a face region in which said first metal film is not joined to said second metal film; and
a signal processing circuit configured to process an output signal of said semiconductor device.

14. The electronic apparatus according to claim 13, wherein said second semiconductor portion has an interface barrier film provided in the portion of the face region of said first metal film on the joining interface side which includes the face region in which said first metal film is not joined to said second metal film.

15. The electronic apparatus according to claim 14, wherein said second semiconductor portion includes an insulating film provided so as to cover a side portion of said second metal film, and
said interface barrier film is formed on the surface of said insulating film on the joining interface side.

16. The electronic apparatus according to claim 14, wherein said first semiconductor portion includes
a first oxide film provided so as to cover a side portion of said first metal film, and
a seed layer provided between said first oxide film and said first metal film and containing a predetermined metal material;
said second semiconductor portion includes
a second oxide film provided so as to cover a side portion of said second metal film; and
said interface barrier film is configured from an oxide film of the predetermined metal material.

17. The electronic apparatus according to claim 14, wherein said second semiconductor portion includes:
a barrier metal layer having
a barrier body portion provided so as to cover a side portion of said second metal film and a surface of said second metal film on the opposite side to the joining interface, and
an interface layer portion formed so as to extend from an end portion of said barrier body portion on the joining interface side along the joining interface; and
said interface barrier portion is configured from the interface layer portion of said barrier metal layer.

18. The electronic apparatus according to claim 13, wherein a recessed portion is provided at a portion of the face region of said first conductor portion on the joining interface side in which said first metal film is not joined to said second metal film; and
said interface barrier portion is configured from
the recessed portion of said first metal film, and
a face region portion of said second semiconductor portion, which opposes to the recessed portion, on the joining interface side, and
said interface barrier portion has a sealed air gap defined by the recessed portion and the face region portion therein.

19. The electronic apparatus according to claim 18, wherein said second semiconductor portion has
an insulating film provided so as to cover a side portion of said second metal film; and
a face region portion of said second semiconductor portion, which opposes to the recessed portion, on the joining interface side is configured from said insulating film.

20. The semiconductor device according to claim 18, wherein said second semiconductor portion has
an interface barrier film provided at a portion of the face region of said first metal film on the joining interface side which includes a face region in which said first metal film is not joined to said second metal film; and
the face region portion of said second semiconductor portion, which opposes to the recessed portion, on the joining interface side is configured from said interface barrier film.

21. A fabrication method for a semiconductor device, comprising:
producing a first semiconductor portion having a first metal film formed on a surface thereof on a joining interface side;
producing a second semiconductor portion having a second metal film having a surface area on the joining interface side smaller than a surface area of the first metal film on the joining interface side; and
bonding the surface of the first semiconductor portion on the first metal film side and the surface of the second semiconductor portion on the second metal film side to each other to join the first metal film and the second metal film to each other and providing an interface barrier portion at a portion of the face region of the first metal film on the joining interface side which includes the face region in which the first metal film is not joined to the second metal film.

22. The fabrication method for a semiconductor device of claim 21, further comprising:
   forming a first metal barrier film and a first wiring line portion in the first semiconductor portion.

23. The fabrication method for a semiconductor device of claim 22, further comprising:
   forming a diffusion preventing film in the first semiconductor portion.

24. The fabrication method for a semiconductor device of claim 21, further comprising:
   annealing the first semiconductor portion to the second semiconductor portion to join the first metal film to the second metal film.

* * * * *